United States Patent
Xian et al.

(10) Patent No.: US 11,985,861 B2
(45) Date of Patent: May 14, 2024

(54) DISPLAY PANEL AND DISPLAY DEVICE

(71) Applicants: Beijing BOE Technology Development Co., Ltd., Beijing (CN); BOE Technology Group Co., Ltd., Beijing (CN)

(72) Inventors: Jianbo Xian, Beijing (CN); Chen Xu, Beijing (CN); Pan Li, Beijing (CN); Yong Qiao, Beijing (CN); Xinyin Wu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 448 days.

(21) Appl. No.: 17/426,985

(22) PCT Filed: Mar. 22, 2021

(86) PCT No.: PCT/CN2021/082008
§ 371 (c)(1),
(2) Date: Jul. 29, 2021

(87) PCT Pub. No.: WO2022/037055
PCT Pub. Date: Feb. 24, 2022

(65) Prior Publication Data
US 2022/0320202 A1    Oct. 6, 2022

(30) Foreign Application Priority Data

Aug. 17, 2020    (CN) .......................... 202010822808.3

(51) Int. Cl.
*G06F 3/041*    (2006.01)
*G06F 3/044*    (2006.01)
(Continued)

(52) U.S. Cl.
CPC ......... *H10K 59/122* (2023.02); *G06F 3/0446* (2019.05); *H10K 59/1213* (2023.02);
(Continued)

(58) Field of Classification Search
CPC ............. H10K 59/122; H10K 59/1213; H10K 59/1216; H10K 59/131; H10K 59/353;
(Continued)

(56) References Cited

U.S. PATENT DOCUMENTS 8,593,057 B2    11/2013    Park et al.
10,050,095 B2    8/2018    Kim
(Continued)

FOREIGN PATENT DOCUMENTS

CN    101840930 A    9/2010
CN    104571715 A    4/2015
(Continued)

*Primary Examiner* — Lunyi Lao
*Assistant Examiner* — Jarurat Suteerawongsa
(74) *Attorney, Agent, or Firm* — Workman Nydegger

(57) ABSTRACT

The disclosure provides a display panel and a display device. The display panel includes: a base substrate, a transistor array layer, a pixel defining layer, touch electrodes. The area of opening region of first color sub-pixel is smaller than that of opening region of third color sub-pixel, the area of opening region of second color sub-pixel is smaller than that of opening region of third color sub-pixel. An orthogonal projection of second capacitor in first color sub-pixel and an orthogonal projection of touch electrodes have a first auxiliary overlap area, an orthogonal projection of second capacitor in second color sub-pixel and orthogonal projection of the touch electrodes have a second auxiliary overlap area, an orthogonal projection of second capacitor in third color sub-pixel and orthogonal projection of touch elec-
(Continued)

trodes have a third auxiliary overlap area. The first and/or second auxiliary overlap area is larger than the third auxiliary overlap area.

16 Claims, 44 Drawing Sheets

(51) Int. Cl.
  *H10K 59/121* (2023.01)
  *H10K 59/122* (2023.01)
  *H10K 59/131* (2023.01)
  *H10K 59/35* (2023.01)
  *H10K 59/40* (2023.01)

(52) U.S. Cl.
  CPC ....... *H10K 59/1216* (2023.02); *H10K 59/131* (2023.02); *H10K 59/353* (2023.02); *H10K 59/40* (2023.02)

(58) Field of Classification Search
  CPC ........ H10K 59/40; H10K 50/13; H10K 59/12; H10K 59/121; H10K 59/35; G06F 3/0446; G06F 2203/04111; G06F 3/0445; G06F 3/0412; G06F 3/041
  See application file for complete search history.

(56) References Cited

U.S. PATENT DOCUMENTS

| | | | |
|---|---|---|---|
| 10,700,143 B2* | 6/2020 | Wang | ................... G06F 3/0412 |
| 2003/0128173 A1 | 7/2003 | Ko | |
| 2010/0238096 A1 | 9/2010 | Jeon et al. | |
| 2013/0222217 A1* | 8/2013 | Shin | ..................... H10K 59/131 345/80 |
| 2016/0217733 A1 | 7/2016 | Kim et al. | |
| 2016/0247452 A1 | 8/2016 | Lee et al. | |
| 2016/0357314 A1 | 12/2016 | Liu et al. | |
| 2018/0315801 A1 | 11/2018 | Matsueda | |
| 2018/0350886 A1 | 12/2018 | An et al. | |
| 2019/0011830 A1 | 1/2019 | Ji | |
| 2019/0294284 A1* | 9/2019 | Akimoto | ................ G06F 3/0443 |
| 2020/0006401 A1 | 1/2020 | Hwang et al. | |
| 2020/0098847 A1 | 3/2020 | Zhang et al. | |
| 2020/0279530 A1 | 9/2020 | Woo et al. | |
| 2020/0402442 A1 | 12/2020 | Liu et al. | |
| 2020/0411622 A1 | 12/2020 | Sun et al. | |
| 2021/0399079 A1 | 12/2021 | Yan et al. | |

FOREIGN PATENT DOCUMENTS

| | | |
|---|---|---|
| CN | 105448215 A | 3/2016 |
| CN | 105895026 A | 8/2016 |
| CN | 106298865 A | 1/2017 |
| CN | 107785407 A | 3/2018 |
| CN | 108807466 A | 11/2018 |
| CN | 108986739 A | 12/2018 |
| CN | 109326631 A | 2/2019 |
| CN | 109360837 A | 2/2019 |
| CN | 109545129 A | 3/2019 |
| CN | 109860237 A | 6/2019 |
| CN | 110137228 A | 8/2019 |
| CN | 110265412 A | 9/2019 |
| CN | 110660355 A | 1/2020 |
| CN | 110690365 A | 1/2020 |
| CN | 110828525 A | 2/2020 |
| CN | 111739926 A | 10/2020 |

* cited by examiner

600

DISPLAY PANEL AND DISPLAY DEVICE

CROSS-REFERENCE TO RELATED APPLICATIONS

This application is a National Stage of International Application No. PCT/CN2021/082008, filed on Mar. 22, 2021, which claims priority to Chinese Patent Application No. 202010822808.3 filed on Aug. 17, 2020 and entitled "Display Panel and Display Device", the entire contents of which are incorporated herein by reference.

FIELD

The present disclosure relates to the technical field of display and, in particular, to a display panel and a display device.

BACKGROUND

Electroluminescent diodes such as Organic Light Emitting Diodes (OLED) and Quantum Dot Light Emitting Diodes (QLED) have advantages of self-light-emission, low energy consumption and the like, and are one of the hot spots in the field of research for applications of electroluminescent display devices today.

SUMMARY

An embodiment of the present disclosure provides a display panel, including:
a base substrate;
a transistor array layer, located on the base substrate;
a pixel defining layer, located on a side of the transistor array layer facing away from the base substrate; and
touch electrodes, located on a side of the pixel defining layer facing away from the base substrate; wherein
the base substrate has a display region including a plurality of sub-pixels; the sub-pixels include pixel circuits and light emitting elements; the pixel circuits include gate line patterns, data line patterns, and power supply signal line patterns;
the transistor array layer includes a plurality of capacitance-conductive portions, and the sub-pixels include corresponding capacitance-conductive portions; wherein, in each of the sub-pixels, there is an overlapping region between the capacitance-conductive portion and the data line pattern corresponding to the each of the sub-pixels and/or the power supply signal line pattern corresponding to the each of the sub-pixels; the capacitance-conductive portion is at least coupled to the power supply signal line pattern corresponding to the each of the sub-pixels or the data line pattern corresponding to the each of the sub-pixels;
the pixel defining layer includes a plurality of opening regions, and the sub-pixels include the corresponding opening regions;
an orthogonal projection of at least part of the touch electrodes on the base substrate is a grid;
the plurality of sub-pixels further include a first color sub-pixel, a second color sub-pixel, and a third color sub-pixel; an area of an opening region of the first color sub-pixel is smaller than an area of an opening region of the third color sub-pixel, and an area of an opening region of the second color sub-pixel is smaller than the area of the opening region of the third color sub-pixel;
an orthogonal projection of a capacitance-conductive portion in the first color sub-pixel on the base substrate and an orthogonal projection of the touch electrodes on the base substrate have a first auxiliary overlap area;
an orthogonal projection of a capacitance-conductive portion in the second color sub-pixel on the base substrate and the orthogonal projection of the touch electrodes on the base substrate have a second auxiliary overlap area;
an orthogonal projection of a capacitance-conductive portion in the third color sub-pixel on the base substrate and the orthogonal projection of the touch electrodes on the base substrate have a third auxiliary overlap area; and
at least one of the first auxiliary overlap area and the second auxiliary overlap area is larger than the third auxiliary overlap area.

In some embodiments, the first auxiliary overlap area is larger than the second auxiliary overlap area; or,
the first auxiliary overlap area is substantially equal to the second auxiliary overlap area; or,
the third auxiliary overlap area is substantially equal to the second auxiliary overlap area.

In some embodiments, the transistor array layer includes:
a first conductive layer, located between the base substrate and the pixel defining layer; wherein the first conductive layer includes a plurality of data line patterns and a plurality of power supply signal line patterns;
a first insulating layer, located between the base substrate and the first conductive layer; and
a second conductive layer, located between the base substrate and the first insulating layer, the second conductive layer including: a plurality of auxiliary conductive portions, the capacitance-conductive portions of the sub-pixels including the auxiliary conductive portions; wherein in the same sub-pixel, an orthogonal projection of a first end of the auxiliary conductive portion on the base substrate has an overlapping region with an orthogonal projection of the power supply signal line pattern on the base substrate, and an orthogonal projection of a second end of the auxiliary conductive portion on the base substrate has an overlapping region with an orthogonal projection of the data line pattern on the base substrate; the auxiliary conductive portion is coupled to the power supply signal line pattern;
the first auxiliary overlap area includes an overlap area between an orthogonal projection of the auxiliary conductive portion in the first color sub-pixel on the base substrate and the orthogonal projection of the touch electrodes on the base substrate;
the second auxiliary overlap area includes an overlap area between an orthogonal projection of the auxiliary conductive portion in the second color sub-pixel on the base substrate and the orthogonal projection of the touch electrodes on the base substrate; and
the third auxiliary overlap area includes an overlap area between an orthogonal projection of the auxiliary conductive portion in the third color sub-pixel on the base substrate and the orthogonal projection of the touch electrodes on the base substrate.

In some embodiments, the auxiliary conductive portion in the first color sub-pixel includes a first auxiliary exposure portion, and an orthogonal projection of the first auxiliary exposure portion on the base substrate does not overlap the orthogonal projections of the data line patterns and the power supply signal line patterns, respectively, on the base substrate; the first auxiliary overlap area includes a first auxiliary sub-overlap area, and an overlapping region between the orthogonal projection of the first auxiliary exposure portion on the base substrate and the orthogonal projection of the touch electrodes on the base substrate has the first auxiliary sub-overlap area;

the auxiliary conductive portion in the second color sub-pixel includes a second auxiliary exposure portion, and an orthogonal projection of the second auxiliary exposure portion on the base substrate does not overlap the orthogonal projections of the data line patterns and the power supply signal line patterns, respectively, on the base substrate; the second auxiliary overlap area includes a second auxiliary sub-overlap area, and an overlapping region between the orthogonal projection of the second auxiliary exposure portion on the base substrate and the orthogonal projection of the touch electrodes on the base substrate has the second auxiliary sub-overlap area;

the auxiliary conductive portion in the third color sub-pixel includes a third auxiliary exposure portion, and an orthogonal projection of the third auxiliary exposure portion on the base substrate does not overlap the orthogonal projections of the data line patterns and the power supply signal line patterns, respectively, on the base substrate; the third auxiliary overlap area includes a third auxiliary sub-overlap area, and an overlapping region between the orthogonal projection of the third auxiliary exposure portion on the base substrate and the orthogonal projection of the touch electrodes on the base substrate has the third auxiliary sub-overlap area; and the first auxiliary sub-overlap area is larger than at least one of the second auxiliary sub-overlap area and the third auxiliary sub-overlap area.

In some embodiments, the second auxiliary sub-overlap area is larger than the third auxiliary sub-overlap area; or, the third auxiliary sub-overlap area is substantially equal to the second auxiliary sub-overlap area.

In some embodiments, in the first color sub-pixel, an orthogonal projection of the first auxiliary exposure portion on the base substrate is located between the orthogonal projections of the data line patterns and the power supply signal line patterns on the base substrate; and/or, in the second color sub-pixel, an orthogonal projection of the second auxiliary exposure portion on the base substrate is located between the orthogonal projections of the data line patterns and the power supply signal line patterns on the base substrate; and/or, in the third color sub-pixel, an orthogonal projection of the third auxiliary exposure portion on the base substrate is located between the orthogonal projections of the data line patterns and the power supply signal line patterns on the base substrate.

In some embodiments, the orthogonal projection of the auxiliary conductive portion on the base substrate has a total area;

a ratio of the first auxiliary sub-overlap area to the total area ranges from: 1/3 to 2/3; and/or, a ratio of the second auxiliary sub-overlap area to the total area ranges from: 0 to 1/4; and/or, a ratio of the third auxiliary sub-overlap area to the total area ranges from: 0 to 1/16.

In some embodiments, in the first color sub-pixel, the orthogonal projection of the touch electrodes on the base substrate covers the orthogonal projection of the first auxiliary exposure portion on the base substrate; and/or, in the second color sub-pixel, the orthogonal projection of the touch electrodes on the base substrate covers the orthogonal projection of the second auxiliary exposure portion on the base substrate; and/or, in the third color sub-pixel, the orthogonal projection of the touch electrodes on the base substrate covers the orthogonal projection of the third auxiliary exposure portion on the base substrate.

In some embodiments, the auxiliary conductive portion in the first color sub-pixel further includes a first auxiliary shielding portion, and an orthogonal projection of the first auxiliary shielding portion on the base substrate overlaps the orthogonal projection of at least one of the data line patterns and the power supply signal line patterns on the base substrate; wherein a width of the first auxiliary exposure portion in a column direction is smaller than a width of the first auxiliary shielding portion in the column direction; and/or, the auxiliary conductive portion in the second color sub-pixel further includes a second auxiliary shielding portion, and an orthogonal projection of the second auxiliary shielding portion on the base substrate overlaps the orthogonal projection of at least one of the data line patterns and the power supply signal line patterns on the base substrate; wherein a width of the second auxiliary exposure portion in the column direction is smaller than a width of the second auxiliary shielding portion in the column direction; and/or, the auxiliary conductive portion in the third color sub-pixel further includes a third auxiliary shielding portion, and an orthogonal projection of the third auxiliary shielding portion on the base substrate overlaps the orthogonal projection of at least one of the data line patterns and the power supply signal line patterns on the base substrate; wherein a width of the third auxiliary exposure portion in the column direction is smaller than a width of the third auxiliary shielding portion in the column direction.

In some embodiments, the pixel circuits further include first capacitors;

an orthogonal projection of the first capacitor in the first color sub-pixel on the base substrate and the orthogonal projection of the touch electrodes on the base substrate have a first storage overlap area;

an orthogonal projection of the first capacitor in the second color sub-pixel on the base substrate and the orthogonal projection of the touch electrodes on the base substrate have a second storage overlap area;

an orthogonal projection of the first capacitor in the third color sub-pixel on the base substrate and the orthogonal projection of the touch electrodes on the base substrate have a third storage overlap area; and at least one of the first storage overlap area and the second storage overlap area is larger than the third storage overlap area.

In some embodiments, the first storage overlap area is larger than the second storage overlap area.

In some embodiments, the second conductive layer further includes a plurality of storage conductive portions disposed spaced apart from the auxiliary conductive portions; the sub-pixels include the storage conductive portions; the storage conductive portions act as second plates of the first capacitors;

the first storage overlap area includes an overlap area between an orthogonal projection of the storage conductive portion in the first color sub-pixel on the base substrate and the orthogonal projection of the touch electrodes on the base substrate;

the second storage overlap area includes an overlap area between an orthogonal projection of the storage conductive portion in the second color sub-pixel on the base substrate and the orthogonal projection of the touch electrodes on the base substrate; and the third storage overlap area includes an overlap area between an orthogonal projection of the storage conductive portion in the third color sub-pixel on the base substrate and the orthogonal projection of the touch electrodes on the base substrate.

In some embodiments, the orthogonal projection of the touch electrodes on the base substrate is in a grid shape, and the orthogonal projection of the touch electrodes on the base substrate does not overlap an orthogonal projection of the opening regions on the base substrate.

In some embodiments, the touch electrodes include a first electrode portion and a second electrode portion; an orthogonal projection of the first electrode portion on the base substrate and an orthogonal projection of an auxiliary conductive portion on the base substrate have an overlapping region, and an orthogonal projection of the second electrode portion on the base substrate and the orthogonal projection of the auxiliary conductive portion on the base substrate do not overlap; and a width of the first electrode portion is larger than a width of the second electrode portion.

In some embodiments, the display panel further includes:

a light emitting functional layer, located between the pixel defining layer and the touch electrodes, the light emitting functional layer including a plurality of first color light emitting layers, a plurality of second color light emitting layers, and a plurality of third color light emitting layers; wherein an orthogonal projection of the first color light emitting layers on the base substrate covers an orthogonal projection of the opening region in the first color sub-pixel on the base substrate;

an orthogonal projection of the second color light emitting layers on the base substrate covers an orthogonal projection of the opening region in the second color sub-pixel on the base substrate; and an orthogonal projection of the third color light emitting layers on the base substrate covers an orthogonal projection of the opening region in the third color sub-pixel on the base substrate.

In some embodiments, an orthogonal projection of touch electrodes located between adjacent opening regions on the base substrate overlaps orthogonal projections of at least two different color light emitting layers on the base substrate.

In some embodiments, an orthogonal projection of touch electrodes around the opening region of the third color sub-pixel on the base substrate is located within the orthogonal projection of the third color light emitting layers on the base substrate; and/or, an orthogonal projection of touch electrodes around the opening region of the second color sub-pixel on the base substrate is located within the orthogonal projection of the second color light emitting layers on the base substrate; and/or, an orthogonal projection of touch electrodes around the opening region of the first color sub-pixel on the base substrate is located within the orthogonal projection of the first color light emitting layers on the base substrate.

In some embodiments, for the third color light emitting layers and the second color light emitting layers adjacent thereto, a first minimum distance exists between a boundary of the orthogonal projection of the third color light emitting layers on the base substrate and a boundary of the orthogonal projection of the touch electrodes on the base substrate, and a second minimum distance exists between a boundary of the orthogonal projection of the second color light emitting layers on the base substrate and the boundary of the orthogonal projection of the touch electrodes on the base substrate; and the first minimum distance is greater than the second minimum distance.

In some embodiments, an area enclosed by the orthogonal projection of the touch electrodes around the opening region of the first color sub-pixel on the substrate is a first grid area;

an area enclosed by the orthogonal projection of the touch electrodes around the opening region of the second color sub-pixel on the base substrate is a second grid area;

an area enclosed by the orthogonal projection of the touch electrodes around the opening region of the third color sub-pixel on the base substrate is a third grid area; and the third grid area is larger than the second grid area which is larger than the first grid area.

In some embodiments, the display panel includes a plurality of repeating units; and the repeating units include the first color sub-pixel, the second color sub-pixel, and the third color sub-pixel.

In some embodiments, the repeating units further include a fourth color sub-pixel; an area enclosed by an orthogonal projection of touch electrodes around the opening region of the fourth color sub-pixel on the base substrate is a fourth grid area; and the first grid area corresponding to the first color sub-pixel is greater than or substantially equal to the fourth grid area corresponding to the fourth color sub-pixel.

In some embodiments, in the same repeating unit, the opening region of the third color sub-pixel and the opening region of the first color sub-pixel are arranged in a first direction;

a region enclosed by an inner boundary of the touch electrodes around the opening region of the third color sub-pixel has a first width in a direction perpendicular to the first direction;

a region enclosed by an inner boundary of the touch electrodes around the opening region of the first color sub-pixel has a second width in the direction perpendicular to the first direction; and the first width is greater than the second width.

In some embodiments, in the same repeating unit, the opening region of the second color sub-pixel and the opening region of the fourth color sub-pixel are arranged in the first direction;

a region enclosed by an inner boundary of the touch electrodes around the opening region of the second color sub-pixel has a third width in the direction perpendicular to the first direction;

a region enclosed by an inner boundary of the touch electrodes around the opening region of the fourth color sub-pixel has a fourth width in the direction perpendicular to the first direction; and the third width is greater than the fourth width.

In some embodiments, an extension direction of a grid line of the touch electrode having an overlap area with the orthogonal projection of the auxiliary conductive portions has an included angle $\beta$ with a third direction, and $15° \leq \beta \leq 60°$; wherein the third direction is substantially perpendicular to an extension direction of the data line patterns.

In some embodiments, $\tan\beta=A1/A2$; wherein A1 represents a width of the auxiliary conductive portions in a direction perpendicular to the third direction and A2 represents a width of the auxiliary conductive portions in the third direction.

In some embodiments, an extension direction of a grid line of the touch electrode having an overlap area with the orthogonal projection of the auxiliary conductive portion in the first color sub-pixel has a first included angle with the third direction;

an extension direction of a grid line of the touch electrode having an overlap area with the orthogonal projection of the auxiliary conductive portion in the second color sub-pixel has a second included angle with the third direction;

an extension direction of a grid line of the touch electrode having an overlap area with the orthogonal projection of the auxiliary conductive portion in the third color sub-pixel has a third included angle with the third direction; and the first included angle is smaller than the second included angle which is smaller than the third included angle.

In some embodiments, with the opening regions of four adjacent sub-pixels as an opening group, an orthogonal projection of a grid intersection of the touch electrodes on the base substrate is located in a region enclosed by an orthogonal projection of the opening group on the base substrate.

In some embodiments, the orthogonal projection of the grid intersection of the touch electrodes on the base substrate is located substantially at a center of the region enclosed by the orthogonal projection of the opening group on the base substrate.

In some embodiments, the fourth color sub-pixel has the same light emitting color as the first color sub-pixel.

In some embodiments, each of the sub-pixels further includes a first electrode;

an overlapping region between an orthogonal projection of the first electrode in the first color sub-pixel on the base substrate and the orthogonal projection of the touch electrodes on the base substrate has a first anode overlap area;

an overlapping region between an orthogonal projection of the first electrode in the second color sub-pixel on the base substrate and the orthogonal projection of the touch electrodes on the base substrate has a second anode overlap area;

an overlapping region between an orthogonal projection of the first electrode in the third color sub-pixel on the base substrate and the orthogonal projection of the touch electrodes on the base substrate has a third anode overlap area; and at least one of the first anode overlap area and the second anode overlap area is larger than the third anode overlap area.

In some embodiments, the first anode overlap area is larger than the second anode overlap area; or, the first anode overlap area is substantially equal to the second anode overlap area.

An embodiment of the present disclosure provides another display panel, including:

a base substrate;

a transistor array layer, located on the base substrate;

a pixel defining layer, located on a side of the transistor array layer facing away from the base substrate; and touch electrodes, located on a side of the pixel defining layer facing away from the base substrate; wherein the base substrate has a display region including a plurality of sub-pixels; the sub-pixels include pixel circuits and light emitting elements; the pixel circuits include gate line patterns, data line patterns, and power supply signal line patterns;

the transistor array layer includes a plurality of capacitance-conductive portions, and the sub-pixels include the corresponding capacitance-conductive portions; wherein, in each of the sub-pixels, there is an overlapping region between the capacitance-conductive portion and the data line pattern corresponding to the each of the sub-pixels and/or the power supply signal line pattern corresponding to the each of the sub-pixels; the capacitance-conductive portion is coupled to at least the power supply signal line pattern corresponding to the each of the sub-pixels or the data line pattern corresponding to the each of the sub-pixels;

the pixel defining layer includes a plurality of opening regions, and the sub-pixels include the corresponding opening regions;

an orthogonal projection of at least part of the touch electrodes on the base substrate is a grid;

the transistor array layer further includes a first conductive layer on which the capacitance-conductive portions are formed; and the pixel circuits include a plurality of transistors, and sources and drains of at least part of the transistors are formed in the first conductive layer.

In some embodiments, the capacitance-conductive portions are arc or irregular patterns.

In some embodiments, the capacitance-conductive portions include auxiliary conductive portions, and the auxiliary conductive portions at least partially overlap the power supply signal line patterns, the data line patterns, and the touch electrodes.

In some embodiments, the power supply signal line patterns of two adjacent columns of the sub-pixels are electrically connected by a power input line; or the power supply signal line patterns corresponding to two adjacent columns of the sub-pixels having the same color are electrically connected by the power input line.

In some embodiments, the power input line and the power supply signal line patterns are located on different layers.

In some embodiments, a width of the power supply signal line patterns is larger than a width of the data line patterns.

In some embodiments, the data line patterns and the power supply signal line patterns are not disposed on the same conductive layer; or, the data line pattern and the power input line are not disposed on the same conductive layer.

In some embodiments, the first conductive layer includes first sub-conductive layers and second sub-conductive layers disposed in a laminated mode with first sub-insulating layers disposed therebetween.

In some embodiments, an overlap area of the capacitance-conductive portions and the power supply signal line patterns is larger than an overlap area of the capacitance-conductive portions and the data line patterns.

In some embodiments, the pixel circuits include: seventh transistors, and second transistors; gates of the seventh transistors are coupled to a second reset signal line pattern and gates of the second transistors are coupled to a first reset signal line pattern; and the first reset signal line pattern and the second reset signal line pattern transmit different signals.

In some embodiments, the pixel circuits include: data writing transistors, and first transistors; and gate line patterns coupled to gates of the data writing transistors and gate line patterns coupled to gates of the first transistors transmit different timing signals.

An embodiment of the present disclosure provides a display device, including the above display panel.

DETAILED DESCRIPTION OF THE EMBODIMENTS

Figure 1:
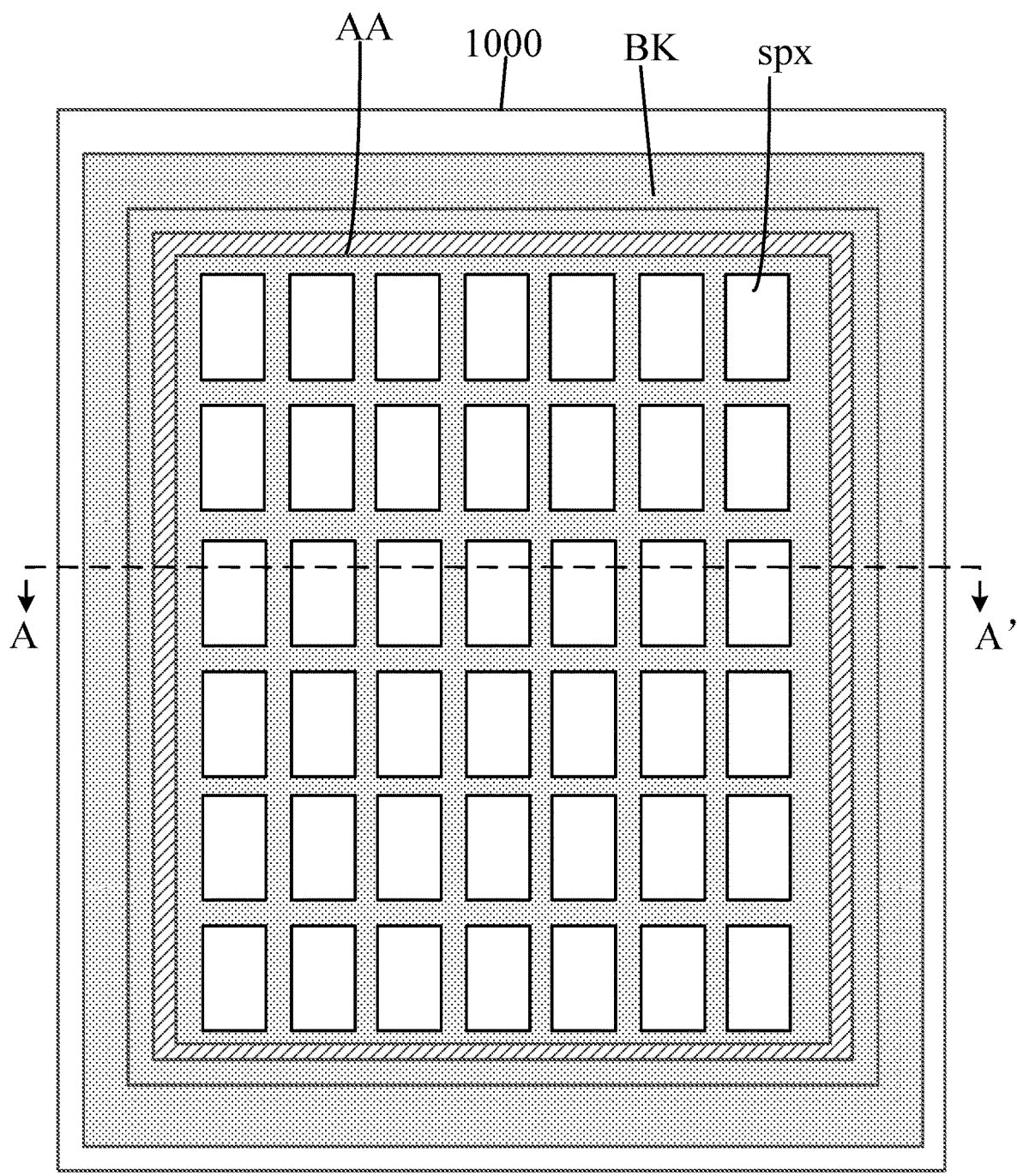
FIG. 1 is a schematic structural diagram of some display panels in embodiments of the present disclosure.

In order to make the objects, technical solutions and advantages of embodiments of the present disclosure more clear, the technical solutions of the embodiments of the present disclosure will be clearly and completely described below in conjunction with the accompanying drawings of the embodiments of the present disclosure. Apparently, the described embodiments are some, but not all, embodiments of the present disclosure. The embodiments and features in the embodiments in the present disclosure may be combined with each other without conflict. Based on the described embodiments of the present disclosure, all other embodiments obtained by a person of ordinary skill in the art without inventive effort fall within the scope of protection of the present disclosure.

Unless otherwise defined, technical or scientific terms used herein are to be taken as commonly understood by one of ordinary skill in the art to which this disclosure belongs. The terms "first", "second" and the like, as used in this disclosure, do not denote any order, quantity, or importance, but are merely used to distinguish one component from another. The word "including" or "containing" and the like means that elements or items preceding the word appear to encompass elements or items listed after the word and equivalents thereof, but not to the exclusion of other elements or items. "Connecting" or "connected" and the like are not restricted to physical or mechanical connections, but can include electrical connections, whether direct or indirect.

It is noted that the sizes and shapes of the figures in the drawings do not reflect the true scale, but are merely illustrative of contents of the present disclosure. The same or similar reference numerals throughout refer to the same or similar elements or elements having the same or similar functions.

Figure 2:
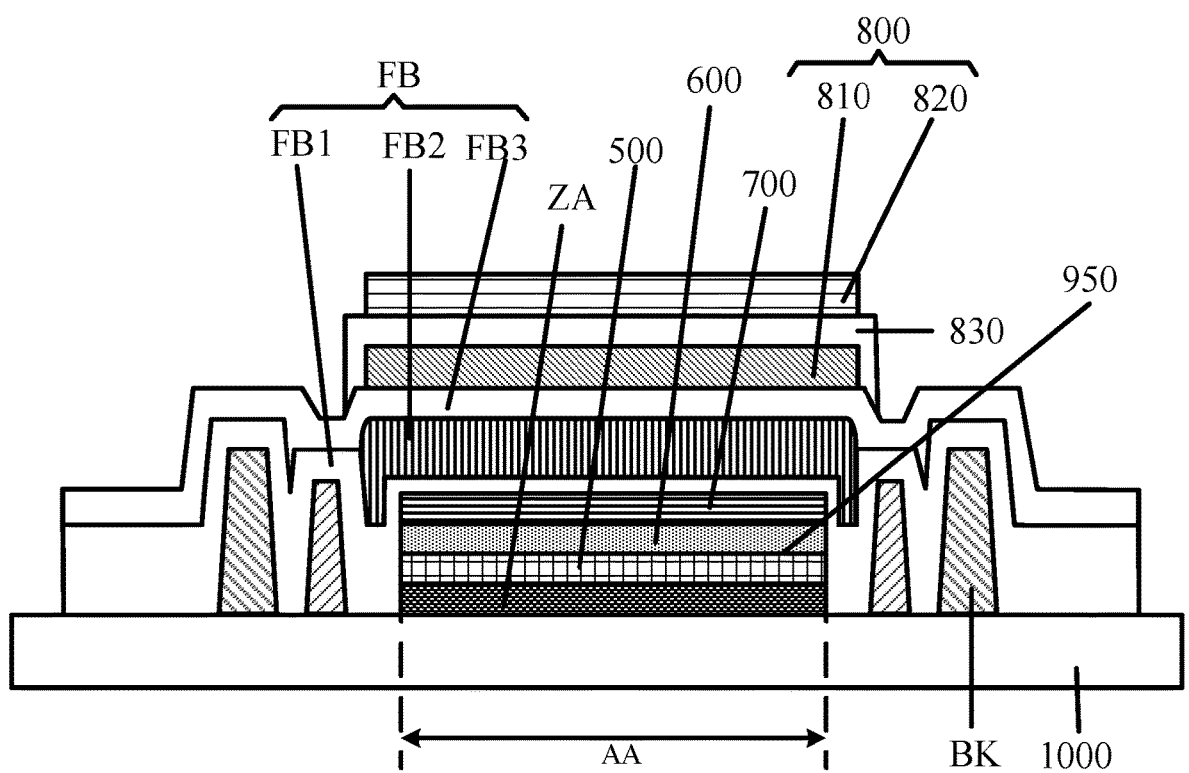
FIG. 2 is a schematic partial cross-sectional view of the display panels shown in FIG. 1 in a direction AA'.

A display panel provided by an embodiment of the present disclosure, as shown in FIGS. 1 and 2, may include: a base substrate 1000, a transistor array layer ZA located on the base substrate 1000, a first electrode layer 500 on a side of the transistor array layer ZA facing away from the base substrate 1000, a pixel defining layer 950 located on a side of the first electrode layer 500 facing away from the base substrate 1000, a light emitting functional layer 600 on a side of the pixel defining layer 950 facing away from the base substrate 1000, a second electrode 700 on a side of the light emitting functional layer 600 facing away from the base substrate 1000, an encapsulation layer FB on a side of the second electrode 700 facing away from the base substrate 1000, and touch electrodes 800 on a side of the encapsulation layer FB facing away from the base substrate 1000.

In some embodiments of the present disclosure, as shown in FIG. 1, the base substrate 1000 has a display region AA and a non-display region surrounding the display region. The display region has a plurality of sub-pixels spx. The non-display region has a blocking dam BK surrounding the display region AA. In addition, the non-display region may further include a circuit structure such as a driver circuit, for example, a structure such as a Gate Driver on Array (GOA), which is not described in detail herein.

In some embodiments, the sub-pixels spx may include pixel circuits and light emitting elements. The pixel circuits include transistors and capacitors for driving the light emitting elements to emit light. It is noted that one or more implementations described herein correspond to a display panel having 7T2C (i.e., 7 thin film transistors and 2 capacitors) pixel circuits. In another implementation, the display panel may include different pixel circuits, e.g., greater than or less than 7 thin film transistors, as well as one or more capacitors.

Figure 3:
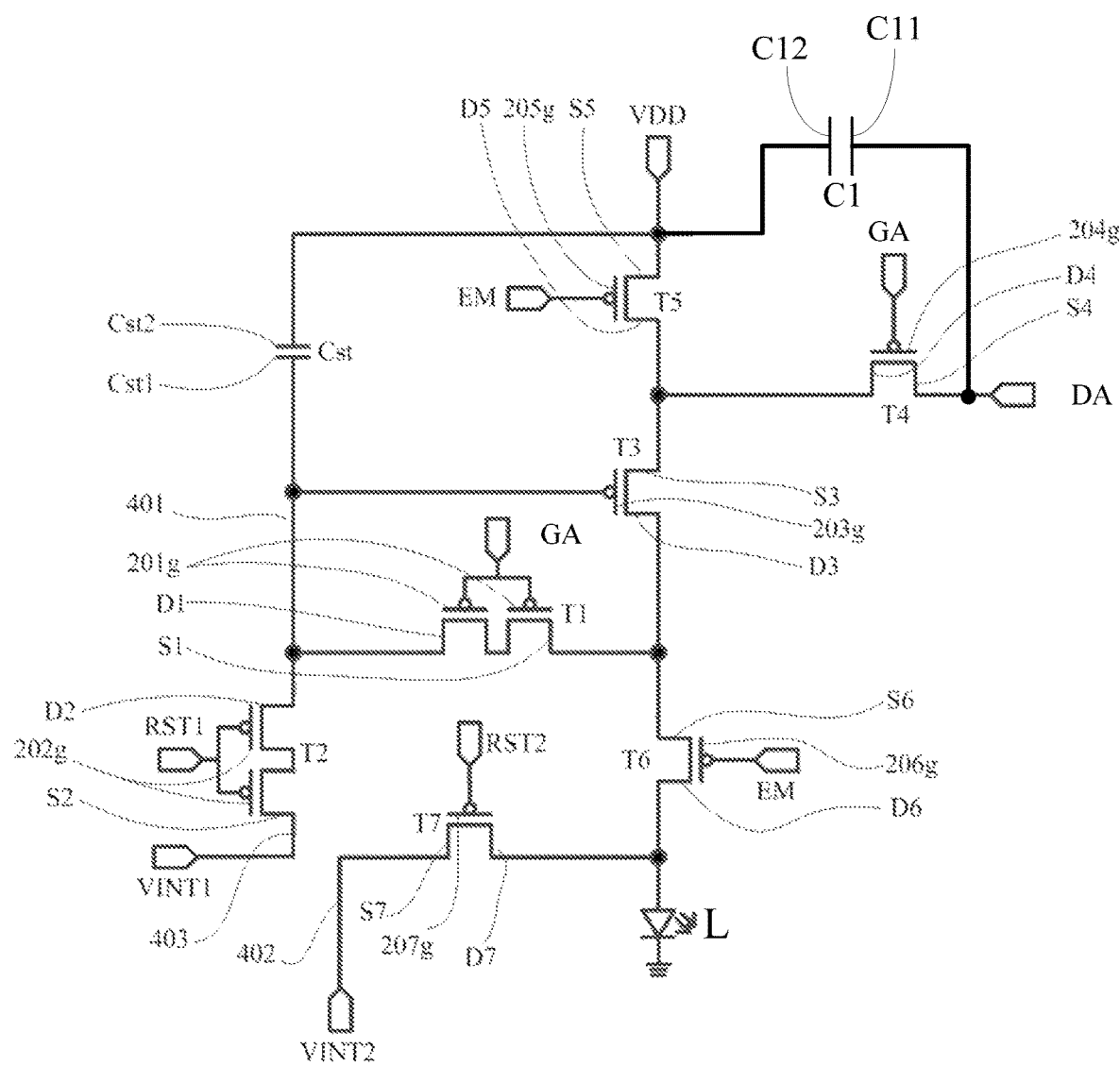
FIG. 3 is a schematic structural diagram of some pixel circuits in embodiments of the present disclosure.

As shown in FIG. 3, in the display panel provided by embodiments of the present disclosure, the sub-pixels may include: gate line patterns GATE (abbreviated GA), first reset signal line patterns RST1, first initialization signal line patterns VINT1, data line patterns DATA (abbreviated DA), light emitting control signal line patterns EM, power supply signal line patterns VDD, second reset signal line patterns RST2, and second initialization signal line patterns VINT2.

In some embodiments, the first reset signal line patterns RST1 and the second reset signal line patterns RST2 may transmit different signals.

In some embodiments, the first reset signal line patterns RST1 and the second reset signal line patterns RST2 may be located at different layers. For example, the first reset signal line patterns RST1 are on the same layer as the gate line patterns GA, and the second reset signal line patterns RST2 are on the same layer as the data line patterns DA or the power supply signal line patterns VDD.

In some embodiments, the first initialization signal line patterns VINT1 and the second initialization signal line patterns VINT2 may transmit the same signal.

In some embodiments, the first initialization signal line patterns VINT1 and the second initialization signal line patterns VINT2 may also transmit different signals. For example, VINT1 is V1 and VINT2 is V1±5 V.

In some embodiments, the first initialization signal line patterns VINT1 and the second initialization signal line patterns VINT2 may be located at different layers. For example, the first initialization signal line patterns VINT1 are on the same layer as the gate line patterns GA, and the second initialization signal line patterns VINT2 are on the same layer as the data line patterns DA or the first reset signal line patterns RST1.

As shown in FIG. 3, the pixel circuits in the sub-pixels may include: first transistors T1, second transistors T2, third transistors T3, data write transistors T4, fifth transistors T5, sixth transistors T6, seventh transistors T7, first capacitors Cst, and second capacitors C1.

Taking one pixel circuit as an example, each transistor included in the pixel circuit employs a P-type transistor. The first transistor T1 may be of a dual-gate structure, with a gate 201g of the first transistor T1 coupled to the gate line pattern GA, a source S1 of the first transistor T1 coupled to a drain D3 of the third transistor T3, and a drain D1 of the first transistor T1 coupled to a gate 203g of the third transistor T3. Of course, the first transistor T1 may be of a single-gate structure or a multi-gate structure, and is not limited here.

The second transistor T2 may be of a dual-gate structure, with a gate 202g of the second transistor T2 coupled to the first reset signal line pattern RST1, a source S2 of the second transistor T2 coupled to the first initialization signal line pattern VINT1, and a drain D2 of the second transistor T2 coupled to the gate 203g of the third transistor T3. Of course, the second transistor T2 may be of a single-gate structure or a multi-gate structure, and is not limited here.

A gate 204g of the data write transistor T4 is coupled to the gate line pattern GA, a source S4 of the data write transistor T4 is coupled to the data line pattern DA, and a drain D4 of the data write transistor T4 is coupled to a source S3 of the third transistor T3. In some embodiments, the gate line pattern GA to which the gate 204g of the data write transistor T4 is coupled may transmit different timing signals than the gate line pattern GA to which the gate 201g of the first transistor T1 is coupled, without limitation herein.

A gate 205g of the fifth transistor T5 is coupled to the light emitting control signal line pattern EM, a source S5 of the fifth transistor T5 is coupled to the power supply signal line pattern VDD, and a drain D5 of the fifth transistor T5 is coupled to the source S3 of the third transistor T3.

A gate 206g of the sixth transistor T6 is coupled to the light emitting control signal line pattern EM, a source S6 of the sixth transistor T6 is coupled to a drain D3 of the third transistor T3, and a drain D6 of the sixth transistor T6 is coupled to an anode of the light emitting element L. In some embodiments, the light emitting control signal line pattern EM to which the gate 205g of the fifth transistor T5 is coupled and the light emitting control signal line pattern EM to which the gate 206g of the sixth transistor T6 is coupled may transmit different timing signals, without limitation herein.

A gate 207g of the seventh transistor T7 is coupled to the second reset signal line pattern RST2, a drain D7 of the seventh transistor T7 is coupled to the anode of the light emitting element L, and a source S7 of the seventh transistor T7 is coupled to the second initialization signal line pattern VINT2.

A first plate Cst1 of the first capacitor Cst is coupled to the gate 203g of the third transistor T3, and a second plate Cst2 of the first capacitor Cst is coupled to the power supply signal line pattern VDD.

A first end of the second capacitor C1 (i.e., a first plate C11) is coupled to a first end of the data write transistor (e.g., the data line pattern DA), and a second end of the second capacitor C1 (e.g., a second plate C12) is coupled to the power supply signal line pattern VDD. For example: the first plate C11 of the second capacitor C1 is coupled to a data line pattern DA and/or the data write transistor T4, and the second plate C12 of the second capacitor C1 is coupled to the power supply signal line pattern VDD.

Optionally, it may be that the second plate C12 of the second capacitor C1 is electrically connected to the power supply signal line pattern VDD, and the first plate C11 of the second capacitor C1 extends below or above the data line pattern DA such that there is an overlap between orthogonal projections of the first plate C11 and the data line pattern DA on the base substrate.

Optionally, the first end of the data write transistor T4 may also be the source (or a source region, e.g., S4 of FIG. 3), or drain (or a drain region, e.g., D4 of FIG. 3), or gate (e.g., 204g of FIG. 3) of the data write transistor T4. It is to be noted that S and D in FIG. 3 are only one reference number for the purpose of distinguishing.

Optionally, the first end of the data write transistor T4 may also be a connection between the source of the data write transistor T4 and the data line pattern DA.

Figure 4:
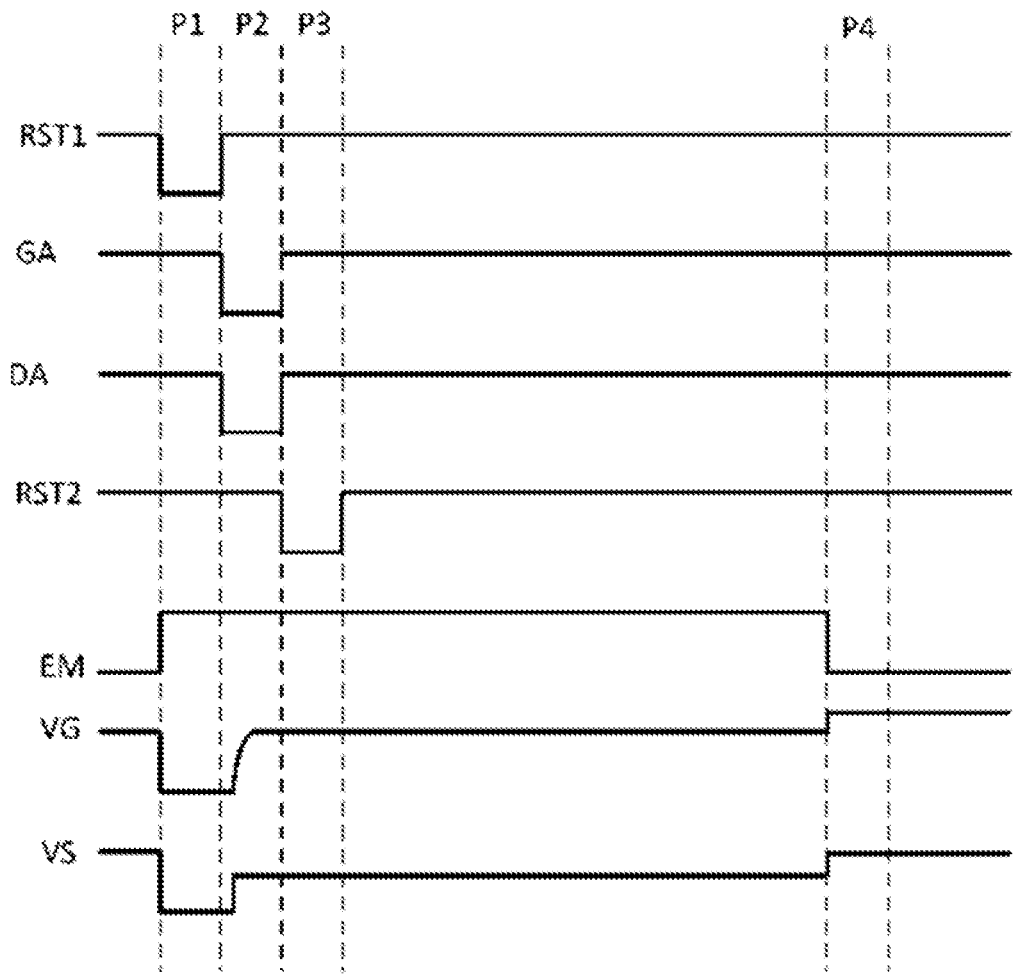
FIG. 4 is some signal timing diagrams in embodiments of the present disclosure.
Figure 5A:
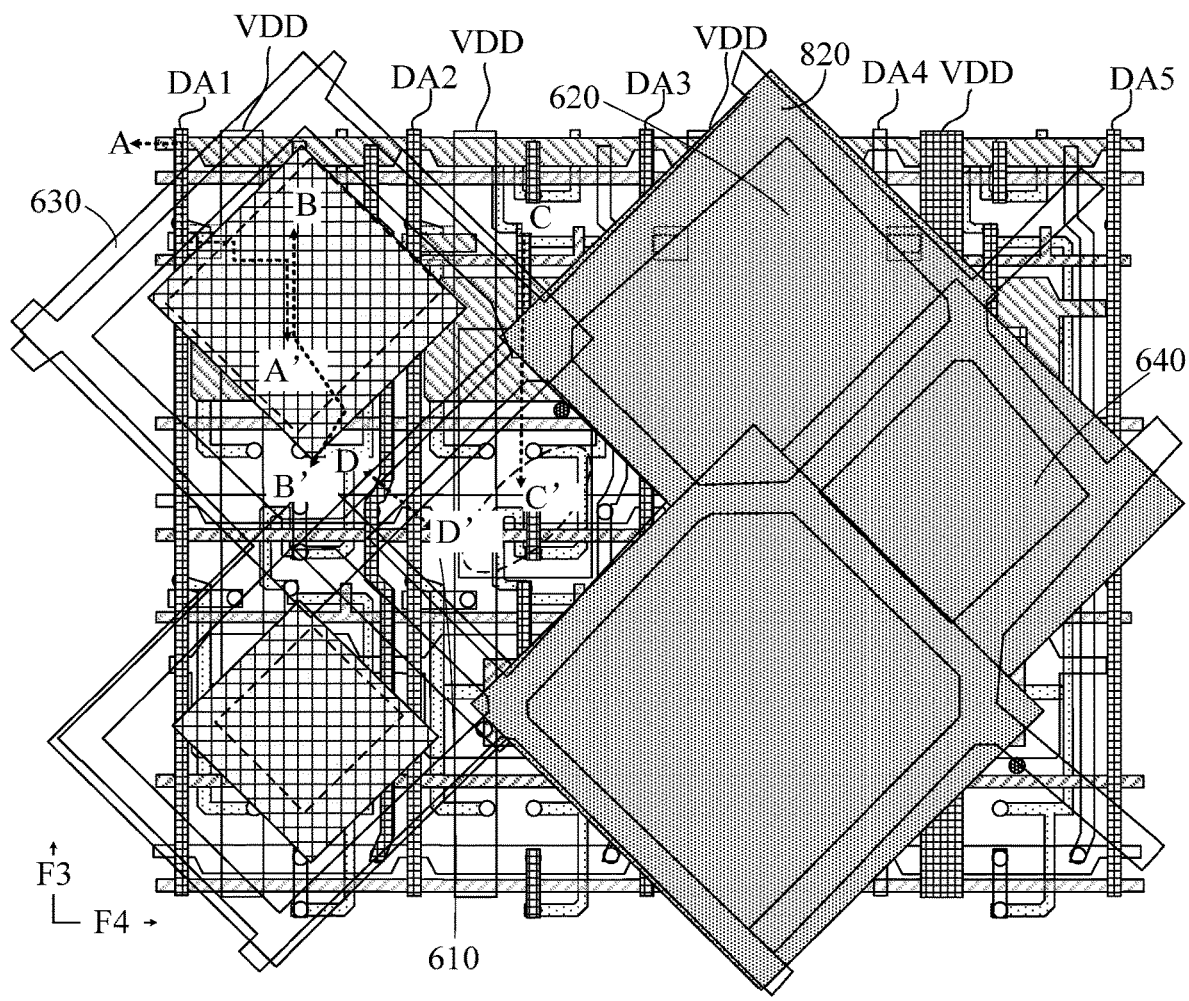
FIG. 5A is a schematic layout structure diagram of some display panels in embodiments of the present disclosure.
Figure 5B:
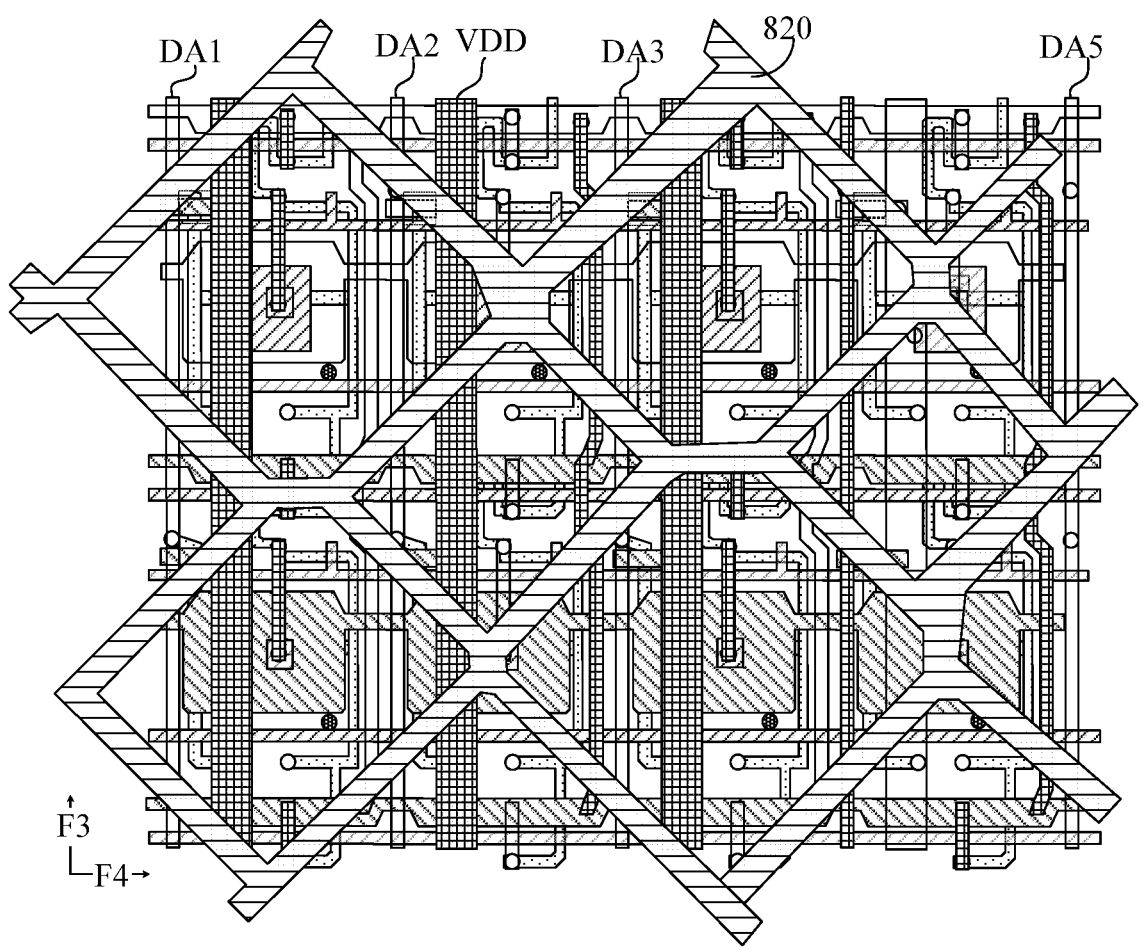
FIG. 5B is a schematic layout structure diagram of further display panels in embodiments of the present disclosure.
Figure 5C:
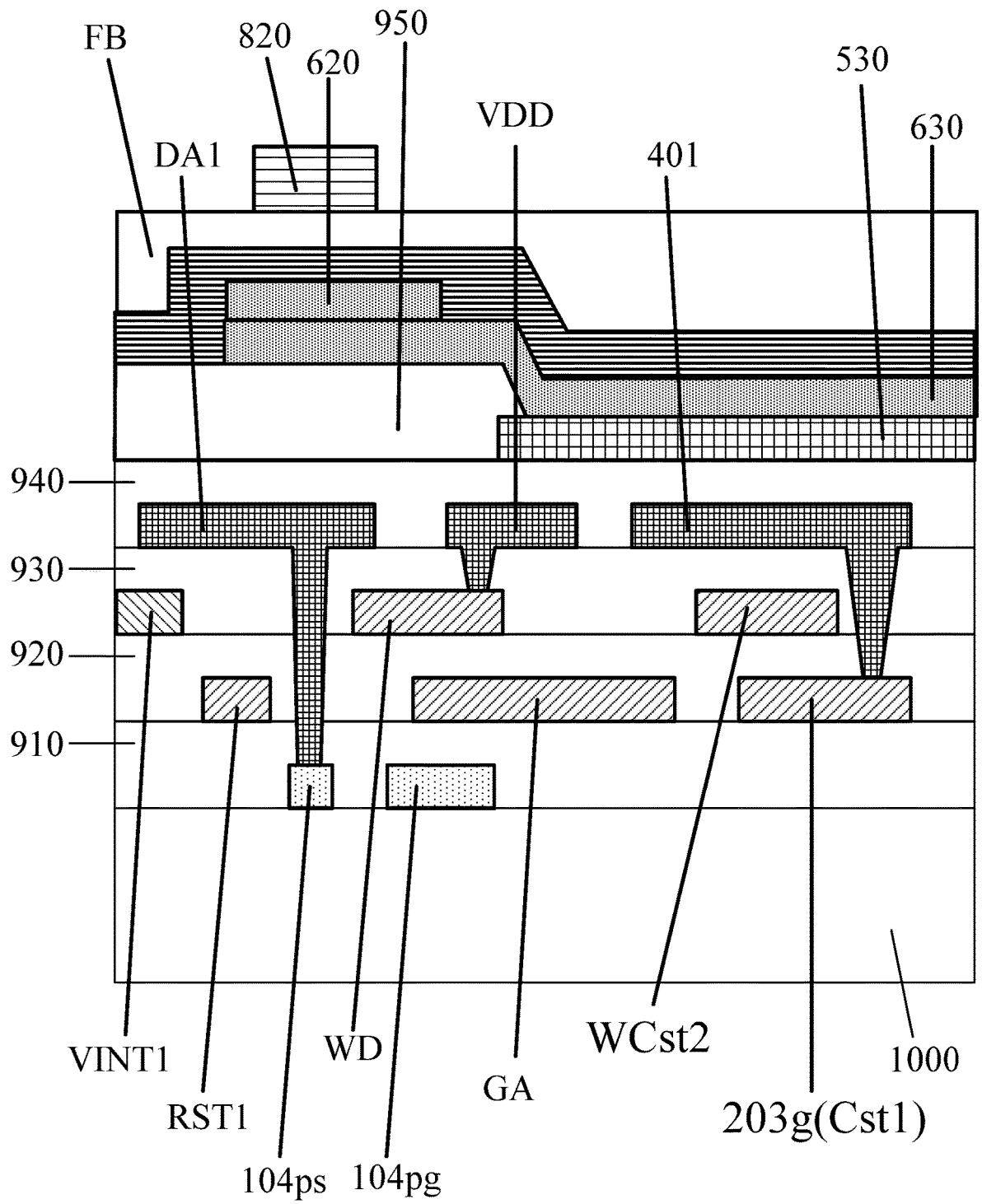
FIG. 5C is a schematic cross-sectional view of the display panels shown in FIG. 5A in a direction AA'.
Figure 5D:
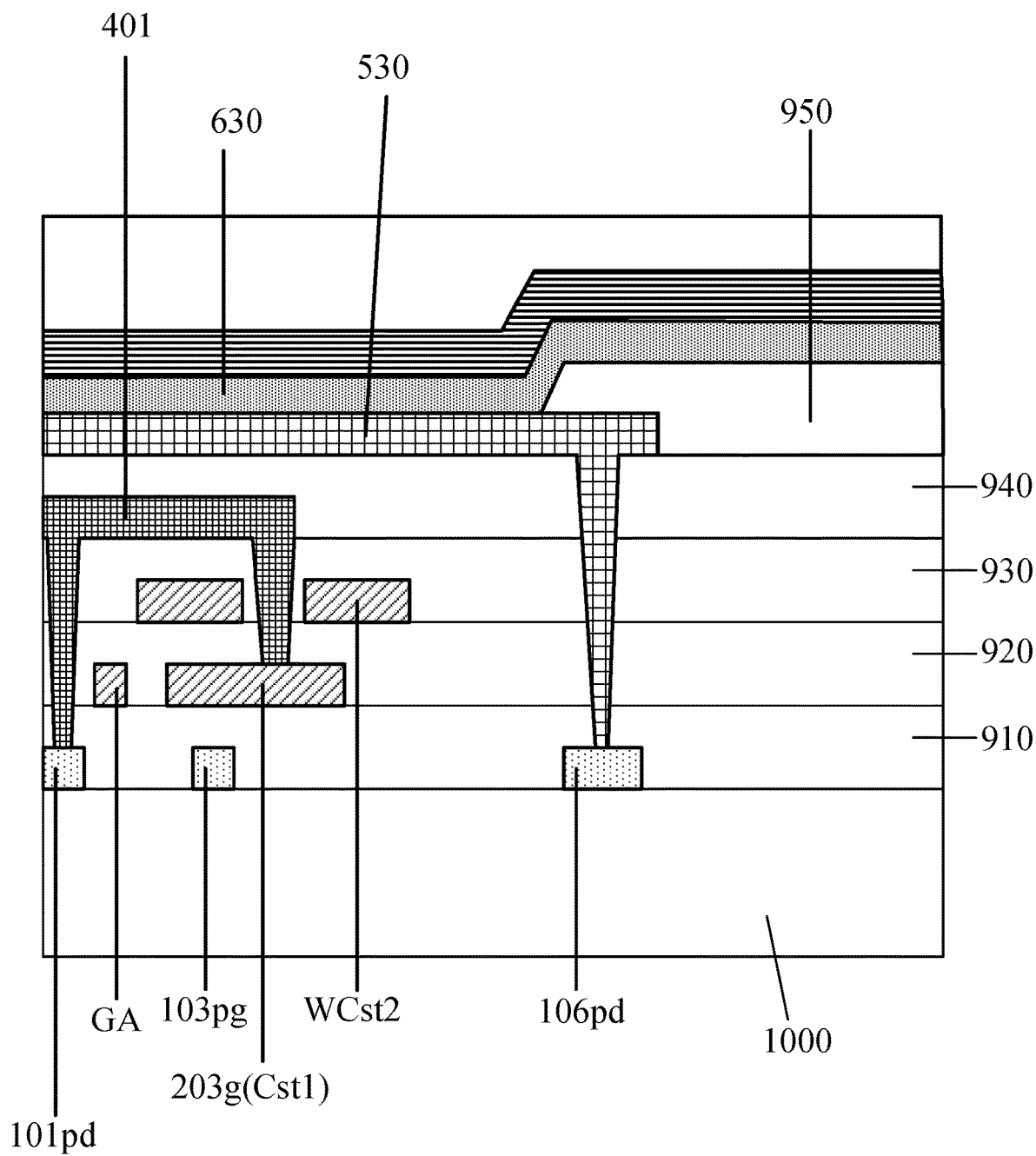
FIG. 5D is a schematic cross-sectional view of the display panels shown in FIG. 5A in a direction BB'.
Figure 5E:
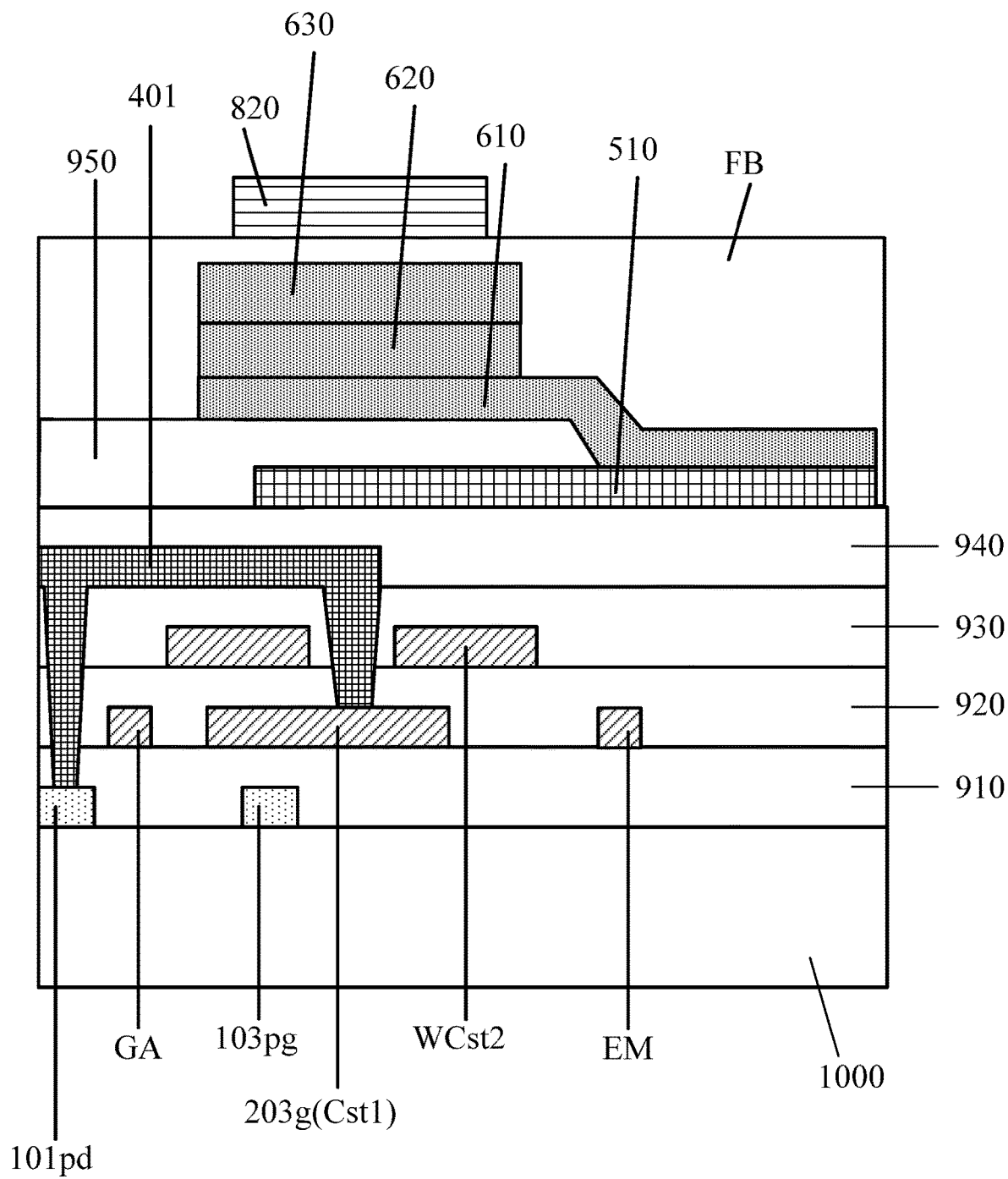
FIG. 5E is a schematic cross-sectional view of the display panels shown in FIG. 5A in a direction CC'.
Figure 5F:
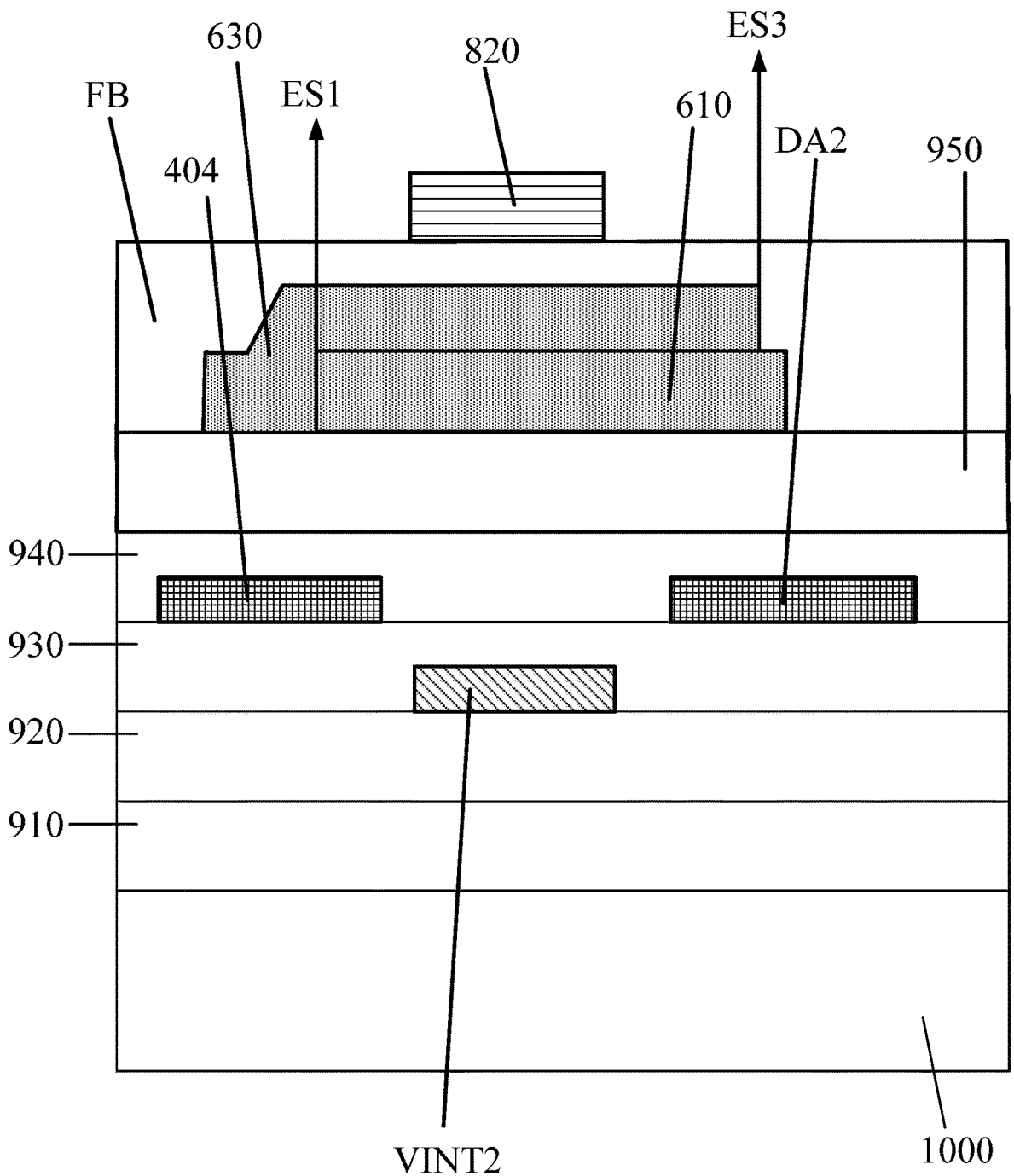
FIG. 5F is a schematic cross-sectional view of the display panels shown in FIG. 5A in a direction DD'.
Figure 5G:
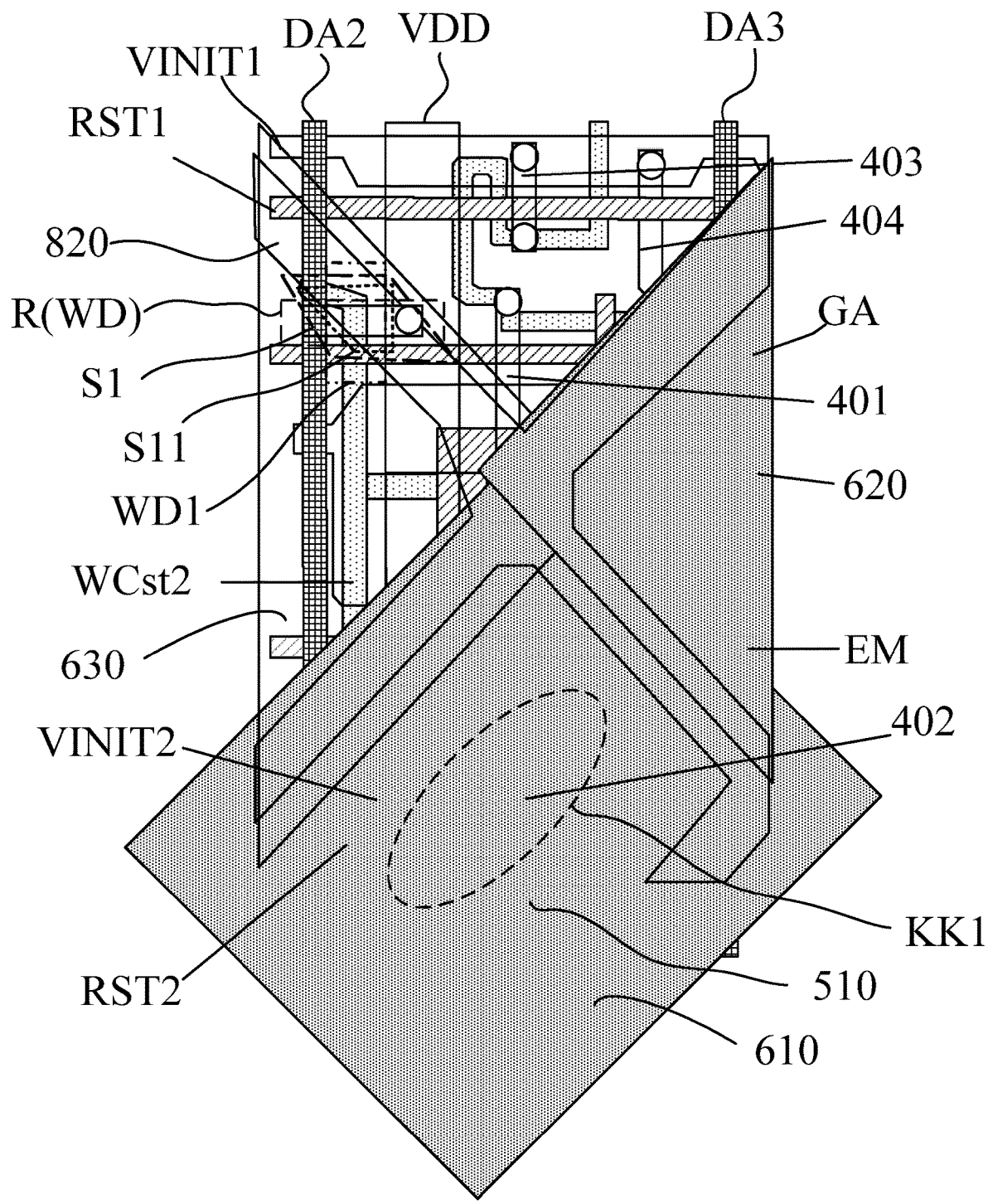
FIG. 5G is a schematic layout structure diagram in a first color sub-pixel in embodiments of the present disclosure.
Figure 5H:
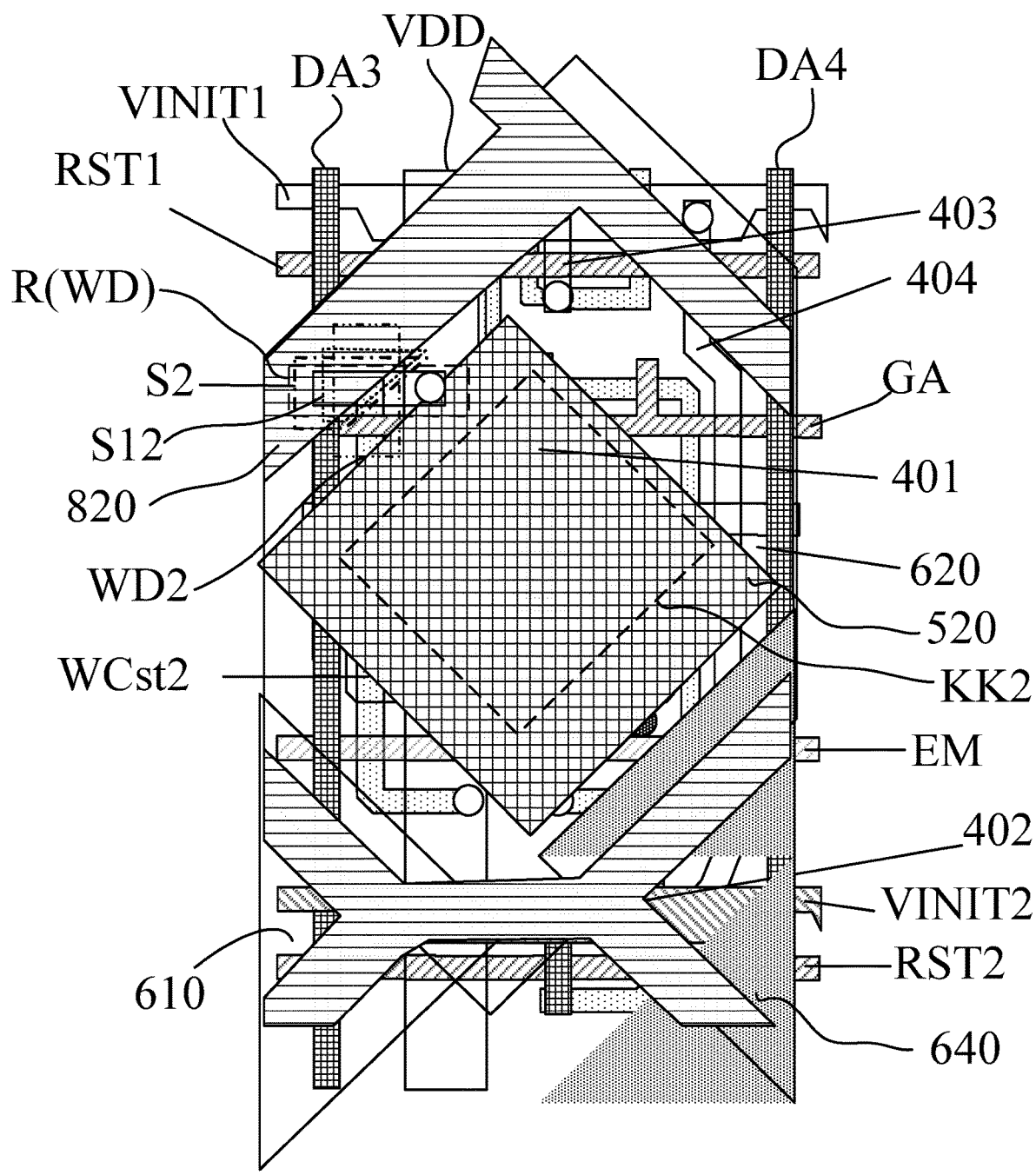
FIG. 5H is a schematic layout structure diagram in a second color sub-pixel in embodiments of the present disclosure.
Figure 5I:
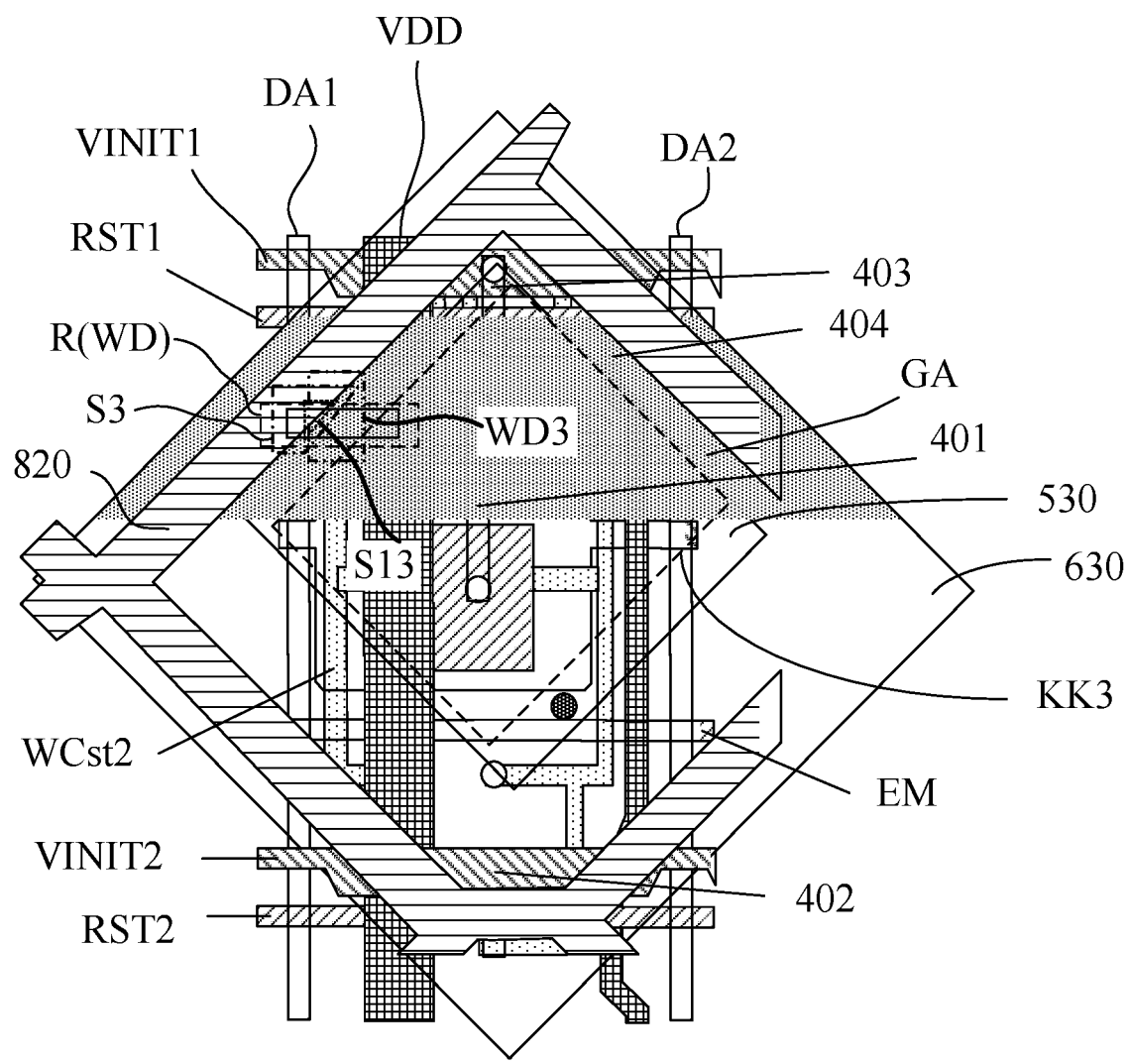
FIG. 5I is a schematic layout structure diagram in a third color sub-pixel in embodiments of the present disclosure.

As shown in FIG. 4, in some embodiments, when the pixel circuit of the above-described structure is in operation, one duty cycle includes a first reset period P1, a write compensation period P2, a second reset period P3, and a light emitting period P4.

In the first reset period P1, a first reset signal input by the first reset signal line pattern RST1 is at an active level, the second transistor T2 is turned on, and an initialization signal transmitted by the first initialization signal line pattern VINT1 is input to the gate 203g of the third transistor T3, so that the gate 203g of the third transistor T3 is reset. For example: a gate-to-source voltage Vgs held on the third transistor T3 in the previous frame is cleared.

In the write compensation period P2, the first reset signal is at an inactive level, the second transistor T2 is turned off, a gate scan signal input through the gate line pattern GA is at an active level, the first transistor T1 and the data write transistor T4 are controlled to turn on, the data line pattern DA writes a data signal, and the data signal is transmitted to the source S3 of the third transistor T3 via the data write transistor T4. At the same time, the first transistor T1 and the data write transistor T4 are turned on, such that the third transistor T3 is formed as a diode structure, thus, by cooperating the first transistor T1, the third transistor T3, and the data writing transistor T4, threshold voltage compensation of the third transistor T3 is achieved, and when the compensation time is long enough, the gate 203g potential of the third transistor T3 may be controlled to eventually reach Vdata+Vth, where Vdata represents a data signal voltage value and Vth represents a threshold voltage of the third transistor T3.

In the second reset period P3, the gate scan signal is at an inactive level, the first transistor T1 and the data write transistor T4 are both turned off, a second reset signal input by the second reset signal line RST2 is at an active level, the seventh transistor T7 is controlled to be turned on, and an initialization signal transmitted by the second initialization signal line pattern VINT2 is input to the anode of the light emitting element L, so that the light emitting element L is controlled not to emit light.

In the light emitting period P4, a light emitting control signal written by the light emitting control signal line pattern EM is at an active level, the fifth transistor T5 and the sixth transistor T6 are controlled to turn on, and a power supply signal transmitted by the power supply signal line pattern VDD is input to the source S3 of the third transistor T3. At the same time, the third transistor T3 is turned on due to the gate 203g of the third transistor T3 being held at Vdata+Vth, and a gate-to-source voltage corresponding to the third transistor T3 is Vdata+Vth−VDD, where VDD is a voltage value of the power supply signal; and a drain current generated based on the gate-to-source voltage flows to the anode of the corresponding light emitting element L to drive the corresponding light emitting element L to emit light.

It is noted that when each transistor is the P-type transistor, the active level may be a low level and the inactive level may be a high level. When each transistor is an N-type transistor, the active level may be a high level and the inactive level may be a low level. The transistors of the pixel circuit may be either P-type transistors or N-type transistors, or include both P-type transistors and N-type transistors, for example: the transistor T3 is a P-type transistor and T1 is an N-type transistor. It will be appreciated that FIG. 4 is merely an exemplary introduction to the timing of operation of the pixel circuit, and the signals RST1, RST2, Ga, EM, Da, and the like may be adapted according to the transistor type of the pixel circuit and the actual situation.

As shown in FIGS. 5A to 5I, in some embodiments, when the above-described transistor array layer ZA is fabricated, the layout of all film layers is as follows: the semiconductor layer 400, the gate insulating layer 910, the third conductive layer 300, an interlayer dielectric layer 920, the second conductive layer 200, a first interlayer insulating layer 930, the first conductive layer 100, and the second interlayer insulating layer 940 are sequentially arranged in a laminated mode in a direction away from the base substrate 1000. It will be appreciated that other metal or insulating layers may also be included between the base substrate 1000 and the semiconductor layer 400. For example, at least one buffer layer or an organic insulating layer is also included between the base substrate 1000 and the semiconductor layer 400, for example, the buffer layer may be silicon oxide or silicon nitride or the like, and the organic insulating layer may be polyimide or the like.

As shown in FIGS. 5A to 5I, 6A and 7A, the semiconductor layer 400 is used to form channel regions (e.g., 101pg-107pg), source formation regions (e.g., 101ps-107ps), drain formation regions (e.g., 101pd-107pd), connection formation regions (e.g., 101px, and 102px), etc. of the transistors in the pixel circuit. Of course, other structures may also be formed as desired, such as forming a lightly doped drain (LDD) region, the LDD region doped with low concentration impurities being formed between the drain formation region (e.g., 101pd-107pd) of the at least one transistor and the channel region (e.g., 101pg-107pg) of the transistor, and between the source formation region (e.g., 101ps-107ps) of the transistor and the channel region (e.g., 101pg-107pg) of the transistor. The semiconductor layer 400 corresponding to the source formation region and the drain formation region may have better conductive properties than the semiconductor layer 400 corresponding to the channel region due to doping. Optionally, the semiconductor layer 400 may employ amorphous silicon, poly silicon, combinations thereof, or the like. For example, the semiconductor layer 400 is Low Temperature Poly Silicon (LTPS), the semiconductor layer 400 includes an oxide semiconductor material (e.g., Indium Gallium Zinc Oxide (IGZO)), and the semiconductor layer 400 includes Low Temperature Polycrystalline Oxide (LTPO). For example, as shown in FIG. 3: the semiconductor layer 400 of T3 is LTPS and the semiconductor layer 400 of T1 includes an oxide semiconductor material LTPO.

It is noted that the source formation region, the drain formation region and the connection formation region described above may be conductive regions in which n-type impurities or p-type impurities are doped in the semiconductor layer, so that the source formation region, the drain formation region and the connection formation region may be made as a connection structure of the semiconductor layer to make electrical connection. In some embodiments, the semiconductor layer corresponding to the source formation region and the drain formation region may act directly as a source or a drain of the corresponding transistor. Alternatively, a source in contact with the source formation region may be fabricated using a conductive material (e.g., a metal material) and a drain in contact with the drain formation region may be fabricated using a conductive material (e.g., a metal material).

As shown in FIGS. 5A to 5I, 6B, and 7B, the third conductive layer 300 is used to form the gates (e.g., 201g-207g) of the transistors in the pixel circuit and at least one of the structures of the gate line pattern GA, the light emitting control signal line pattern EM, the first reset signal line pattern RST1, and the second reset signal line pattern RST2 included in the display panel. Optionally, the gate 203g of the third transistor T3 in the pixel circuit is multiplexed into the first plate Cst1 of the first capacitor Cst in that pixel circuit. Of course, the gate 203g of the third transistor T3 in the pixel circuit may also be multiplexed as the second plate Cst2 of the first capacitor Cst in that pixel circuit.

As shown in FIGS. 5A to 5I, 6C, and 7C, the second conductive layer 200 has a plurality of auxiliary conductive portions WD, a plurality of storage conductive portions WCst2 disposed spaced apart from the auxiliary conductive portions WD, and the first initialization signal line pattern VINT1 and the second initialization signal line pattern VINT2 included in the display panel. The sub-pixels include the auxiliary conductive portions. In the same sub-pixel, an orthogonal projection of a first end of the auxiliary conductive portion WD on the base substrate 1000 has an overlapping region with an orthogonal projection of the power supply signal line pattern on the base substrate 1000, and an orthogonal projection of a second end of the auxiliary conductive portion WD on the base substrate 1000 has an overlapping region with an orthogonal projection of the data line pattern on the base substrate 1000. Optionally, the auxiliary conductive portions WD at least partially overlap the power supply signal line pattern, the data line pattern, and the touch electrode.

Further, the sub-pixels include the storage conductive portions Cst2 for forming the second plate Cst2 of the first capacitor Cst, i.e., the storage conductive portions Cst2 are used as the second plate Cst2 of the first capacitor Cst. Of course, the storage conductive portions Cst2 may also act as the first plate Cst1 of the first capacitor Cst. The shape structure of the auxiliary conductive portions WD is not limited, and may be a regular rectangular shape or an irregular pattern having at least one arc-shaped side. In some embodiments, one end of each auxiliary conductive portion WD extends in a row direction F4 to the other end of the auxiliary conductive portion.

As shown in FIGS. 3, 5A to 5I, 6D and 7D, the first conductive layer 100 is used to form the sources (e.g., S1-S7) and drains (e.g., D1-D7) of the transistors in the pixel circuit, as well as the data line patterns (e.g., DA1, DA2, DA3, DA4 and DA5) and the power supply signal line patterns VDD included in the display panel. Optionally, a width of each power supply signal line pattern VDD is greater than a width of the data line patterns (e.g., DA1, DA2, DA3, DA4, and DA5). It is noted that connection lines 401, 402, 403 and 404 in FIGS. 6D and 7D may be formed by the first conductive layer, with specific layouts shown in FIGS. 5A to 5I, 6D and 7D.

Figure 7A:
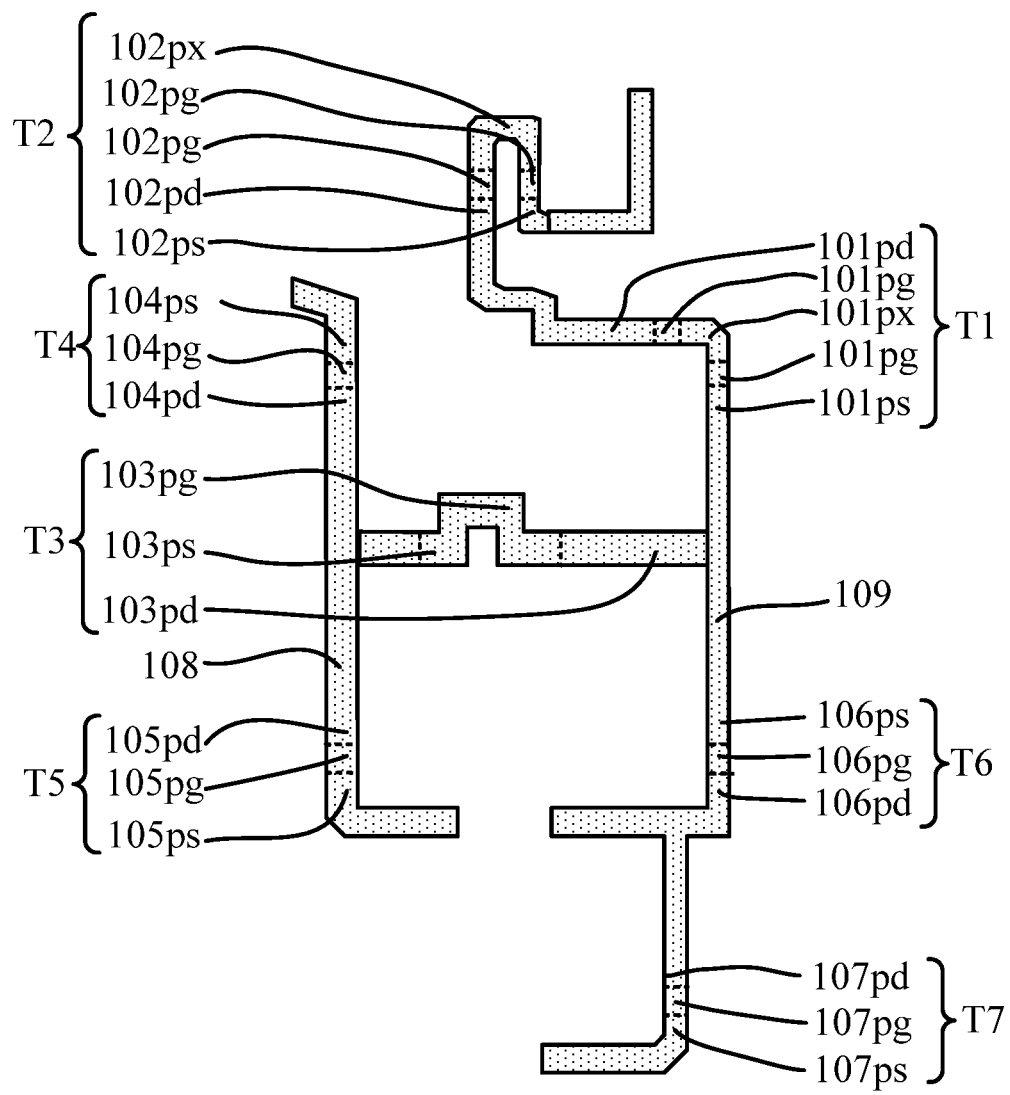
FIG. 7A is a schematic structural diagram of further semiconductor layers in embodiments of the present disclosure.
Figure 7B:
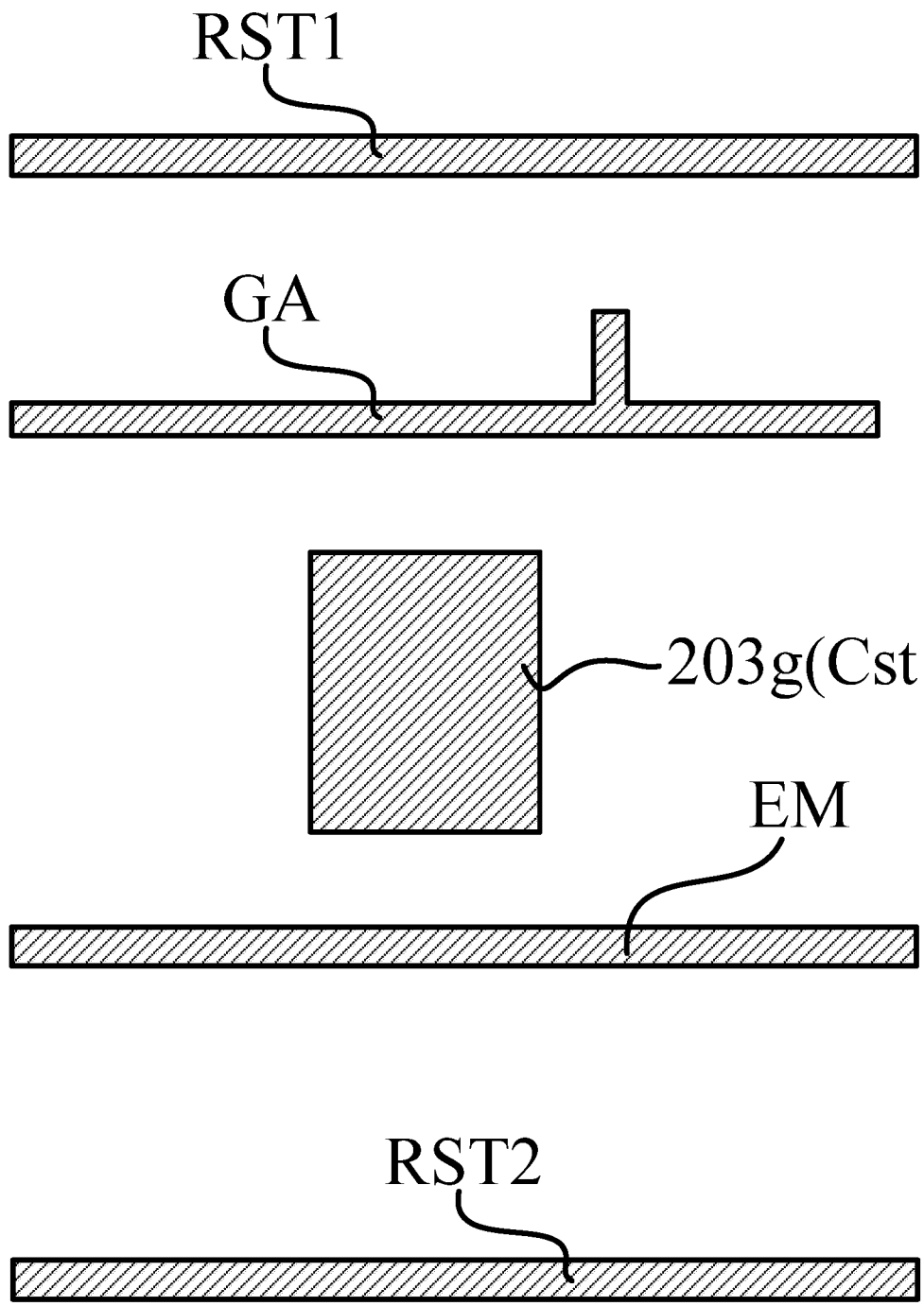
FIG. 7B is a schematic structural diagram of further third conductive layers in embodiments of the present disclosure.
Figure 7C:
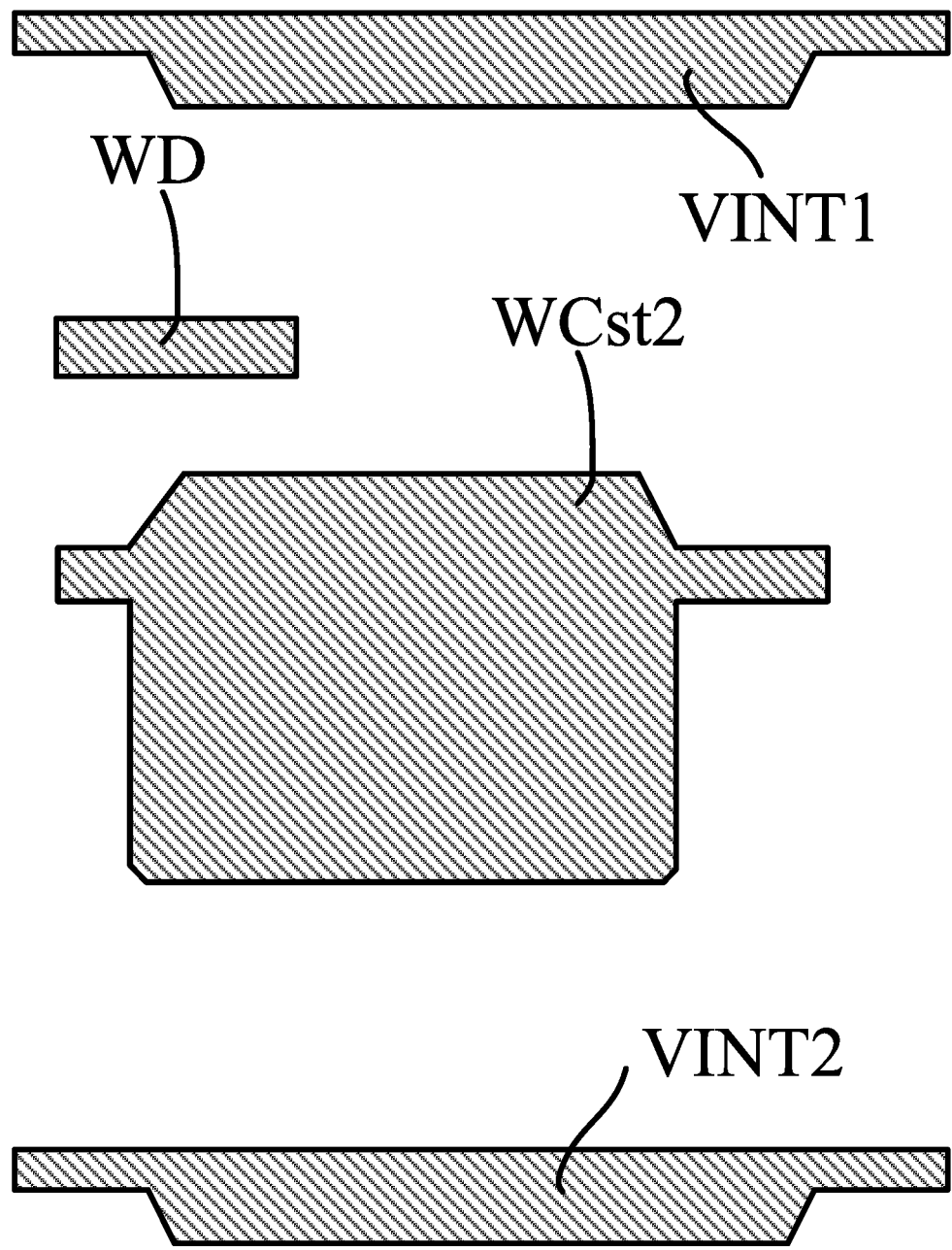
FIG. 7C is a schematic structural diagram of further second conductive layers in embodiments of the present disclosure.
Figure 7D:
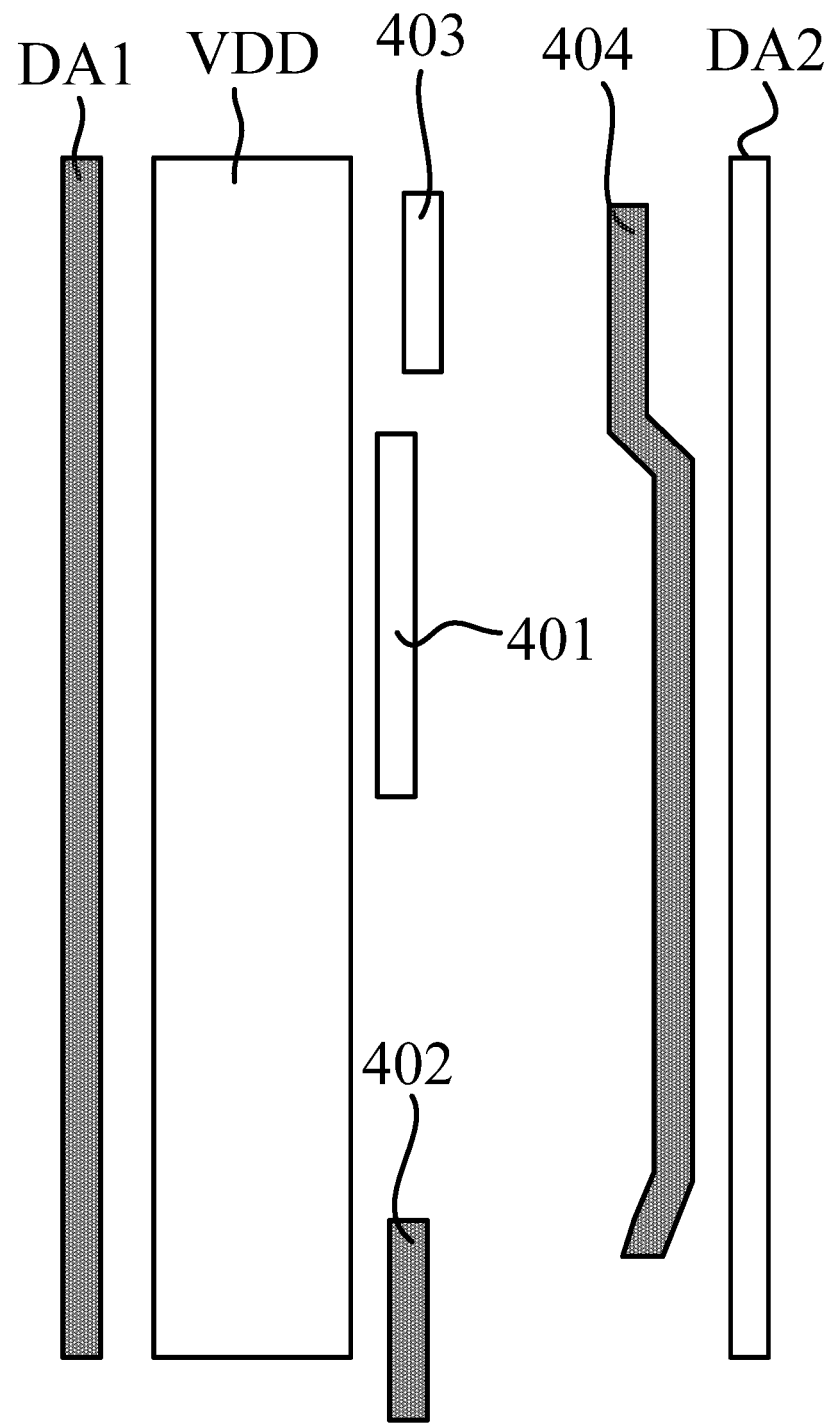
FIG. 7D is a schematic structural diagram of further first conductive layers in embodiments of the present disclosure.
Figure 7E:
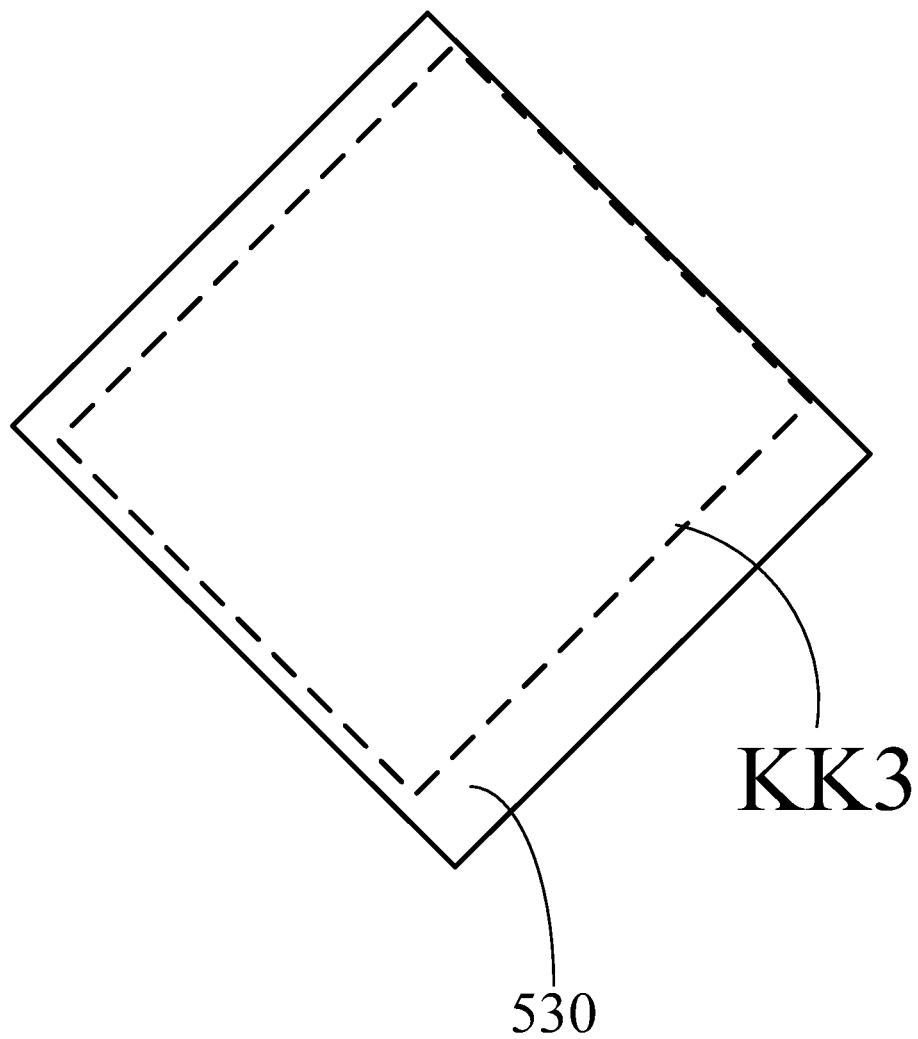
FIG. 7E is a schematic structural diagram of further first electrode layers in embodiments of the present disclosure.
Figure 7F:
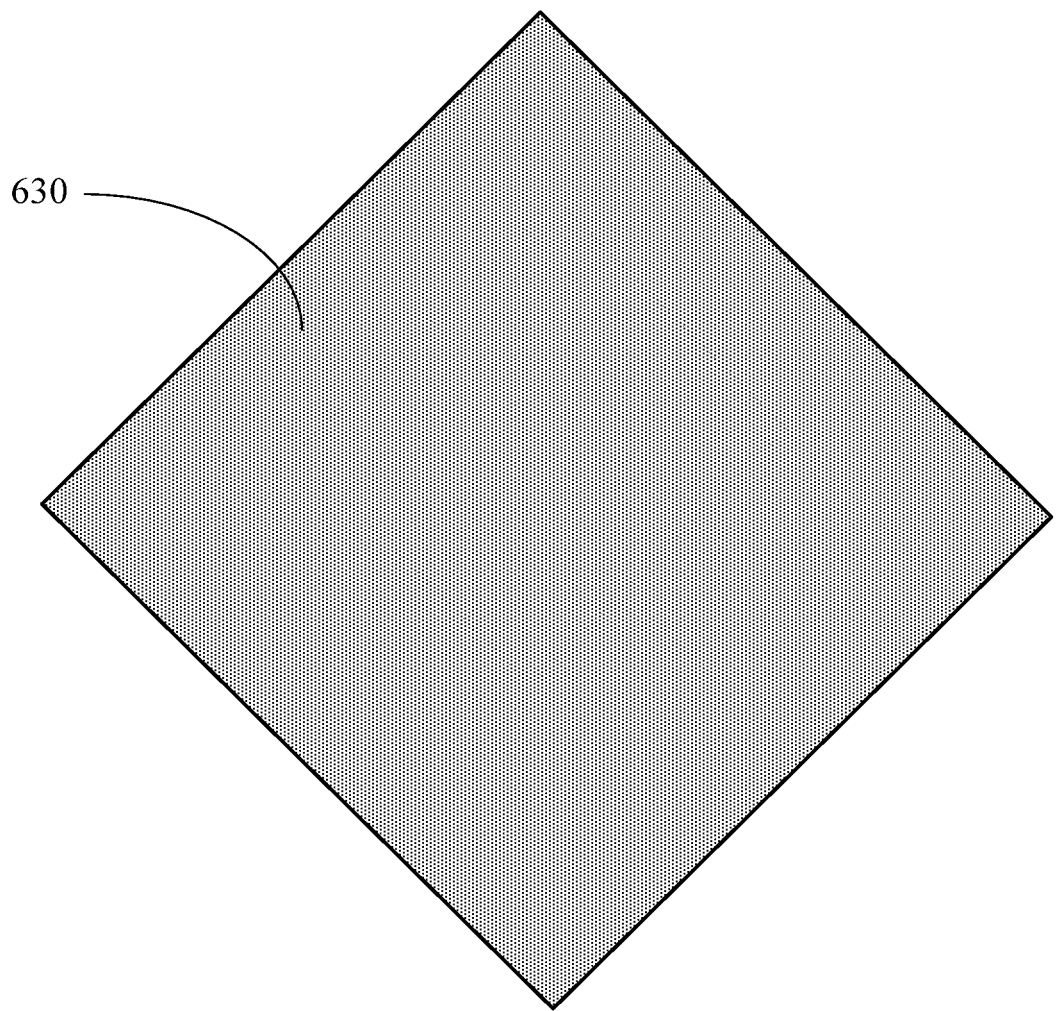
FIG. 7F is a schematic structural diagram of further light emitting functional layers in embodiments of the present disclosure.
Figure 7G:
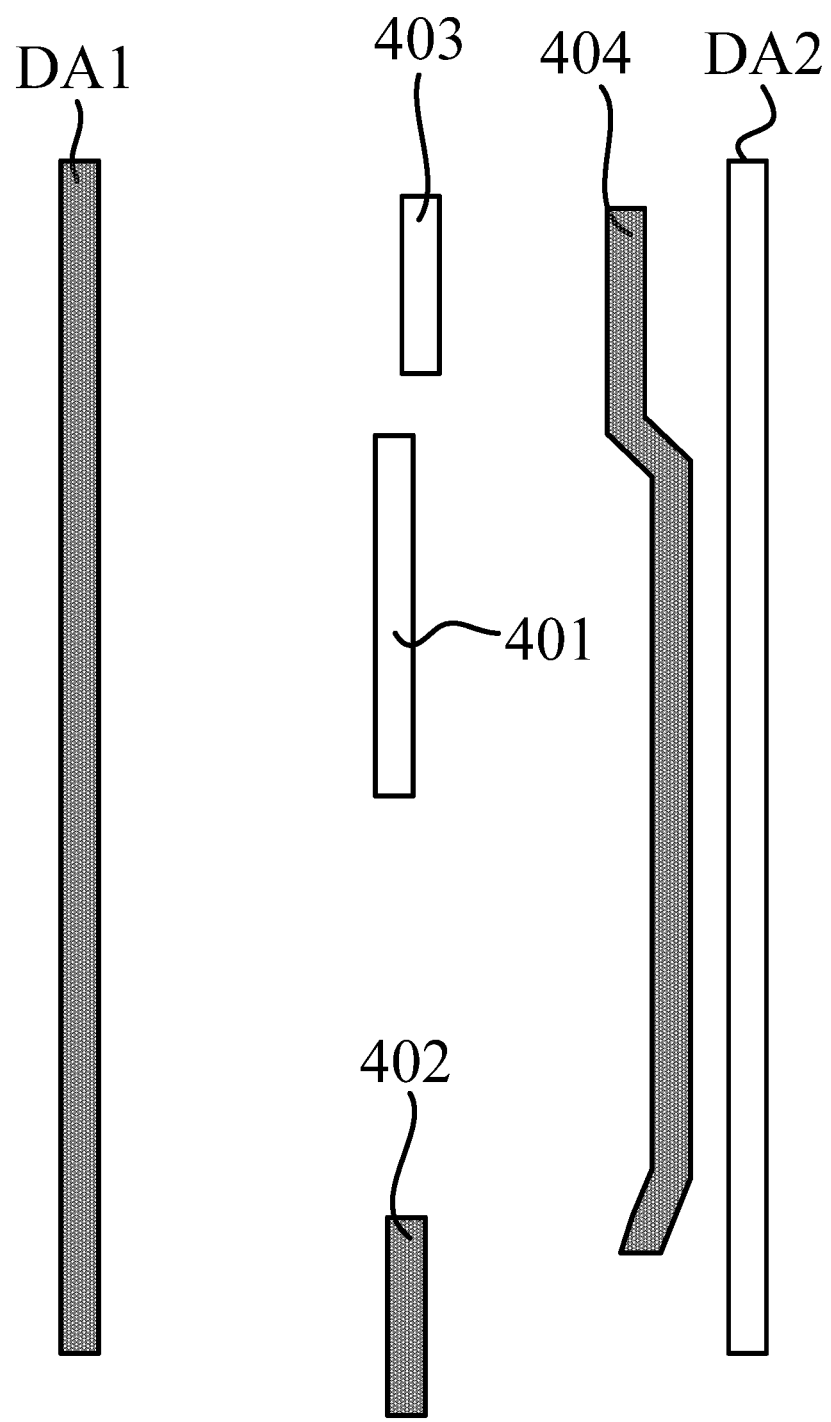
FIG. 7G is a schematic structural diagram of further first sub-conductive layers in embodiments of the present disclosure.
Figure 7H:
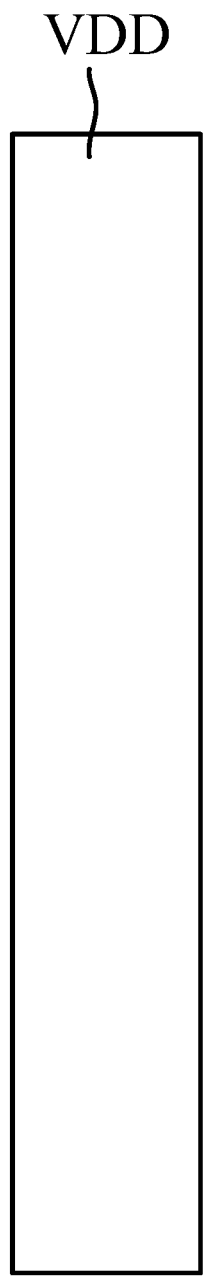
FIG. 7H is a schematic structural diagram of further second sub-conductive layers in embodiments of the present disclosure.

Of course, in practical applications, the data line pattern DA and the power supply signal line pattern VDD may also not be disposed on the same conductive layer, for example, as shown in FIGS. 7G and 7H, the first conductive layer 100 may include a first sub-conductive layer 111 and a second sub-conductive layer 112 arranged in a laminated mode with a first sub-insulating layer (not shown) disposed between the first sub-conductive layer 111 and the second sub-conductive layer 112. In some embodiments, at least one of the connection lines 401, 402, 403 and 404 is arranged on the same layer as the data line patterns (e.g. DA1, and DA2) or the power supply signal line pattern VDD. For example, the data line patterns (e.g., DA1, and DA2), and the connection lines 401, 402, and 403 may be disposed at the first sub-conductive layer 111, and the power supply signal line pattern VDD may be disposed at the second sub-conductive layer 112. That is, the data line patterns (e.g., DA1, and DA2) and the power supply signal line pattern VDD are not disposed on the same conductive layer.

In some embodiments, the first sub-conductive layer 111 where the data line patterns (e.g., DA1, and DA2) are located is closer to the base substrate 1000 than the second sub-conductive layer where the power supply signal line pattern VDD is located.

In some embodiments, the connection line 404, as a connection structure between adjacent initialization signal line patterns, may be located within the sub-pixels or may be located in the non-display region. For example, the connection line 404 connects the first initialization signal line pattern VINT1 and the second initialization signal line pattern VINT2.

In more detail, with continued reference to FIGS. 3, and 5A to 5I to 7D, the gate 201g of the first transistor T1 overlaps a first channel region 101pg, the source S1 of the first transistor T1 is located at a first source formation region 101ps, and the drain D1 of the first transistor T1 is located at a first drain formation region 101pd.

The gate 202g of the second transistor T2 overlaps a second channel region 102pg, the source S2 of the second transistor T2 is located at a second source formation region 102ps, and the drain D2 of the second transistor T2 is located at a second drain formation region 102pd.

The gate 203g of the third transistor T3 overlaps a third channel region 103pg, the source S3 of the third transistor T3 is located at a third source formation region 103ps, and the drain D3 of the third transistor T3 is located at a third drain formation region 103pd.

The gate 204g of the data write transistor T4 overlaps a fourth channel region 104pg, the source S4 of the data write transistor T4 is located at a fourth source formation region 104ps, and the drain D4 of the data write transistor T4 is located at a fourth drain formation region 104pd.

The gate 205g of the fifth transistor T5 overlaps a fifth channel region 105pg, the source S5 of the fifth transistor T5 is located at a fifth source formation region 105ps, and the drain D5 of the fifth transistor T5 is located at a fifth drain formation region 105pd.

The gate 206g of the sixth transistor T6 overlaps a sixth channel region 106pg, the source S6 of the sixth transistor T6 is located at a sixth source formation region 106ps, and the drain D6 of the sixth transistor T6 is located at a sixth drain formation region 106pd.

The gate 207g of the seventh transistor T7 overlaps a seventh channel region 107pg, the source S7 of the seventh transistor T7 is located at a seventh source formation region 107ps, and the drain D7 of the seventh transistor T7 is located at a seventh drain formation region 107pd.

The gate 203g of the third transistor T3 is multiplexed into the first plate Cst1 of the first capacitor Cst and the second plate Cst2 of the first capacitor Cst is coupled to the power supply signal line pattern VDD.

Optionally, a capacitance-conductive portion includes an auxiliary conductive portion WD, which may include the second plate C12 of the second capacitor C1, i.e., the auxiliary conductive portion may partly or wholly act as the second plate C12 of the second capacitor C1. For example: within the same sub-pixel, the auxiliary conductive portion WD acts as the second plate C12 of the second capacitor C1, and the data line pattern DA acts as the first plate C11 of the second capacitor C1; alternatively, the data line pattern DA overlapping the second plate C12 of the second capacitor C1 is used as the first plate C11 of the second capacitor C1.

As shown in FIGS. 5A to 5I, 6E, and 7E, the first electrode layer 500 is used to form first electrodes (e.g., 510, 520, 530, and 540) of the light emitting element L. In some embodiments, the first electrodes are the anodes (e.g. 510, 520, 530, and 540) of the light emitting element L. It is noted that the pixel defining layer 950 includes a plurality of opening regions (e.g., KK1, KK2, KK3, and KK4). One first electrode corresponds to one opening region, and an orthogonal projection of the opening region on the base substrate 1000 is located within an orthogonal projection of the corresponding first electrode on the base substrate 1000. For example, an opening region KK1 corresponds to a first electrode 510, an opening region KK2 corresponds to a first electrode 520, an opening region KK3 corresponds to a first electrode 530, and an opening region KK4 corresponds to a first electrode 540. In some embodiments, the first electrodes may be directly electrically connected with the semiconductor layer; alternatively, the first electrodes may also be electrically connected with the semiconductor layer through other conductive layers, for example, the first conductive layer 100.

As shown in FIGS. 5A to 5I, 6F, and 7F, the light emitting functional layer 600 is used to form a light emitting layer of the light emitting element L. For example, a first color light emitting layer 610, a second color light emitting layer 620, a third color light emitting layer 630, and a fourth color light emitting layer 640. Further, the light emitting functional layer 600 may further include film layers such as a hole injection layer, a hole transport layer, the light emitting layer, an electron transport layer, and an electron injection layer. The boundaries of the first color light emitting layer 610, the second color light emitting layer 620, the third color light emitting layer 630, and the fourth color light emitting layer 640 may or may not overlap. For example, there is an overlapping region of at least two of the first color light emitting layer 610, the second color light emitting layer 620, the third color light emitting layer 630, and the fourth color light emitting layer 640, e.g., the boundary of the first color light emitting layer 610 extends into the second color light emitting layer 620.

As shown in FIG. 2, in some embodiments, the encapsulation layer FB may include at least one or more layers of FB1, FB2, and FB3, wherein at least one layer of FB1, FB2, and FB3 is an inorganic, organic or organic-inorganic composite material, the inorganic material may be selected as at least one of silicon nitride (SiNx), silicon oxide (SiOX), silicon oxynitride (SiON) or the like, and the organic material may be polyimide (PI) or the like. For example: the encapsulation layer FB may include a first inorganic encapsulation layer FB1, an organic encapsulation layer FB2, and a second inorganic encapsulation layer FB3 disposed on top of each other. The organic encapsulation layer FB2 is located inside the blocking dam 110 and covers the display region AA. The first inorganic encapsulation layer FB1 and the second inorganic encapsulation layer FB3 cover the display region AA, the blocking dam 110 and a peripheral region of the blocking dam 110. An orthogonal projection of the first inorganic encapsulation layer FB1 on the base substrate 1000 overlaps with an orthogonal projection of the second inorganic encapsulation layer FB3 on the base substrate 1000. By extending the first inorganic encapsulation layer FB1 and the second inorganic encapsulation layer FB3 to the peripheral region of the blocking dam 110, a better water and oxygen barrier may be provided to the organic encapsulation layer FB and the display region.

As shown in FIGS. 2, 6G, 8A, and 8B, the touch electrodes 800 may include a plurality of first touch electrodes 810 and a plurality of second touch electrodes 820 arranged in a crossing mode such that an orthogonal projection of the touch electrodes 800 on the base substrate 1000 is shaped as a grid. In some embodiments, the orthogonal projection of the touch electrodes 800 on the base substrate 1000 does not overlap the orthogonal projection of the opening regions (e.g. KK1, KK2, KK3, and KK4) on the base substrate 1000. It will be appreciated that in the display panel, the touch electrodes 800 may be at least one of the plurality of first touch electrodes 810 and the second touch electrodes 820, for example: in a local display region of the display panel. For example: the touch electrodes only include the plurality of first touch electrodes 810 or the plurality of second touch electrodes 820 in sub-pixel regions at least partially corresponding to the first color, the second color, the third color and the fourth color.

In some embodiments, the plurality of first touch electrodes 810 are disposed on the same conductive film layer and the plurality of second touch electrodes 820 are disposed on the same conductive film layer. Also, a layer where the first touch electrodes 810 are located is located on a side of the encapsulation layer FB facing away from the base substrate 1000, and a layer where the second touch electrodes 820 are located is located on a side of the layer where the first touch electrodes 810 are located facing away from the base substrate 1000. An electrode insulating layer 830 is disposed between the layer where the first touch electrodes 810 are located and the layer where the second touch electrodes 820 are located. In some embodiments, the electrode insulating layer 830 may be located at and cover the display region. Alternatively, the electrode insulating layer 830 may cover not only the display region but also the non-display region. Alternatively, an edge of the electrode insulating layer 830 is located between two blocking dams BK. Of course, in practical applications, the design may be made in accordance with the practical applications, without limitation herein.

In some embodiments, one or more insulating layers (not shown) may also be disposed between the first touch electrodes 810 and the encapsulation layer FB. At least one of the insulating layers may be inorganic, organic, or organic-inorganic composite materials, the inorganic material may be selected as at least one of silicon nitride (SiNx), silicon oxide (SiOX), silicon oxynitride (SiON), or the like, and the organic material may be polyimide (PI), or the like. For example: between the first touch electrodes 810 and the encapsulation layer FB3, there is provided at least one touch electrode substrate with a material being silicon nitride (SiNx) or silicon oxide (SiOX) or polyimide (PI).

In some embodiments, the touch electrode substrate may be located at and cover the display region. Alternatively, the electrode insulating layer 830 may cover not only the display region but also the non-display region. Alternatively, the edge of the touch electrode substrate is located between two blocking dams BK. Of course, in practical applications, the design may be made in accordance with the practical applications, without limitation herein.

Figure 8A:
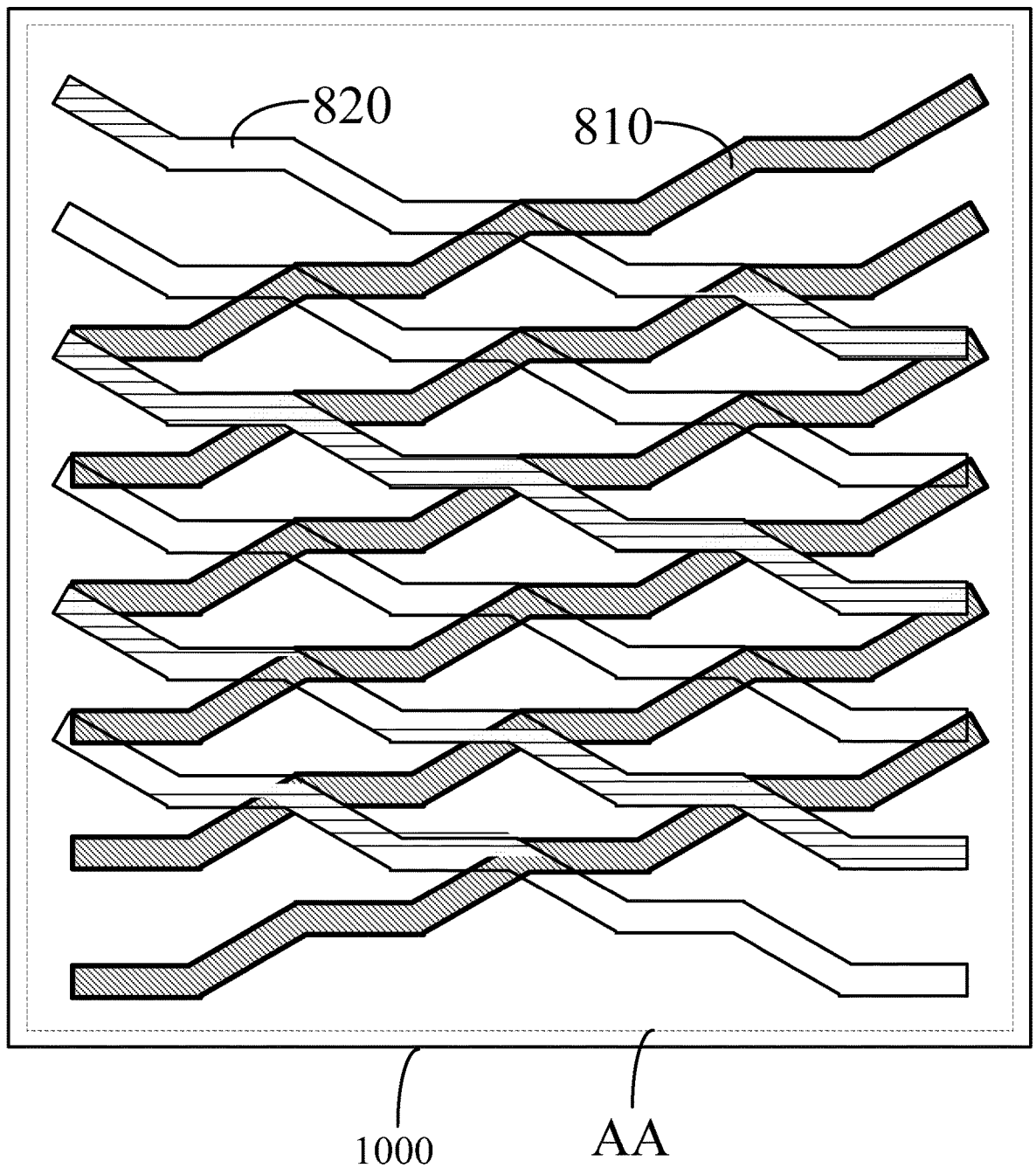
FIG. 8A is a schematic structural diagram of some touch electrodes in embodiments of the present disclosure.
Figure 8B:
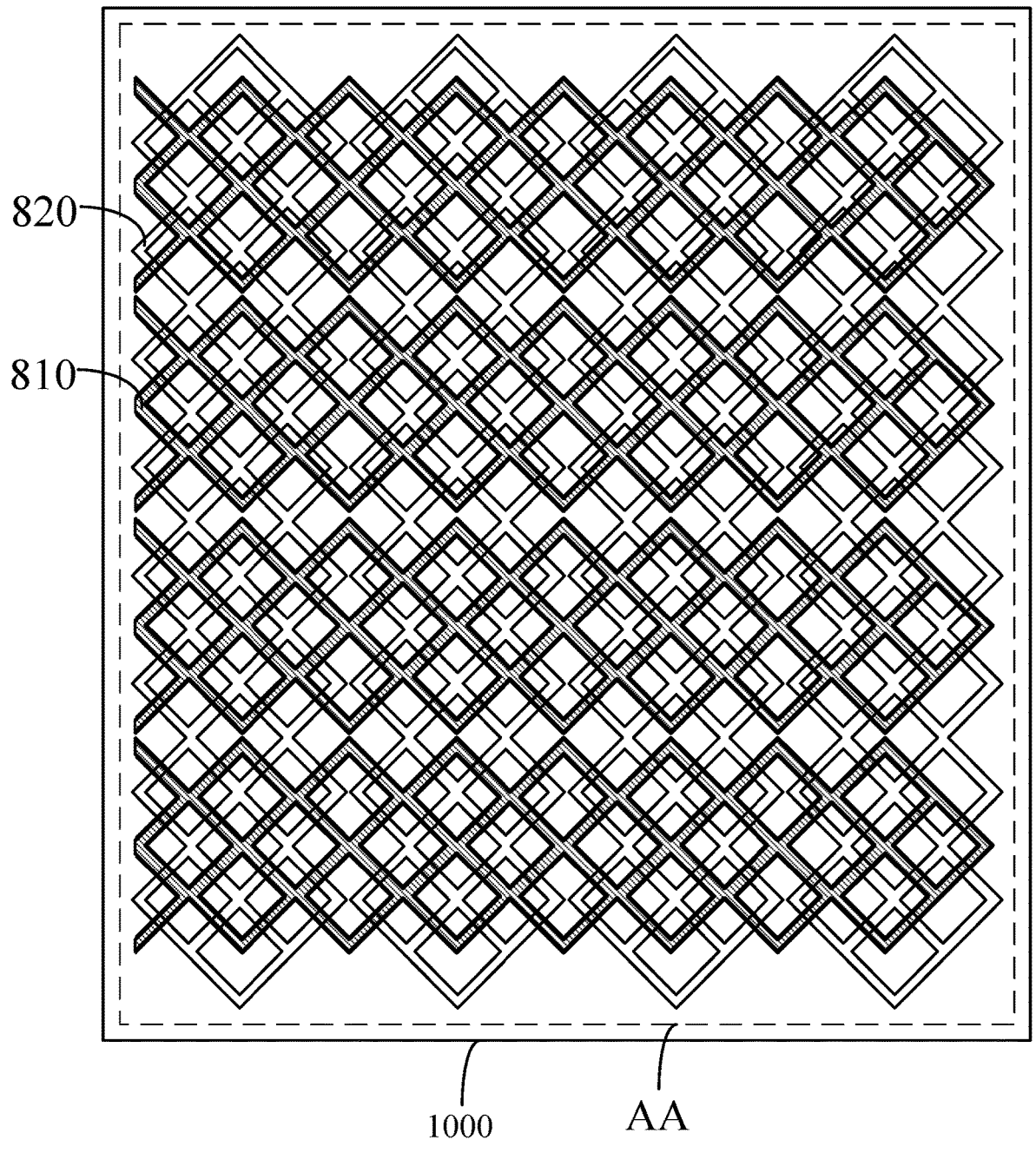
FIG. 8B is a schematic structural diagram of further touch electrodes in embodiments of the present disclosure.

In some embodiments, as shown in FIG. 8A, the shape of the orthogonal projection of the first touch electrodes 810 on the base substrate 1000 and the orthogonal projection of the second touch electrodes 820 on the base substrate 1000 may be a strip. Since the first touch electrodes 810 and the second touch electrodes 820 are arranged in the crossing mode, a grid shape may be formed by the orthogonal projection of the first touch electrodes 810 on the base substrate 1000 and the orthogonal projection of the second touch electrodes 820 on the base substrate 1000. Alternatively, as shown in FIG. 8B, the shape of the orthogonal projection of the first touch electrodes 810 on the base substrate 1000 and an orthogonal projection of part of a structure of at least one of the second touch electrodes 820 on the base substrate 1000 may also be a grid.

In some embodiments, the first touch electrodes 810 and the second touch electrodes 820 are arranged in the crossing mode, and the orthogonal projection of the first touch electrodes 810 on the base substrate 1000 and the orthogonal projection of the second touch electrodes 820 on the base substrate 1000 form a grid shape. Alternatively, at least some of the first touch electrodes 810 and the second touch electrodes 820 are disposed in an overlapping mode, and the orthogonal projection of the first touch electrodes 810 on the base substrate 1000 and the orthogonal projection of the second touch electrodes 820 on the base substrate 1000 overlap.

Of course, the present disclosure includes, but is not limited to, this. In practical applications, the design may be made according to the requirements of the practical applications, and is not limited herein. The second touch electrodes 820 shown in FIG. 8B are described below as an example.

Figure 8C:
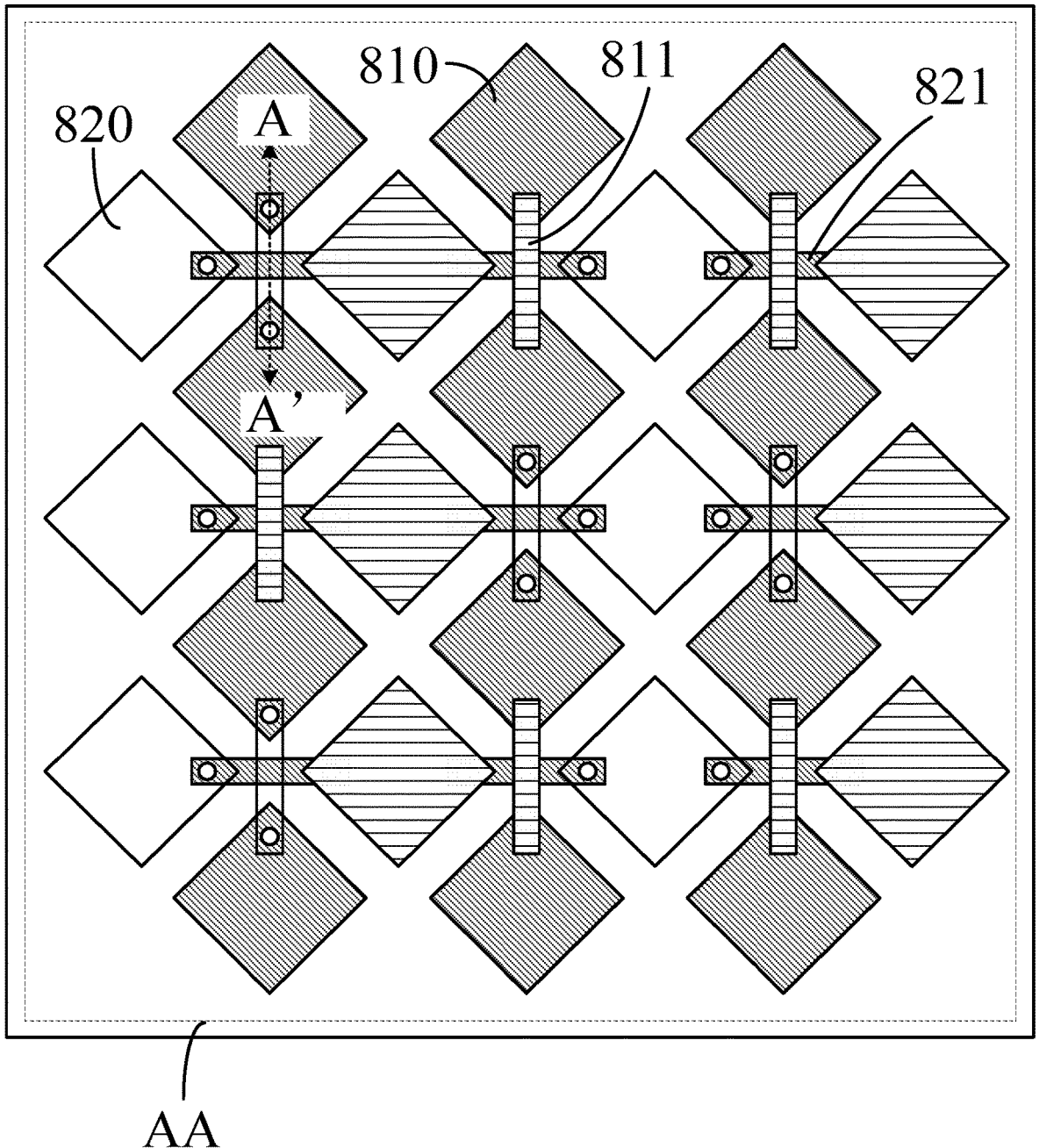
FIG. 8C is a schematic structural diagram of further touch electrodes in embodiments of the present disclosure.
Figure 8D:
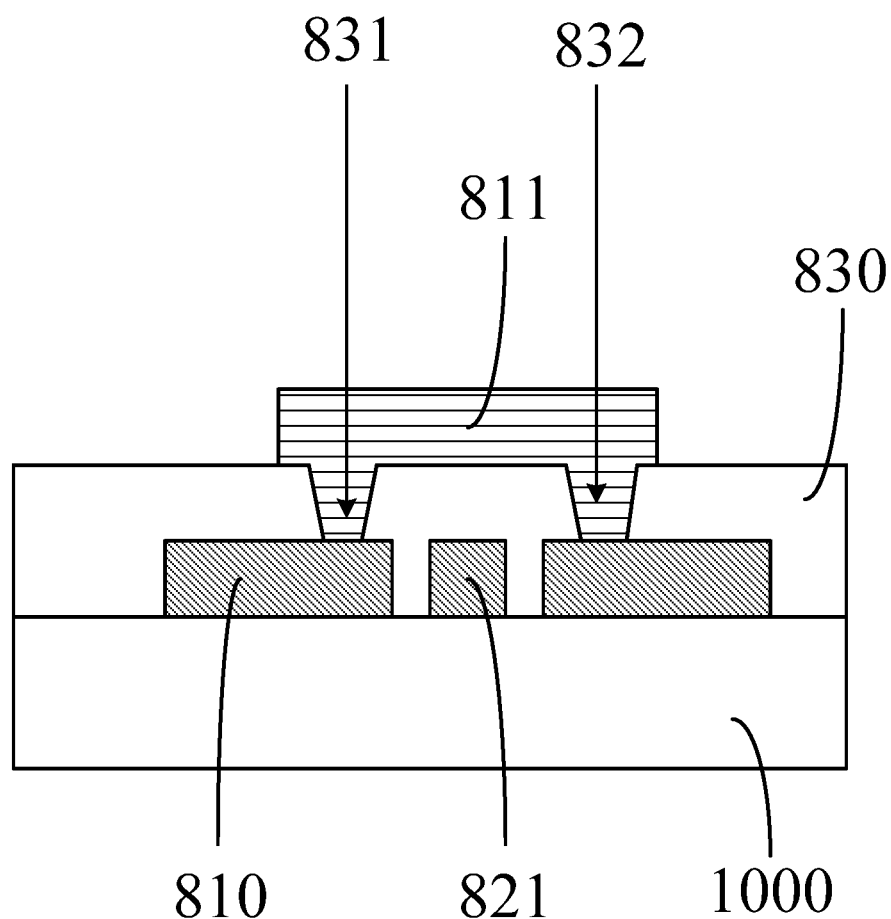
FIG. 8D is a schematic cross-sectional view of the touch electrodes shown in FIG. 8C in a direction AA'.

In some embodiments, as shown in FIGS. 8C and 8D, the first touch electrodes 810 may be electrically connected through a first bridge 811. A first end of the first bridge 811 may be electrically connected to one of the first touch electrodes 810 through a through hole 831 penetrating through the electrode insulating layer 830, and a second end of the first bridge 811 may be electrically connected to the other first touch electrode 810 through a through hole 832 penetrating through the electrode insulating layer 830. Similarly, as shown in FIGS. 8C and 8D, the second touch electrodes 820 may be electrically connected through a second bridge 821. A first end of the second bridge 821 may be electrically connected to one of the second touch electrodes 820 through a through hole penetrating through the electrode insulating layer 830, and a second end of the second bridge 821 may be electrically connected to the other second touch electrode 820 through a through hole penetrating through the electrode insulating layer 830.

It is noted that the light emitting element may be set as an electroluminescent diode, for example, at least one of an Organic Light Emitting Diode (OLED) and a Quantum Dot Light Emitting Diode (QLED). The light emitting element may include a first electrode layer 500 (e.g., the anode of the light emitting element), the light emitting functional layer 600, and the second electrode 700 (e.g., a cathode of the light emitting element) arranged in a laminated mode. Of course, the present disclosure includes, but is not limited to, this. In practical applications, the design may be made according to the requirements of the practical applications, and is not limited herein.

In practical applications, materials of the third conductive layer 300, the second conductive layer 200, the first conductive layer 100, the second touch electrodes 820, and the first touch electrodes 810 may or may not be the same. At least one of the third conductive layer 300, the second conductive layer 200, the first conductive layer 100, the second touch electrodes 820, and the first touch electrodes 810 includes a metal material or an alloy material or other conductive materials, such as at least one of metallic aluminum (AL), titanium (Ti), molybdenum (Mo), molybdenum niobium alloy, aluminum neodymium alloy, graphene, and the like.

Optionally, at least one of the third conductive layer 300, the second conductive layer 200, the first conductive layer 100, the second touch electrodes 820, and the first touch electrodes 810 may form a single layer structure, or a laminated structure obtained from sub-layers formed by molybdenum/aluminum/molybdenum, and titanium/aluminum/titanium.

Optionally, at least one of the third conductive layer 300, the second conductive layer 200, the first conductive layer 100, the second touch electrodes 820, and the first touch electrodes 810 has a thickness ranging from 100 nm to 500 nm.

In some embodiments: the third conductive layer 300, the second conductive layer 200, and the first conductive layer 100 may be selected from at least one of metallic aluminum (AL), titanium (Ti), molybdenum (Mo), etc.; alternatively, at least one of the second touch electrodes 820 and the first touch electrodes 810 is a laminated junction obtained from sub-layers formed by titanium/aluminum/titanium; alternatively, the material of at least one of the second touch electrodes 820 and the first touch electrodes 810 includes graphene. Since the surface reflectivity of the conductive layers is high, for example: the surface reflectivity of a molybdenum metal material is high, and the second capacitor C1 is likely to reflect external ambient light or light emitted by the light emitting functional layer 600 into the adjacent opening regions, thereby causing light emitting crosstalk or a poor light mixing effect.

In view of this, an embodiment of the present disclosure provides some display panels including a plurality of repeating units as shown in FIGS. 5A to 5I to 7F. The repeating units may include a plurality of sub-pixels, for example, the plurality of sub-pixels may include first color sub-pixels, second color sub-pixels, and third color sub-pixels. That is, the repeating units may include the first color sub-pixels, the second color sub-pixels, and the third color sub-pixels. This may enable the display panels to mix light from the first color sub-pixels, the second color sub-pixels, and the third color sub-pixels to achieve color display. In some embodiments, first, second, and third colors may be selected from red, green, and blue. For example, the second color is red, the first color is green, and the third color is blue. Of course, the embodiment of the present disclosure includes, but is not limited to, this. The first, second, and third colors described above may also be other colors.

Optionally, the repeating units may also include fourth color sub-pixels. This may enable the display panels to mix light from the first color sub-pixels, the second color sub-pixels, the third color sub-pixels, and the fourth color sub-pixels to achieve color display. In some embodiments, the fourth color sub-pixels may be green sub-pixels, or may be white sub-pixels, or may be yellow sub-pixels, or other colors, which is not limited herein.

The following is described taking an example that the repeating units include the first color sub-pixels, the second color sub-pixels, the third color sub-pixels, and the fourth color sub-pixels, the first and fourth colors are green, the second color is red, and the third color is blue.

In some embodiments, as shown in FIGS. 5A to 5I to 7F, the first color sub-pixels have the pixel circuits of any of the above embodiments, first electrodes 510, first color light emitting layers 610, and the opening regions KK1. An orthogonal projection of the first color light emitting layers 610 on the base substrate 1000 covers an orthogonal projection of the opening regions KK1 in the first color sub-pixels on the base substrate 1000, and light emitting regions of the first color sub-pixels include the opening regions KK1. In some embodiments, the opening regions KK1 may serve as the light emitting regions of the first color sub-pixels.

The second color sub-pixels include the pixel circuits of any of the above embodiments, first electrodes 520, second color light emitting layers 620, and the opening regions KK2. An orthogonal projection of the second color light emitting layers 620 on the base substrate 1000 covers an orthogonal projection of the opening regions KK2 in the second color sub-pixels on the base substrate 1000, and light emitting regions of the second color sub-pixels include the opening regions KK2. In some embodiments, the opening regions KK2 may serve as the light emitting regions of the second color sub-pixels.

The third color sub-pixels include the pixel circuit of any of the above embodiments, first electrodes 530, third color light emitting layers 630, and the opening regions KK3. An orthogonal projection of the third color light emitting layer 630 on the base substrate 1000 covers an orthogonal projection of the opening regions KK3 in the third color sub-pixels on the base substrate 1000, and light emitting regions of the third color sub-pixels include the opening regions KK3. In some embodiments, the opening regions KK3 may serve as the light emitting regions of the third color sub-pixels.

The fourth color sub-pixels include the pixel circuit of any of the above embodiments, first electrodes 540, fourth color light emitting layers 640, and the opening regions KK4. An orthogonal projection of the fourth color light emitting layers 640 on the base substrate 1000 covers an orthogonal projection of the opening regions KK4 in the fourth color sub-pixels on the base substrate 1000, and light emitting regions of the fourth color sub-pixels include the opening regions KK4. In some embodiments, the opening regions KK4 may serve as the light emitting regions of the fourth color sub-pixels.

The area of the opening regions KK1 in the first color sub-pixels is smaller than the area of the opening regions KK3 in the third color sub-pixels. The area of the opening regions KK2 in the second color sub-pixels is smaller than the area of the opening regions KK3 in the third color sub-pixels. The area of the opening regions KK4 in the fourth color sub-pixels is smaller than the area of the opening regions KK3 in the third color sub-pixels.

In some embodiments, when the emission efficiency of green light emitting elements and red light emitting elements is higher than that of blue light emitting elements, the influence on the adjacent sub-pixels is large, and thus the area of the opening regions of the green sub-pixels may be made smaller than the area of the opening regions of the blue sub-pixels, and the area of the opening regions of the red sub-pixels may be made smaller than the area of the opening regions of the blue sub-pixels, so that emission of blue light may be increased. In addition, this also results in that the second capacitors C1 of the green sub-pixels and the red sub-pixels have a larger portion that is not shielded by the opening regions, resulting in a larger exposure of the second capacitors C1, further resulting in problems of light emitting interference and poor light mixing effect.

In some embodiments of the present disclosure, as shown in FIGS. 3 to 6G, the transistor array layer includes a plurality of capacitance-conductive portions R, and at least a portion of the sub-pixels includes the capacitance-conductive portions R. There is an overlapping region between the capacitance-conductive portions R and the power supply signal line pattern VDD and/or the data line pattern in the same sub-pixel. For example, there is an overlapping region between the capacitance-conductive portions R and the power supply signal line pattern VDD and the data line pattern in the same sub-pixel. Alternatively, there is an overlapping region between the capacitance-conductive portions R and the power supply signal line pattern VDD in the same sub-pixel. Alternatively, there is an overlapping region between the capacitance-conductive portions R and the data line pattern in the same sub-pixel. Optionally, an overlap area of the capacitance-conductive portions R with the power supply signal line pattern VDD is greater than an overlap area of the capacitance-conductive portions R with the data line pattern DA.

In some embodiments of the present disclosure, as shown in FIGS. 3 to 6G, an orthogonal projection of the capacitance-conductive portions R in the first color sub-pixels on the base substrate 1000 has a first auxiliary overlap area S1 with the orthogonal projection of the touch electrodes (e.g., the second touch electrodes 820) on the base substrate 1000. An orthogonal projection of the capacitance-conductive portions R in the second color sub-pixels on the base substrate 1000 has a second auxiliary overlap area S2 with the orthogonal projection of the touch electrodes (e.g., the second touch electrodes 820) on the base substrate 1000. An orthogonal projection of the capacitance-conductive portions R in the third color sub-pixels on the base substrate 1000 has a third auxiliary overlap area S3 with the orthogonal projection of the touch electrodes (e.g., the second touch electrodes 820) on the base substrate 1000. An orthogonal projection of the capacitance-conductive portions R in the fourth color sub-pixels on the base substrate 1000 has a fourth auxiliary overlap area S4 with the orthogonal projection of the touch electrodes (e.g., the second touch electrodes 820) on the base substrate 1000. At least one of the first auxiliary overlap area S1, the second auxiliary overlap area S2 and the fourth auxiliary overlap area S4 is larger than the third auxiliary overlap area S3. For example: the first auxiliary overlap area S1 is larger than the second auxiliary overlap area S2, and the second auxiliary overlap area S2 is larger than the third auxiliary overlap area S3; or the first auxiliary overlap area S1 is larger than the second auxiliary overlap area S2 and the second auxiliary overlap area S2 is equal to the third auxiliary overlap area S3; or the first auxiliary overlap area S1 is substantially equal to the second auxiliary overlap area S2, and the second auxiliary overlap area S2 is larger than the third auxiliary overlap area S3. In this way, the second capacitors C1 may be shielded by the touch electrodes 800, which may relieve the problems of light emitting interference and poor light mixing effect caused by the second capacitors C1.

In some embodiments, as shown in FIGS. 3 to 6G, the transistor array layer ZA includes a plurality of data line patterns (e.g., DA1, and DA2) and a plurality of power supply signal line patterns (e.g., VDD). The transistor array layer ZA includes a plurality of capacitance-conductive portions R, the sub-pixels include the capacitance-conductive portions R, and the capacitance-conductive portions R have overlapping regions with the power supply signal line patterns VDD and/or the data line patterns DA. For example, the plurality of capacitance-conductive portions R are formed in the second conductive layer 200. Of course, they may also be formed in other conductive layers, such as the first conductive layer.

Optionally, at least a part of the capacitance-conductive portions R forms a capacitor with the power supply signal line patterns VDD or the data line patterns DA, i.e., there is at least one insulating layer between the capacitance-conductive portions R and the power supply signal line patterns VDD or the data line patterns DA. For example: the capacitance-conductive portions R form one capacitive plate of the second capacitor C1. Optionally, part or all of the capacitance-conductive portions form the first plate C11 or the second plate C12 of the second capacitor.

Optionally, the capacitance-conductive portions R may be arc or irregular patterns.

Optionally, the capacitance-conductive portions R include auxiliary conductive portions WD formed in the second conductive layer 200, the auxiliary conductive portions WD are located below the data line patterns (e.g., DA1, and DA2), and a first end of each auxiliary conductive portion WD is connected to the power supply signal line patterns VDD. For example: the first ends of the auxiliary conductive portions WD are connected to the power supply signal line patterns VDD by a through hole of the first interlayer insulating layer 930. A second end of each auxiliary conductive portion WD extends below the data line patterns, and the auxiliary conductive portions WD have overlapping regions with the power supply signal line patterns and/or the data line patterns, that is, at the moment, the second plate C12 of the second capacitor C1 is formed on the auxiliary conductive portions WD and the first plate of the second capacitor C1 is formed on the corresponding sub-pixel data line patterns DA (e.g., DA1, and DA2); or the first plate of the second capacitor C1 is formed on the corresponding sub-pixel data line patterns DA (e.g., DA1, and DA2) having overlapping regions with the auxiliary conductive portions WD.

Optionally, the capacitance-conductive portions R may further include second auxiliary conductive portions WN2 (not shown), the second auxiliary conductive portions WN2 are formed in the second conductive layer 200, the second auxiliary conductive portions WN2 are located below the data line patterns (e.g., DA1, and DA2) of the corresponding sub-pixels, and first ends of the second auxiliary conductive portions are connected to the data line pattern (e.g., the data line pattern DA1) corresponding to each sub-pixel. For example: the first ends of the second auxiliary conductive portions WN2 are connected to the data line pattern (e.g., the data line pattern DA1) corresponding to each sub-pixel by a through hole of the first interlayer insulating layer 930. Second ends of the second auxiliary conductive portions WN2 extend below the power supply signal line patterns, and the second auxiliary conductive portions WN2 have overlapping regions with the power supply signal line patterns and/or the data line patterns, that is, at the moment, the first plate of the second capacitor C1 is formed on the second auxiliary conductive portions WN2 and the second plate of the second capacitor C1 is the power supply signal line pattern VDD; or the second plate of the second capacitor C1 is formed on corresponding sub-pixel power supply signal line patterns VDD having overlapping regions with the second auxiliary conductive portions WN2.

For ease of understanding, at least some of the embodiments described below are exemplified by taking the capacitance-conductive portions R as the auxiliary conductive portions WD. In some embodiments, since the area of the opening regions KK1 in the first color sub-pixels is smaller than the area of the opening regions KK3 in the third color sub-pixels, fewer parts of the capacitance-conductive portions R in the first color sub-pixels are shielded by the opening regions and more parts of the capacitance-conductive portions R in the third color sub-pixels are shielded by the opening regions, resulting in a stronger effect of light emitting of the capacitance-conductive portions R in the first color sub-pixels. The embodiments of the present disclosure can make more parts of the capacitance-conductive portions R in the first color sub-pixels shielded by the touch electrodes 800 by making the first auxiliary overlap area S1 larger than the third auxiliary overlap area S3, thereby reducing the problems of light emitting interference and poor light mixing effect caused by the capacitance-conductive portions R in the first color sub-pixels.

In some embodiments, since the area of the opening regions KK2 in the second color sub-pixels is smaller than the area of the opening regions KK3 in the third color sub-pixels, fewer parts of the capacitance-conductive portions R in the second color sub-pixels are shielded by the opening regions, and more parts of the capacitance-conductive portions R in the third color sub-pixels are shielded by the opening regions, resulting in a stronger effect of light emitting of the capacitance-conductive portions R in the second color sub-pixels. The embodiments of the present disclosure can make more parts of the capacitance-conductive portions R in the second color sub-pixels shielded by the touch electrodes 800 by making the second auxiliary overlap area S2 larger than the third auxiliary overlap area S3, thereby reducing the problems of light emitting interference and poor light mixing effect caused by the capacitance-conductive portions R in the second color sub-pixels.

In some embodiments, since the area of the opening regions KK4 in the fourth color sub-pixels is smaller than the area of the opening regions KK3 in the third color sub-pixels, fewer parts of the capacitance-conductive portions R in the fourth color sub-pixels are shielded by the opening regions, and more parts of the capacitance-conductive portions R in the third color sub-pixels are shielded by the opening regions, resulting in a stronger effect of light emitting of the capacitance-conductive portions R in the fourth color sub-pixels. The embodiments of the present disclosure can make more parts of the capacitance-conductive portions R in the fourth color sub-pixels shielded by the touch electrodes 800 by making the fourth auxiliary overlap area S4 larger than the third auxiliary overlap area S3, thereby reducing the problems of light emitting interference and poor light mixing effect caused by the capacitance-conductive portions R in the fourth color sub-pixels.

Figure 6A:
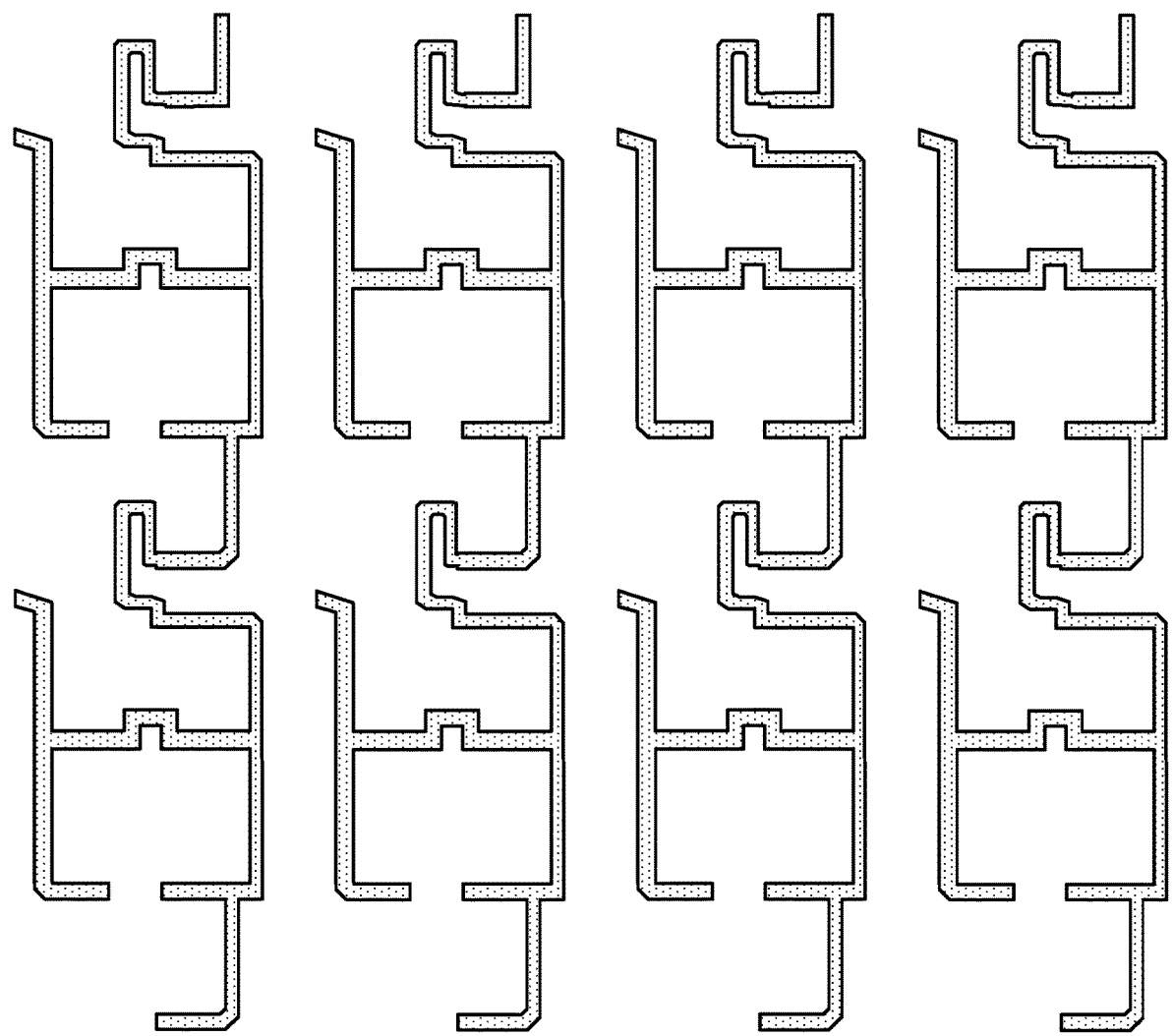
FIG. 6A is a schematic structural diagram of some semiconductor layers in embodiments of the present disclosure.
Figure 6B:
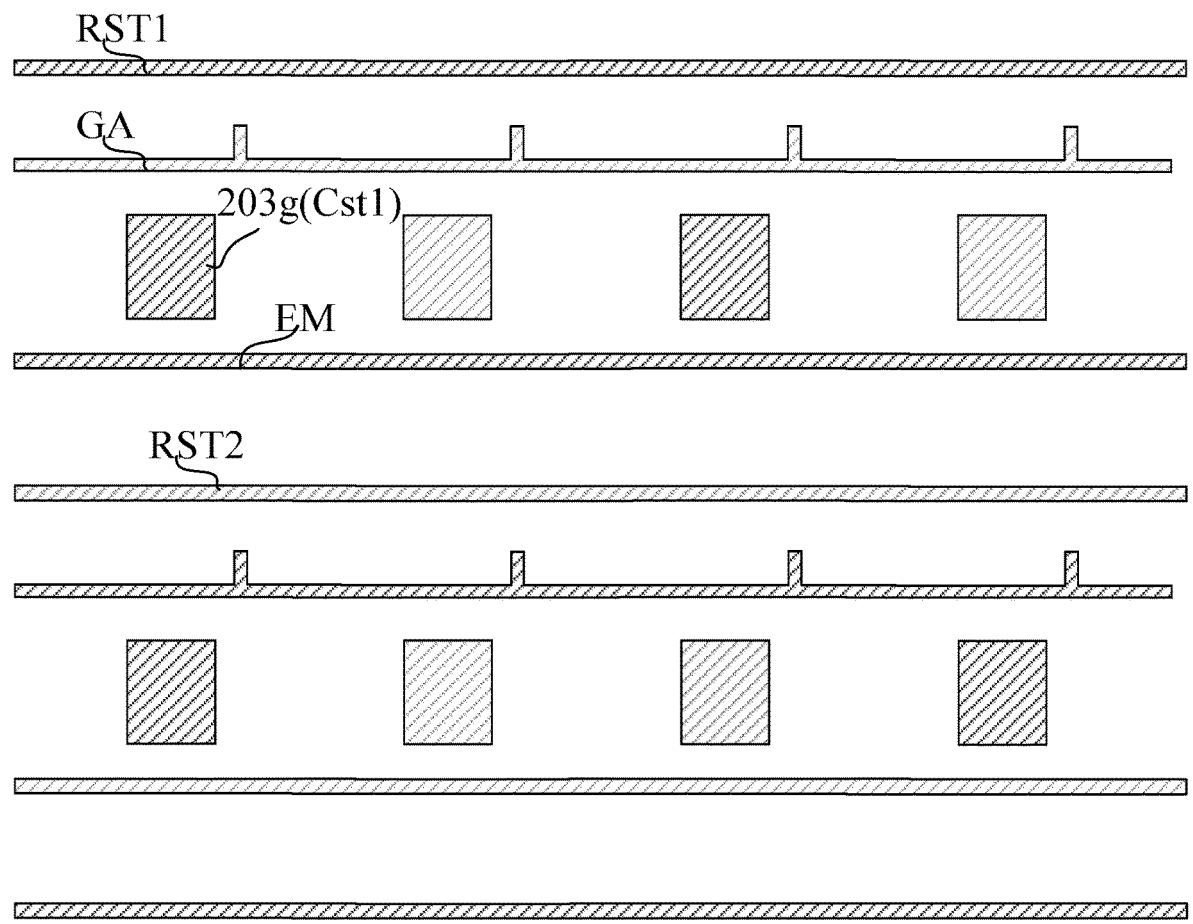
FIG. 6B is a schematic structural diagram of some third conductive layers in embodiments of the present disclosure.
Figure 6C:
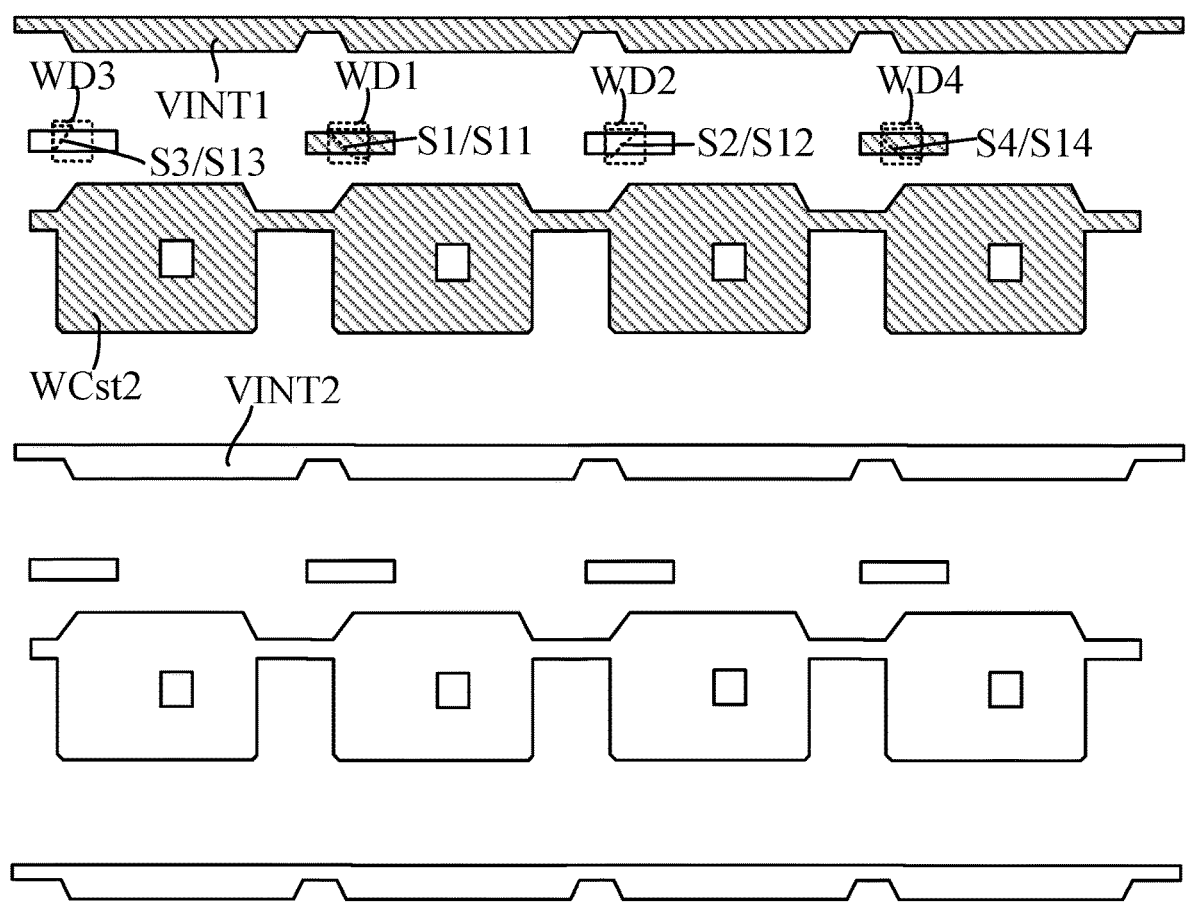
FIG. 6C is a schematic structural diagram of some second conductive layers in embodiments of the present disclosure.
Figure 6D:
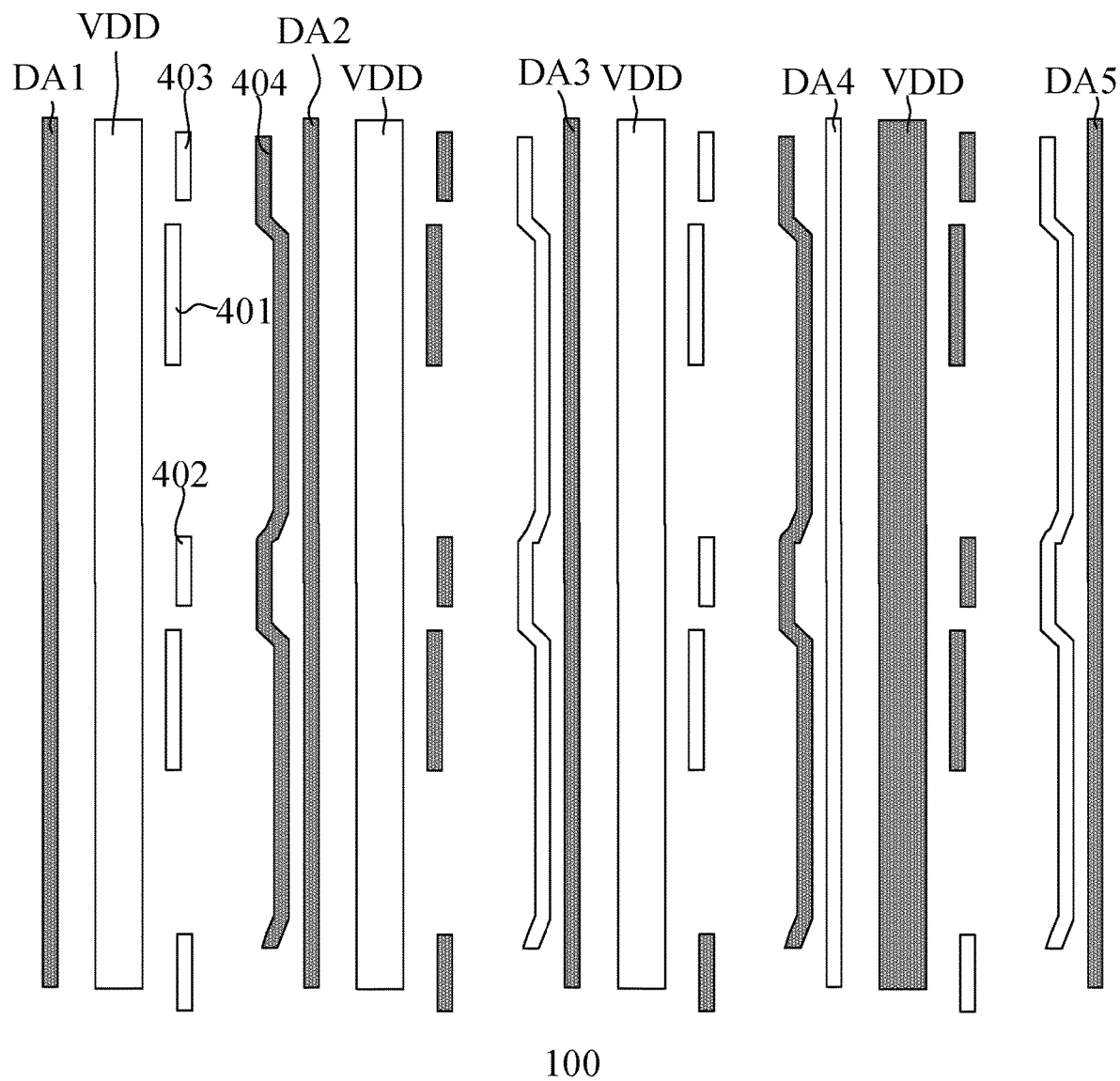
FIG. 6D is a schematic structural diagram of some first conductive layers in embodiments of the present disclosure.
Figure 6E:
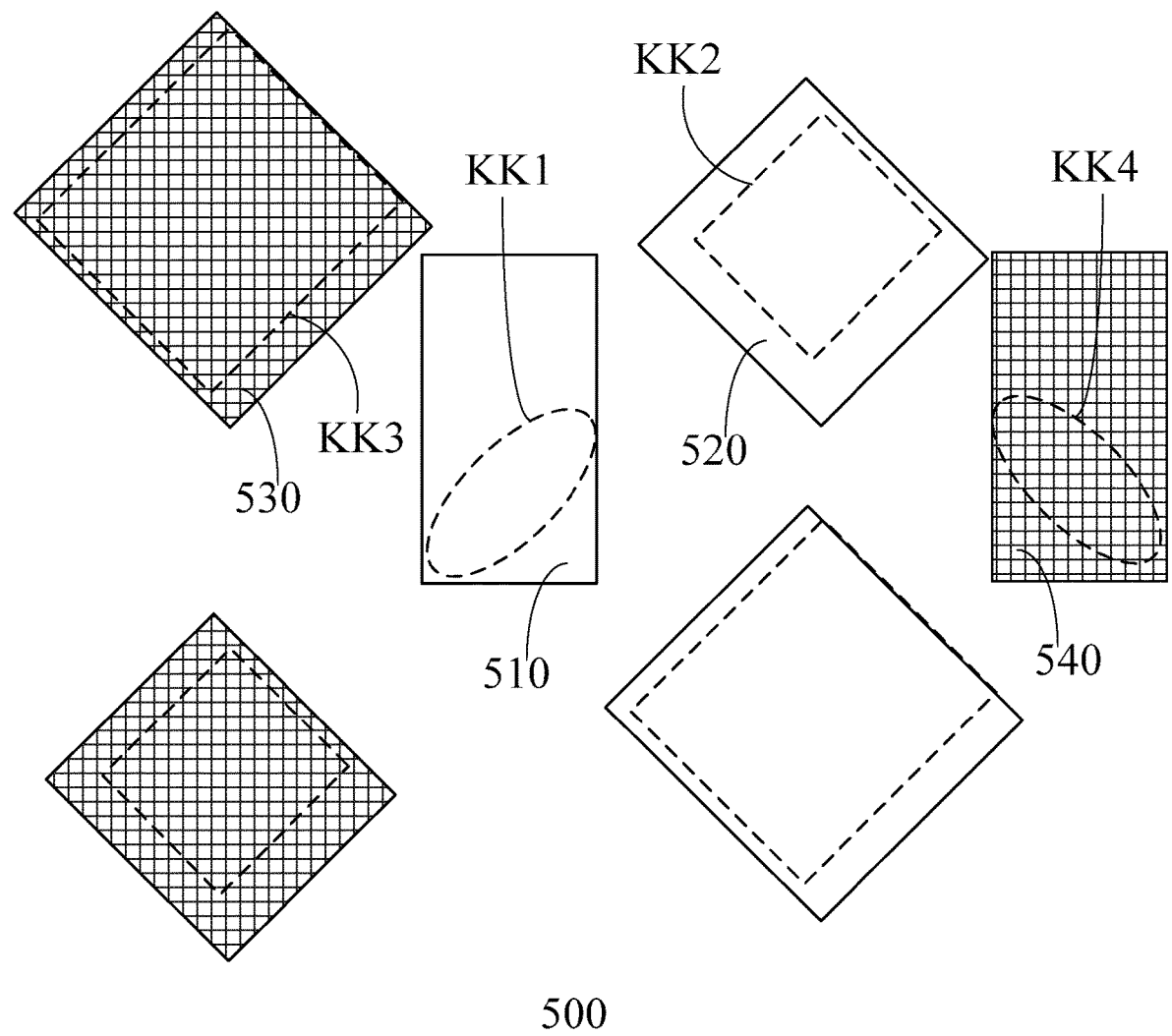
FIG. 6E is a schematic structural diagram of some first electrode layers in embodiments of the present disclosure.
Figure 6F:
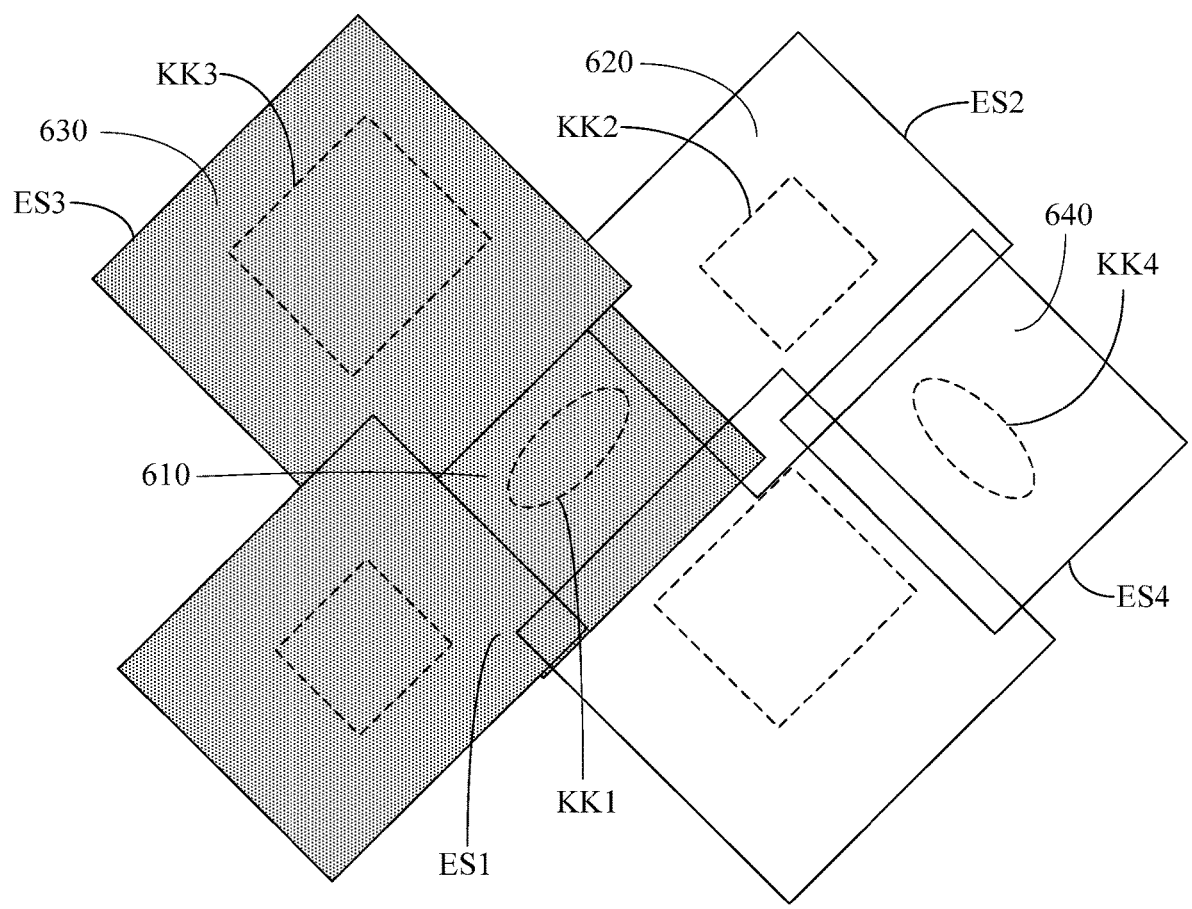
FIG. 6F is a schematic structural diagram of some light emitting functional layers in embodiments of the present disclosure.
Figure 6G:
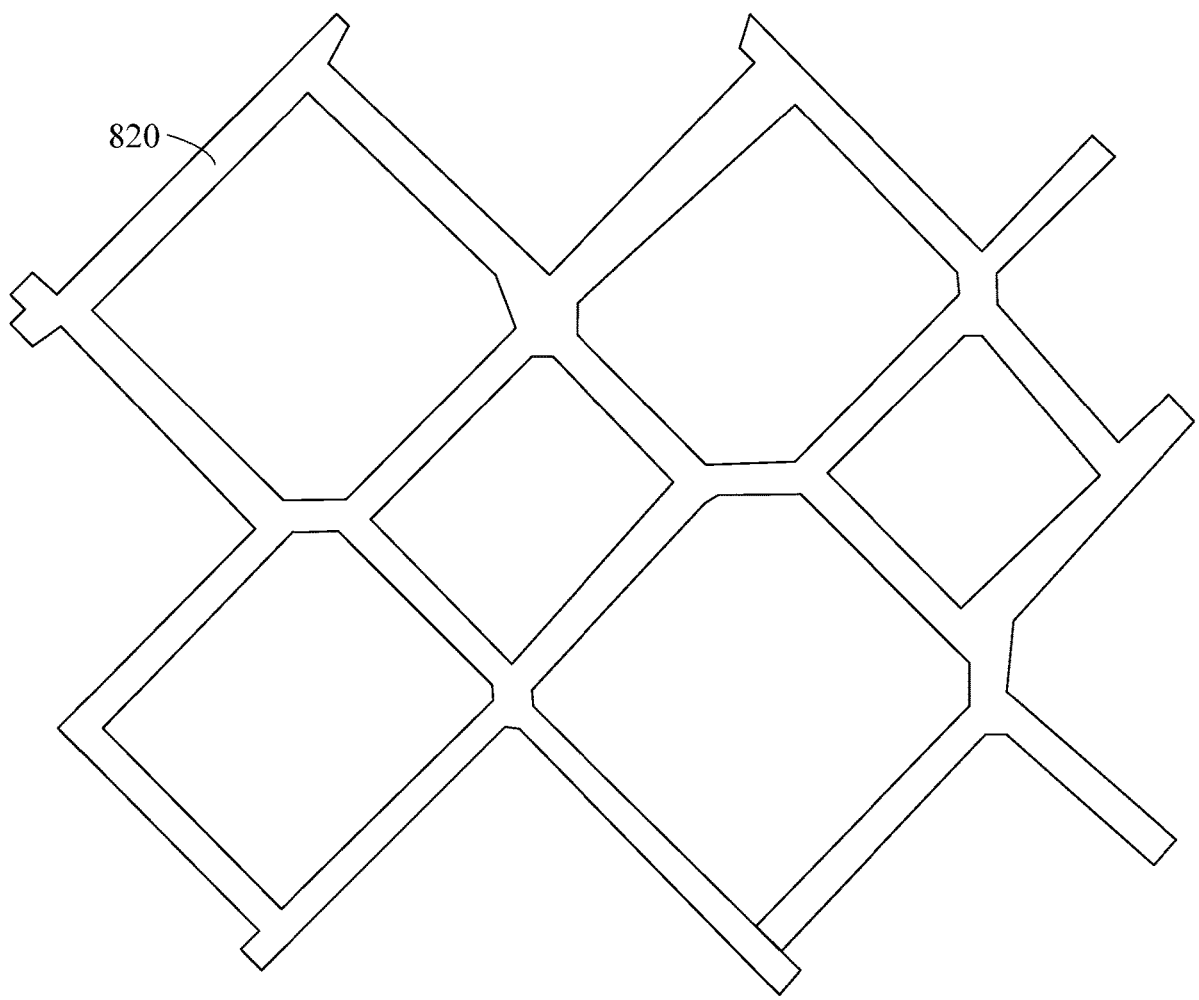
FIG. 6G is a schematic structural diagram of some second touch electrodes in embodiments of the present disclosure.

In some embodiments of the present disclosure, as shown in FIG. 6E, the area of the opening regions KK1 in the first color sub-pixels may be made smaller than the area of the opening regions KK2 in the second color sub-pixels. For example, the area of the opening regions of the green sub-pixels may be made smaller than the area of the opening regions of the red sub-pixels. Therefore, compared with the second color sub-pixels, in the first color sub-pixels, the capacitance-conductive portions R have fewer parts that are shielded by the opening regions. In the embodiment of the present disclosure, the first auxiliary overlap area S1 is made to be substantially equal to the second auxiliary overlap area S2, or the first auxiliary overlap area S1 is larger than the second auxiliary overlap area S2, so that compared with the second color sub-pixels, in the first color sub-pixels, the capacitance-conductive portions R have more parts that are shielded by the touch electrodes 800, thereby further reducing the problems of light emitting interference and poor light mixing effect caused by the capacitance-conductive portions R in the first color sub-pixels.

In some embodiments of the present disclosure, the area of the opening regions KK1 of the first color sub-pixels may be 100 μm² to 130 μm², and the shape of the opening regions KK1 is not limited, such as: a polygon, a rectangle, a square, a diamond, an oval, and a circle; of course, other irregular patterns are also possible, such as: a closed pattern consisting of at least 2 arc segments and 1 straight segment. For example, the opening regions KK1 of the first color sub-pixels are in a rectangular shape with a first side length of 12 μm to 13 μm, and a second side length of 9 μm to 10 μm. Optionally, the opening regions KK1 of the first color sub-pixels have an open area of 10*10 μm² to 12*10 μm² or 11*10 μm² to 12*10 μm². Optionally, further, the opening regions KK1 of the first color sub-pixels have an open area of 13*9 μm² to 12*10 μm². For example, the area of the opening regions KK1 of the first color sub-pixels may be 13*9 μm² (length*width), or 12*10 μm² (length*width). Of course, in practical applications, design may be determined according to the requirements of the practical application environment, and is not limited herein.

In some embodiments of the present disclosure, the area of the opening regions KK2 of the second color sub-pixels may be 120 μm² to 200 μm², and the shape of the opening regions KK2 is not limited and may be, for example: a rectangle, a square, a diamond, an oval, a circle, or the like; of course, other irregular patterns are also possible, such as: a closed pattern consisting of at least 2 arc segments and 1 straight segment. For example: the opening regions KK2 of the second color sub-pixels are square with a side length of 13 μm to 15 μm. Optionally, the opening regions KK2 of the second color sub-pixels have an open area of 13*10 μm² to 19*10 μm² or 13*15 μm² to 18*11 μm². Optionally, the open area of the opening regions KK1 of the first color sub-pixels may be 13*13 μm² to 14*14 μm². For example, the area of the opening regions KK2 of the second color sub-pixels may be 13*13 μm², or 14*14 μm². Of course, in practical applications, design may be determined according to the requirements of the practical application environment, and is not limited herein.

In some embodiments of the present disclosure, the area of the opening regions KK3 of the third color sub-pixels is 180 μm² to 230 μm², and the shape of the opening regions KK3 is not limited and may be, for example: a rectangle, a square, a diamond, an oval, a circle, or the like; of course, other irregular patterns are also possible, such as: a closed pattern consisting of at least 2 arc segments and 1 straight segment. For example, the opening regions KK3 of the third color sub-pixels are in a rectangular shape with a first side length of 15 μm to 16 μm, and a second side length of the opening regions KK3 of the third color sub-pixels is 13 μm to 14 μm. Optionally, the opening regions KK3 of the third color sub-pixels have an open area of 18*10 μm² to 23*10 μm² or 20*10 μm² to 22*10 μm². Optionally, the open area of the opening regions KK1 of the first color sub-pixels may be 15*13 μm² to 16*14 μm² (length*width). For example, the area of the opening regions KK3 of the third color sub-pixels may be 15*13 μm² (length*width) or 16*13 μm² (length*width) or 16*14 μm² (length*width). Of course, in practical applications, design may be determined according to the requirements of the practical application environment, and is not limited herein.

In some embodiments of the present disclosure, the area of the opening regions KK4 of the fourth color sub-pixels may be 100 μm² to 230 μm², and the shape of the opening regions KK4 is not limited and may be, for example: a rectangle, a square, a diamond, an oval, a circle, or the like; of course, other irregular patterns are also possible, such as: a closed pattern consisting of at least 2 arc segments and 1 straight segment. For example: the opening regions of the fourth color sub-pixels are in an oval shape, and the area may be 100 μm² to 130 μm²; alternatively, the opening regions KK4 of the fourth color sub-pixels are in a rectangular shape with a first side length of 12 μm to 13 μm, and a second side length of 9 μm to 10 μm. Optionally, the opening regions KK1 of the first color sub-pixels have an open area of 13*9 μm² to 12*10 μm². For example, the area of the opening regions KK4 of the fourth color sub-pixels may be 13*9 μm² (length*width) or 12*10 μm² (length*width). Of course, in practical applications, design may be determined according to the requirements of the practical application environment, and is not limited herein.

In some embodiments of the present disclosure, the first auxiliary overlap area S1 may be 3 μm² to 40 μm². Optionally, the first auxiliary overlap area S1 may be 6 μm² to 20 μm². For example, the first auxiliary overlap area S1 may be 3 μm², or 6 μm², or 10 μm², or 20 μm² or 30 μm². Of course, in practical applications, design may be determined according to the requirements of the practical application environment, and is not limited herein.

In some embodiments of the present disclosure, the second auxiliary overlap area S2 may be 0 to 10 μm². Optionally, the second auxiliary overlap area S2 may be 0 to 5 μm². For example, the second auxiliary overlap area S2 may be 0 μm², or 5 μm² or 10 μm². Of course, in practical applications, design may be determined according to the requirements of the practical application environment, and is not limited herein.

In some embodiments of the present disclosure, the third auxiliary overlap area S3 may be 0 to 6 μm². Optionally, the third auxiliary overlap area S3 may be 0 to 3 μm². For example, the third auxiliary overlap area S3 may be 0 μm², or 3 μm² or 6 μm². Of course, in practical applications, design may be determined according to the requirements of the practical application environment, and is not limited herein.

In some the embodiments of the present disclosure, the fourth auxiliary overlap area S4 may be 0 to 40 μm². Optionally, the fourth auxiliary overlap area S4 may be 0 to 15 μm². For example, the fourth auxiliary overlap area S4 may be 0 μm², or 5 μm² or 15 μm². Alternatively, the fourth auxiliary overlap area S4 is substantially equal to at least one of the first auxiliary overlap area S1, the second auxiliary overlap area S2, and the third auxiliary overlap area S3. Alternatively, the fourth auxiliary overlap area S4 is larger than at least one of the first auxiliary overlap area S1, the second auxiliary overlap area S2, and the third auxiliary overlap area S3. Of course, in practical applications, design may be determined according to the requirements of the practical application environment, and is not limited herein.

In some embodiments of the present disclosure, as shown in FIGS. 5A to 5I to 6G, the area of the opening regions KK1 in the first color sub-pixels may be made larger than the area of the opening regions KK4 in the fourth color sub-pixels. The area of the opening regions KK1 in the first color sub-pixels may also be substantially equal to the area of the opening regions KK4 in the fourth color sub-pixels. These may be designed and determined according to the requirements of practical applications and are not limited herein.

In some embodiments of the present disclosure, as shown in FIGS. 5A to 5I to 6G, the second conductive layer 200 may include the capacitance-conductive portions R (WD) (introduced with the auxiliary conductive portions WD as the capacitance-conductive portions R as an example), and the first auxiliary overlap area S1 may include an overlap area between an orthogonal projection of the auxiliary conductive portions in the first color sub-pixels on the base substrate 1000 and an orthogonal projection of the touch electrodes (e.g., the second touch electrodes 820) on the base substrate 1000. The second auxiliary overlap area S2 may include an overlap area between an orthogonal projection of the auxiliary conductive portions in the second color sub-pixels on the base substrate 1000 and the orthogonal projection of the touch electrodes (e.g., the second touch electrodes 820) on the base substrate 1000. The third auxiliary overlap area S3 includes an overlap area between an orthogonal projection of the auxiliary conductive portions in the third color sub-pixels on the base substrate 1000 and the orthogonal projection of the touch electrodes (e.g., the second touch electrodes 820) on the base substrate 1000. The fourth auxiliary overlap area S4 includes an overlap area between an orthogonal projection of the auxiliary conductive portions in the fourth color sub-pixels on the base substrate 1000 and the orthogonal projection of the touch electrodes (e.g., the second touch electrodes 820) on the base substrate 1000. This can block the auxiliary conductive portions by the touch electrodes (e.g., the second touch electrodes 820), which can reduce the problems of light emitting interference, and poor light mixing effect caused by light reflecting by the auxiliary conductive portions.

In some embodiments of the present disclosure, as shown in FIGS. 5A to 5I to 9C, the auxiliary conductive portions WD in the first color sub-pixels include first auxiliary exposure portions WD1, and an orthogonal projection of the first auxiliary exposure portions WD1 on the base substrate 1000 does not overlap the orthogonal projections of the data line pattern DA2 and the power supply signal line pattern VDD, respectively, on the base substrate 1000. The first auxiliary overlap area S1 includes a first auxiliary sub-overlap area S11, and the first auxiliary sub-overlap area S11 is located between the orthogonal projection of the first auxiliary exposure portions WD1 on the base substrate 1000 and the orthogonal projection of the touch electrodes (e.g., the second touch electrodes 820) on the base substrate 1000.

In some embodiments, in the first color sub-pixels, the orthogonal projection of the first auxiliary exposure portions WD1 on the base substrate 1000 is located between the orthogonal projections of the data line pattern DA2 and the power supply signal line pattern VDD on the base substrate 1000.

Optionally, the orthogonally projection of the first auxiliary exposure portions WD1 on the base substrate 1000 may also be located on a side of the orthogonal projection of the data line pattern DA2 on the base substrate 1000 facing away from the orthogonal projection of the power supply signal line pattern VDD on the base substrate 1000. Alternatively, the orthogonal projection of the first auxiliary exposure portions WD1 on the base substrate 1000 may also be located on a side of the orthogonal projection of the power supply signal line pattern VDD on the base substrate 1000 facing away from the orthogonal projection of the data line pattern DA2 on the base substrate 1000.

It may be appreciated that each of the first auxiliary exposure portions WD1 may include at least one of a first auxiliary exposure portion first region WD11 (not shown), a first auxiliary exposure portion second region WD12 (not shown), and a first auxiliary exposure portion third region WD13 (not shown). The first auxiliary exposure portion first regions WD11 are first regions of the orthogonal projection of the auxiliary conductive portions WD on the base substrate 1000 between the orthogonal projections of the data line pattern DA2 and the power supply signal line pattern VDD on the base substrate 1000, the first auxiliary exposure portion second regions WD12 are second regions of the orthogonal projection of the auxiliary conductive portions WD on the base substrate 1000 on the side of the orthogonal projection of the data line pattern DA2 on the base substrate 1000 facing away from the orthogonal projection of the power supply signal line pattern VDD on the base substrate 1000, and the first auxiliary exposure portion third regions WD13 are third regions of the orthogonal projection of the auxiliary conductive portions WD on the base substrate 1000 on the side of the orthogonal projection of the power supply signal line pattern VDD on the base substrate 1000 facing away from the orthogonal projection of the data line pattern DA2 on the base substrate 1000.

In some embodiments of the present disclosure, the first auxiliary sub-overlap area S11 may be 2 $\mu m^2$ to 10 $\mu m^2$. Optionally, the first auxiliary sub-overlapping region S11 may be 3 $\mu m^2$ to 6 $\mu m^2$. In some embodiments, the first auxiliary sub-overlap area S11 may be 2 $\mu m^2$, or 3 $\mu m^2$, or 5 $\mu m^2$ or 6 $\mu m^2$ or 10 $\mu m^2$, without limitation here. Of course, in practical applications, design may be determined according to the requirements of the practical application environment, and is not limited herein.

In some embodiments of the present disclosure, as shown in FIGS. 5A to 5I to 6D, in the same sub-pixel, the orthogonal projection of the auxiliary conductive portions WD on the base substrate 1000 has a total area Sm. The ratio of the first auxiliary overlap area S1 to the total area Sm may range from 1/6 to 3/4. Optionally, the ratio of the first auxiliary overlap area S1 to the total area Sm may range from: 1/3 to 2/3, i.e., 1/3≤S1/Sm≤2/3. For example, S1/Sm may be equal to 1/3, or 2/3, or 1/2. Of course, in practical applications, the specific values of S1/Sm may be set according to the requirements of the practical applications, which is not limited herein.

In some embodiments of the present disclosure, as shown in FIGS. 5A to 5I to 6D, in the same sub-pixel, the orthogonal projection of the auxiliary conductive portions WD on the base substrate 1000 has a total area Sm. The ratio of the first auxiliary sub-overlap area S11 to the total area Sm may range from: 1/8 to 2/3. Optionally, the ratio of the first auxiliary sub-overlap area S11 to the total area Sm may range from: 1/6 to 1/3, i.e., 1/6≤S11/Sm≤1/3. For example, S11/Sm may be equal to 1/6, or 1/4, or 1/3. Of course, in practical applications, the specific values of S11/Sm may be set according to the requirements of the practical applications, which is not limited herein.

Figure 9A:
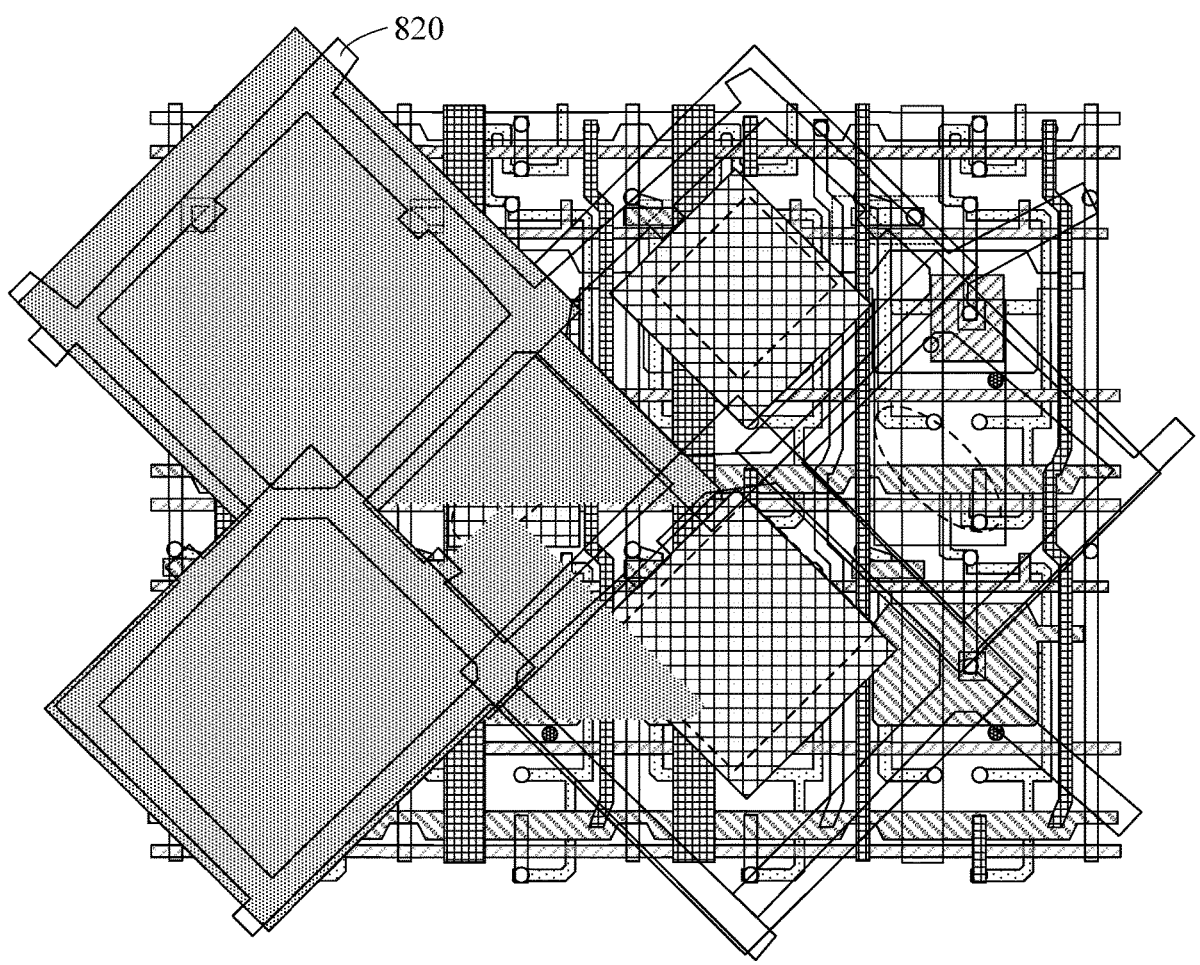
FIG. 9A is a schematic layout structure diagram of further display panels in embodiments of the present disclosure.
Figure 9B:
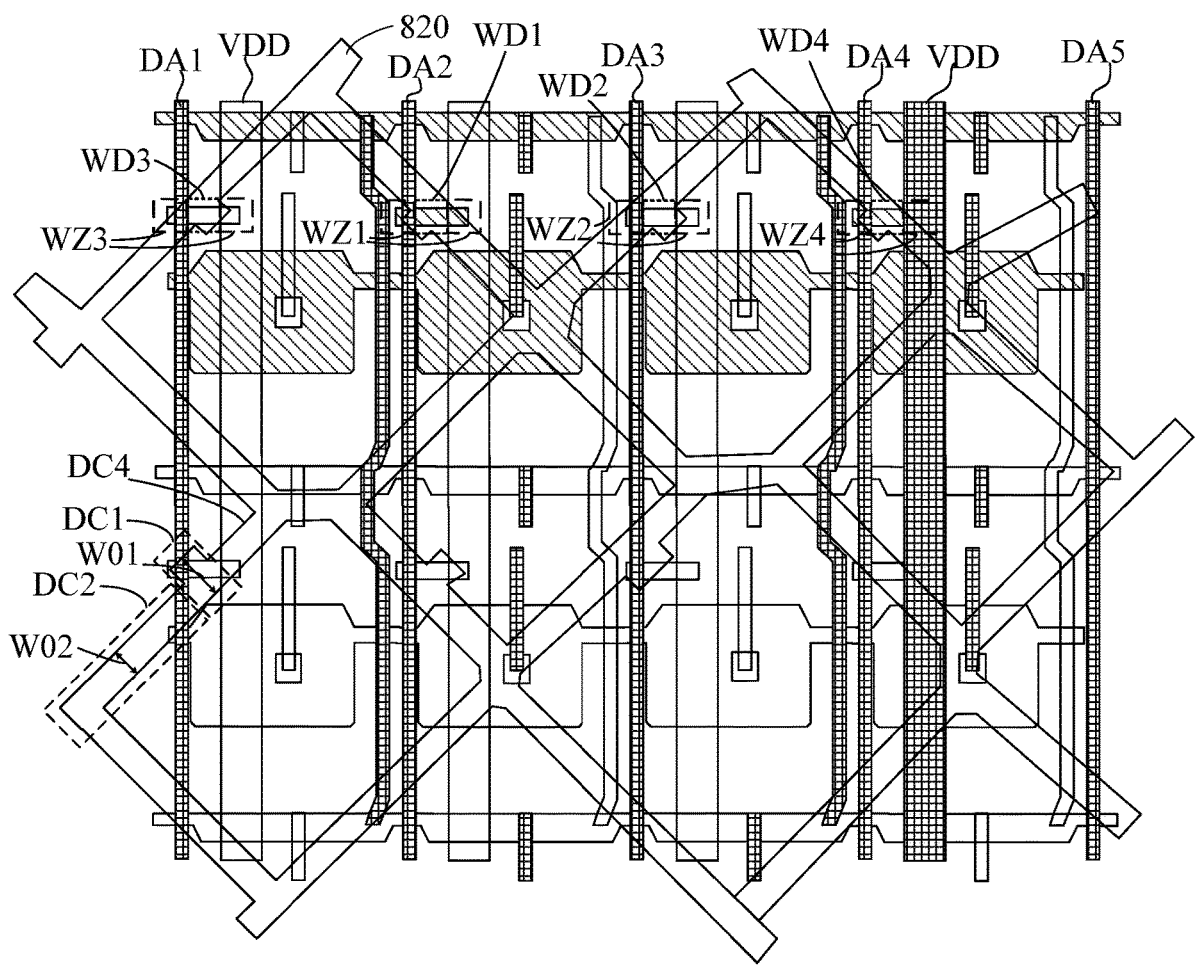
FIG. 9B is a schematic layout structure diagram of further display panels in embodiments of the present disclosure.
Figure 9C:
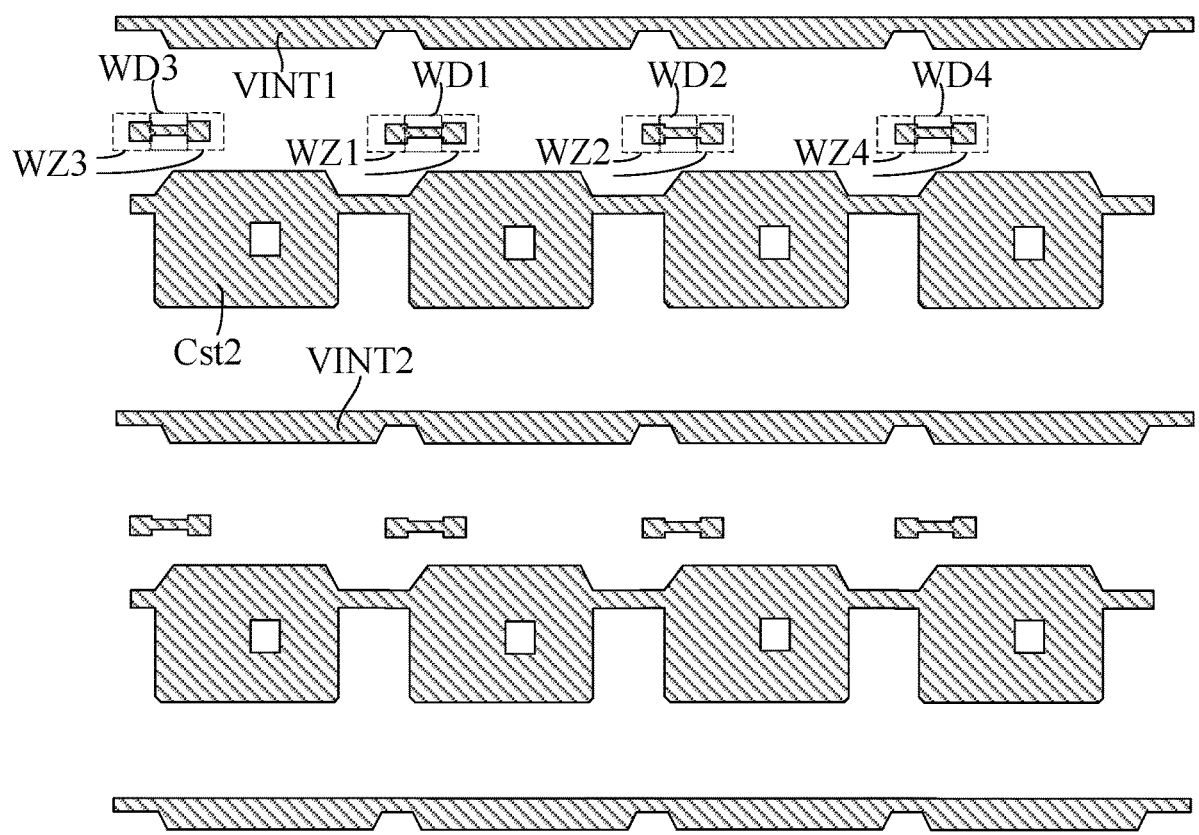
FIG. 9C is a schematic layout structure diagram of further display panels in embodiments of the present disclosure.
Figure 10A:
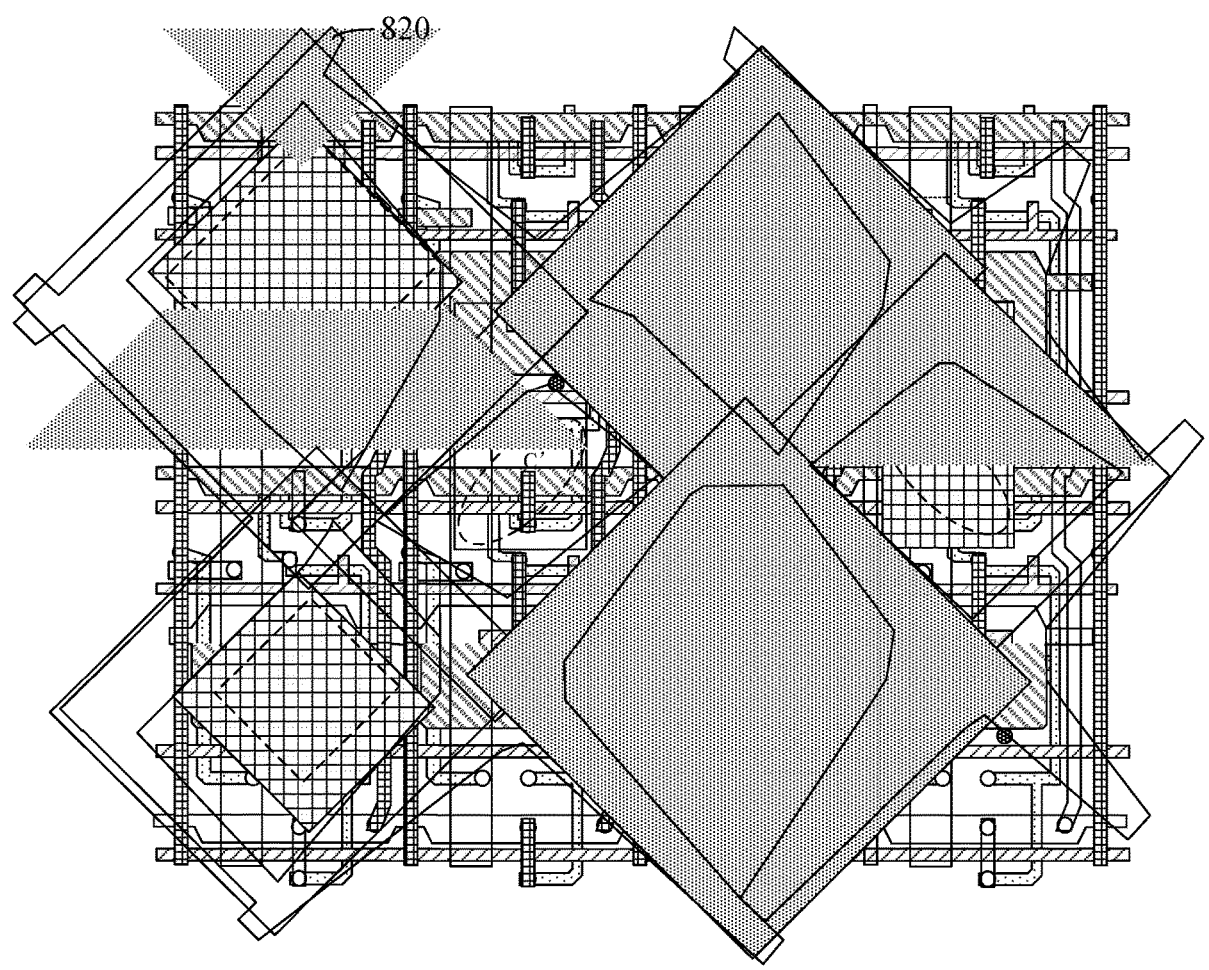
FIG. 10A is a schematic layout structure diagram of further display panels in embodiments of the present disclosure.
Figure 10B:
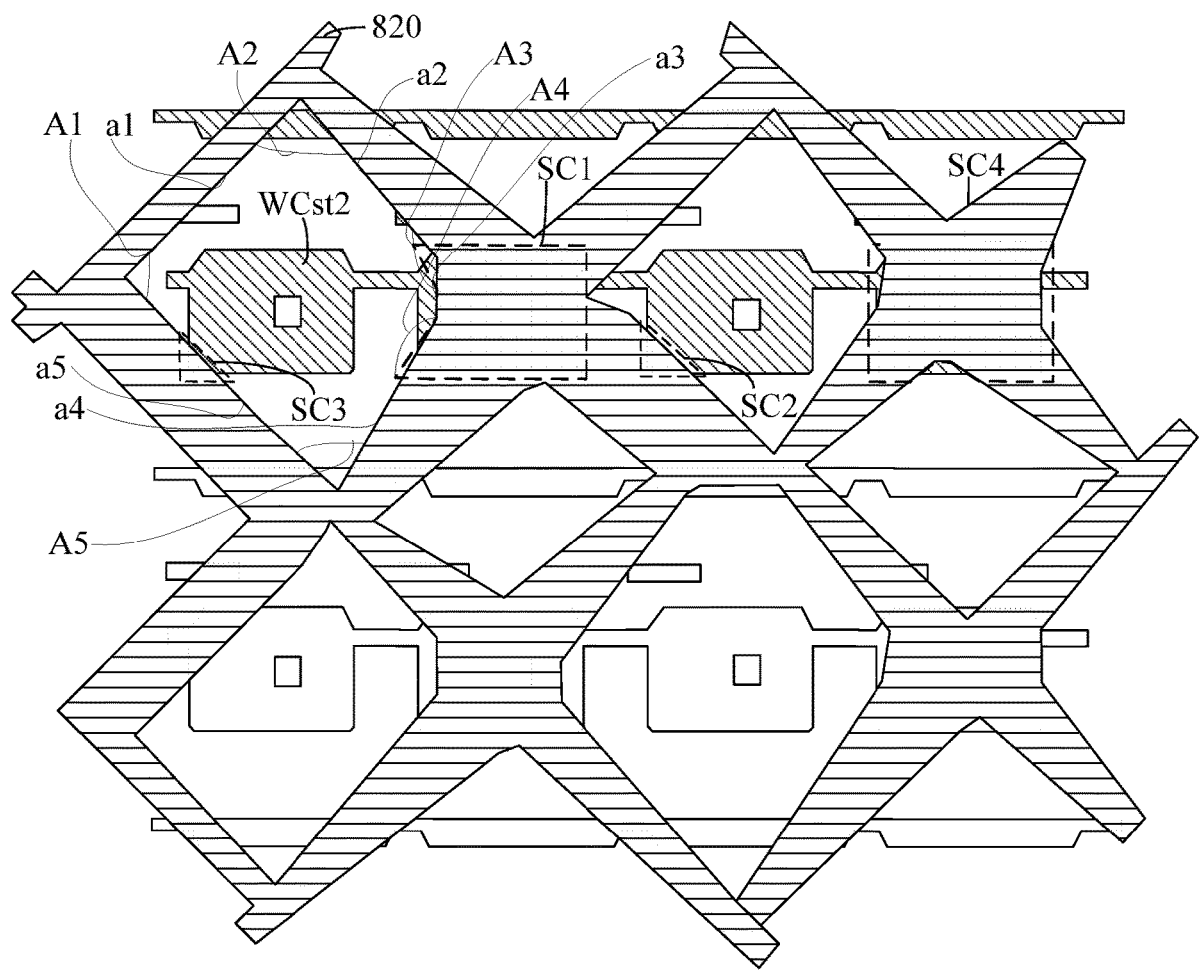
FIG. 10B is a schematic layout structure diagram of further display panels in embodiments of the present disclosure.

In some embodiments of the present disclosure, as shown in FIGS. 9A to 9C, in the first color sub-pixels, the orthogonal projection of the touch electrodes (e.g., the second touch electrodes 820) on the base substrate 1000 may also be made to cover the orthogonal projection of the first auxiliary exposure portion WD1 on the base substrate 1000. This makes it possible to cover as much as possible the first auxiliary exposure portions WD1 which may reflect light.

In some embodiments of the present disclosure, as shown in FIGS. 9B and 9C, the auxiliary conductive portions WD in the first color sub-pixels may further include first auxiliary shielding portions WZ1, and an orthogonal projection of the first auxiliary shielding portions WZ1 on the base substrate 1000 overlaps the orthogonal projection of at least one of the data line pattern DA2 and the power supply signal line pattern VDD on the base substrate 1000. The first auxiliary shielding portion WZ1 and the first auxiliary exposure portion WD1 of the same auxiliary conductive portion are integrally arranged, thereby forming the auxiliary conductive portion. In some embodiments, as shown in FIG. 9B, a width of the first auxiliary exposure portions WD1 in a column direction F3 may be made substantially equal to a width of the first auxiliary shielding portions WZ1 in the column direction F3. This may reduce the difficulty of preparing the auxiliary conductive portions in the first color sub-pixels. As shown in FIG. 9C, it is also possible to make the width of the first auxiliary exposure portions WD1 in the column direction F3 smaller than a width of at least part of the first auxiliary shield portions WZ1 in the column direction F3. This may further shield the first auxiliary exposure portions WD1. In some embodiments, a width of the first auxiliary exposure portions WD1 in a row direction F4 may also be made smaller than a width of at least a part of the first auxiliary shielding portions WZ1 in the row direction F4, which may result in a smaller area of the exposed auxiliary conductive portions WD, in favor of reducing the resulting reflected light of the auxiliary conductive portions WD.

In some embodiments of the present disclosure, as shown in FIGS. 5A to 5I to 9C, the auxiliary conductive portions WD in the second color sub-pixels include second auxiliary exposure portions WD2, and an orthogonal projection of the second auxiliary exposure portions WD2 on the base substrate 1000 does not overlap the orthogonal projections of the data line pattern DA3 and the power supply signal line pattern VDD, respectively, on the base substrate 1000. The second auxiliary overlap area S2 includes a second auxiliary sub-overlap area S12, and the second auxiliary sub-overlap area S12 is located between the orthogonal projection of the second auxiliary exposure portions WD2 on the base substrate 1000 and the orthogonal projection of the touch electrodes (e.g., the second touch electrodes 820) on the base substrate 1000. In some embodiments, in the second color sub-pixels, the orthogonal projection of the second auxiliary exposure portions WD2 on the base substrate 1000 is located between the orthogonal projections of the data line pattern DA3 and the power supply signal line pattern VDD on the base substrate 1000. Alternatively, the orthogonal projection of the second auxiliary exposure portion WD2 on the base substrate 1000 is located on a side of the orthogonal projection of the data line pattern DA3 on the base substrate 1000 facing away from the orthogonal projection of the power supply signal line pattern VDD on the base substrate 1000. Alternatively, the orthogonal projection of the second auxiliary exposure portions WD2 on the base substrate 1000 is located on a side of the orthogonal projection of the power supply signal line pattern VDD on the base substrate 1000 facing away from the orthogonal projection of the data line pattern DA3 on the base substrate 1000.

In some embodiments of the present disclosure, the second auxiliary sub-overlap area S12 may be 0 to 4.5 μm². Optionally, the second auxiliary sub-overlap area S12 may be 0 to 2.2 μm². For example, the second auxiliary sub-overlap area S12 may be 0 μm², or 1.5 μm², or 2.2 μm², or 3.5 μm² or 4.5 μm². Of course, in practical applications, design may be determined according to the requirements of the practical application environment, and is not limited herein.

In some embodiments of the present disclosure, as shown in FIGS. 5A to 5I to 6D, in the same sub-pixel, for example: the second color sub-pixel, the orthogonal projection of the auxiliary conductive portion WD on the base substrate 1000 has a total area Sm. In the same sub-pixel, the ratio of the second auxiliary overlap area S2 to the total area Sm (the second color sub-pixel) may range from: 1/20 to 3/4. Optionally, the ratio of the second auxiliary overlap area S2 to the total area Sm (the second color sub-pixel) may range from: 1/10 to 7/20, i.e., 1/10≤S2/Sm≤7/20. For example, S2/Sm may be equal to 1/10, or 1/5 or 7/20. Of course, in practical applications, the specific values of S2/Sm may be set according to the requirements of the practical applications, which is not limited herein.

In some embodiments of the present disclosure, as shown in FIGS. 5A to 5I to 6D, in the same sub-pixel, for example: the second color sub-pixel, the orthogonal projection of the auxiliary conductive portion WD on the base substrate 1000 has a total area Sm. The ratio of the second auxiliary sub-overlap area S12 to the total area Sm may range from: 1/10 to 1/2. The ratio of the second auxiliary sub-overlap area S12 to the total area Sm may range from: 1/5 to 1/4, i.e., 1/5≤S12/Sm≤1/4. For example, S12/Sm may be equal to 1/4, or 1/5 or 9/40. Of course, in practical applications, the specific values of S12/Sm may be set according to the requirements of the practical applications, which is not limited herein.

In some embodiments of the present disclosure, as shown in FIGS. 9A to 9C, in each second color sub-pixel, the orthogonal projection of the touch electrode (e.g., the second touch electrode 820) on the base substrate 1000 may also be made to cover the orthogonal projection of the second auxiliary exposure portion WD2 on the base substrate 1000. This makes it possible to cover as much as possible the second auxiliary exposure portion WD2, which may reflect light.

In some embodiments of the present disclosure, as shown in FIGS. 9B and 9C, the auxiliary conductive portions WD in the second color sub-pixels may further include second auxiliary shielding portions WZ2. An orthogonal projection of the second auxiliary shielding portions WZ2 on the base substrate 1000 overlaps the orthogonal projection of at least one of the data line patterns and the power supply signal line pattern VDD on the base substrate 1000. The second auxiliary shielding portion WZ2 and the second auxiliary exposure portion WD2 of the same auxiliary conductive portion are integrally arranged, thereby forming the auxiliary conductive portion. In some embodiments, as shown in FIG. 9B, a width of the second auxiliary exposure portions WD2 in the column direction F3 may be made to be substantially equal to a width of the second auxiliary shielding portions WZ2 in the column direction F3. This may reduce the difficulty of preparing the auxiliary conductive portions in the second color sub-pixels. As shown in FIG. 9C, the width of the second auxiliary exposure portions WD2 in the column direction F3 may also be made smaller than a width of at least part of the second auxiliary shielding portions WZ2 in the column direction F3. This may further shield the second auxiliary exposure portions WD2. In some embodiments, a width of the second auxiliary exposure portions WD2 in the row direction F4 is smaller than a width of at least part of the second auxiliary shielding portions WZ2 in the row direction F4.

In some embodiments of the present disclosure, as shown in FIGS. 5A to 5I to 6G, the auxiliary conductive portions WD in the third color sub-pixels include third auxiliary exposure portions WD3, and an orthogonal projection of the third auxiliary exposure portions WD3 on the base substrate 1000 does not overlap the orthogonal projection of the data line pattern DA1 and the power supply signal line pattern VDD, respectively, on the base substrate 1000. The third auxiliary overlap area S3 includes a third auxiliary sub-overlap area S13, and the third auxiliary sub-overlap area S13 is located between the orthogonal projection of the third auxiliary exposure portions WD3 on the base substrate 1000 and the orthogonal projection of the touch electrodes (e.g., the second touch electrodes 820) on the base substrate 1000. In some embodiments, in the third color sub-pixels, the orthogonal projection of the third auxiliary exposure portions WD3 on the base substrate 1000 is located between the orthogonal projections of the data line pattern DA1 and the power supply signal line pattern VDD on the base substrate 1000.

In some embodiments of the present disclosure, the third auxiliary sub-overlap area S13 may be 0 to 2.5 $\mu m^2$. Optionally, the third auxiliary sub-overlap area S13 may be 0 to 1.2 $\mu m^2$. For example, the third auxiliary sub-overlap area S13 may be 0 $\mu m^2$, or 0.5 $\mu m^2$, or 1.0 $\mu m^2$, or 1.2 $\mu m^2$ or 2.5 $\mu m^2$. Of course, in practical applications, design may be determined according to the requirements of the practical application environment, which is not specifically limited herein.

In some embodiments of the present disclosure, as shown in FIGS. 5A to 5I to 6D, in the same sub-pixel, for example: the third color sub-pixel, the orthogonal projection of the auxiliary conductive portion WD on the base substrate 1000 has a total area Sm. The ratio of the third auxiliary overlap area S3 to the total area Sm may range from: 0 to 1/2. Optionally, the ratio of the third auxiliary overlap area S3 to the total area Sm may range from: 0-1/4, i.e., $0 \leq S3/Sm \leq 1/4$. For example, S3/Sm may be equal to 0, or 1/16 or 1/4. Of course, in practical applications, specific values of S3/Sm may be set according to the requirements of the practical applications, which is not limited herein.

In some embodiments of the present disclosure, as shown in FIGS. 5A to 5I to 6D, in the same sub-pixel, for example: the third color sub-pixel, the orthogonal projection of the auxiliary conductive portion WD on the base substrate 1000 has a total area Sm. The ratio of the third auxiliary sub-overlap area S13 to the total area Sm may range from: 0 to 1/8. Optionally, the ratio of the third auxiliary sub-overlap area S13 to the total area Sm may range from: 0 to 1/16, i.e., $0 \leq S13/Sm \leq 1/16$. For example, S13/Sm may be equal to 0, or 1/16 or 1/32. Of course, in practical applications, the specific values of S13/Sm may be set according to the requirements of the practical applications, which is not limited herein.

In some embodiments of the present disclosure, as shown in FIGS. 9A to 9C, in each third color sub-pixel, the orthogonal projection of the touch electrode (e.g., the second touch electrode 820) on the base substrate 1000 may also be made to cover the orthogonal projection of the third auxiliary exposure portion WD3 on the base substrate 1000. This makes it possible to cover as much as possible the third auxiliary exposure portion WD3, which may reflect light.

In some embodiments of the present disclosure, as shown in FIGS. 9B and 9C, the auxiliary conductive portions WD in the third color sub-pixels may further include third auxiliary shielding portions WZ3. An orthogonal projection of the third auxiliary shielding portions WZ3 on the base substrate 1000 overlaps the orthogonal projection of at least one of the data line patterns and the power supply signal line patterns VDD on the base substrate 1000. The third auxiliary shielding portion WZ3 and the third auxiliary exposure portion WD3 of the same auxiliary conductive portion are integrally arranged, thereby forming the auxiliary conductive portion. In some embodiments, as shown in FIG. 9B, a width of the third auxiliary exposure portions WD3 in the column direction F3 may be made substantially equal to a width of the third auxiliary shielding portions WZ3 in the column direction F3. This may reduce the difficulty of preparing the auxiliary conductive portions in the third color sub-pixels. As shown in FIG. 9C, the width of the third auxiliary exposure portions WD3 in the column direction F3 may be smaller than a width of at least part of the third auxiliary shielding portions WZ3 in the column direction F3. This may further shield the third auxiliary exposure portions WD3. In some embodiments, a width of the third auxiliary exposure portions WD3 in the row direction F4 is smaller than a width of at least part of the third auxiliary shielding portions WZ3 in the row direction F4.

In some embodiments of the present disclosure, as shown in FIGS. 5A to 5I to 6G, the auxiliary conductive portions WD in the fourth color sub-pixels include fourth auxiliary exposure portions WD4, and an orthogonal projection of the fourth auxiliary exposure portions WD4 on the base substrate 1000 does not overlap the orthogonal projections of the data line pattern DA4 and the power supply signal line pattern VDD, respectively, on the base substrate 1000. The fourth auxiliary overlap area S4 includes a fourth auxiliary sub-overlap area S14, and the fourth auxiliary sub-overlap area S14 is located between the orthogonal projection of the fourth auxiliary exposure portions WD4 on the base substrate 1000 and the orthogonal projection of the touch electrodes (e.g., the second touch electrodes 820) on the base substrate 1000. In some embodiments, in the fourth color sub-pixels, the orthogonal projection of the fourth auxiliary exposure portions WD4 on the base substrate 1000 is located between the orthogonal projections of the data line pattern DA4 and the power supply signal line pattern VDD on the base substrate 1000.

In some embodiments of the present disclosure, as shown in FIGS. 5A to 5I to 6D, in the same sub-pixel, for example: the fourth color sub-pixel, the orthogonal projection of the auxiliary conductive portion WD on the base substrate 1000 has a total area Sm. The ratio of the fourth auxiliary overlap area S4 to the total area Sm may range from: 1/6 to 5/6, i.e., $1/6 \leq S4/Sm \leq 5/6$. For example, S4/Sm may be equal to 1/6, or 2/3, or 5/6. Of course, in practical applications, specific values of S4/Sm may be set according to the requirements of the practical applications, which is not limited herein.

In some embodiments of the present disclosure, as shown in FIGS. 5A to 5I to 6D, in the same sub-pixel, for example: the fourth color sub-pixel, the orthogonal projection of the auxiliary conductive portion WD on the base substrate 1000 has a total area Sm. The ratio of the fourth auxiliary sub-overlap area S14 to the total area Sm may range from:

1/3 to 2/3, i.e., 1/3≤S14/Sm≤2/3. For example, S14/Sm may be equal to 1/3, or 2/3 or 1/2. Of course, in practical applications, the specific values of S14/Sm may be set according to the requirements of the practical applications, which is not limited herein.

In some embodiments of the present disclosure, the fourth auxiliary sub-overlap area S14 may be 2 μm² to 10 μm². Optionally, the fourth auxiliary sub-overlap area S14 may be 3 μm² to 6 μm². In some embodiments, the fourth auxiliary sub-overlap area S14 may be 2 μm², or 3 μm², or 5 μm², or 6 μm² or 10 μm², without limitation here. Of course, in practical applications, design may be determined according to the requirements of the practical application environment, and is not limited herein.

In some embodiments of the present disclosure, as shown in FIGS. 9A to 9C, in the fourth color sub-pixels, the orthogonal projection of the touch electrodes (e.g., the second touch electrodes 820) on the base substrate 1000 may also be made to cover the orthogonal projection of the fourth auxiliary exposure portions WD4 on the base substrate 1000. This makes it possible to cover as much as possible the fourth auxiliary exposure portions WD4, which may reflect light.

In some embodiments of the present disclosure, as shown in FIGS. 9B and 9C, the auxiliary conductive portions in the fourth color sub-pixels may further include fourth auxiliary shielding portions WZ4. An orthogonal projection of the fourth auxiliary shielding portions WZ4 on the base substrate 1000 overlaps the orthogonal projection of at least one of the data line patterns and the power supply signal line patterns VDD on the base substrate 1000. The fourth auxiliary shielding portion WZ4 and the fourth auxiliary exposure portion WD4 of the same auxiliary conductive portion are integrally arranged, thereby forming the auxiliary conductive portion. In some embodiments, as shown in FIG. 9B, a width of the fourth auxiliary exposure portions WD4 in the column direction F3 may be made substantially equal to a width of the fourth auxiliary shielding portions WZ4 in the column direction F3. This may reduce the difficulty of preparing the auxiliary conductive portions in the fourth color sub-pixels. As shown in FIG. 9C, it is also possible that the width of the fourth auxiliary exposure portions WD4 in the column direction F3 is smaller than a width of at least part of the fourth auxiliary shielding portions WZ4 in the column direction F3. This may further shield the fourth auxiliary exposure portions WD4. In some embodiments, a width of the fourth auxiliary exposure portions WD4 in the row direction F4 is less than a width of at least part of the fourth auxiliary shielding portions WZ4 in the row direction F4.

In some embodiments of the present disclosure, as shown in FIGS. 5A to 5I to 6D, the first auxiliary sub-overlap area S11 may be made larger than the second auxiliary sub-overlap area S12. Therefore, compared with the second color sub-pixels, in the first color sub-pixels, the auxiliary conductive portions in the first color sub-pixels have more parts that are shielded by the touch electrodes 800 (e.g., the second touch electrodes 820), which may reduce the problems of light emitting interference and poor light mixing effect caused by light reflecting by the first auxiliary exposure portions WD1.

In some embodiments of the present disclosure, as shown in FIGS. 5A to 5I to 6D, the first auxiliary sub-overlap area S11 may be made larger than the third auxiliary sub-overlap area S13. Therefore, compared with the third color sub-pixels, in the first color sub-pixels, the auxiliary conductive portions in the first color sub-pixels have more parts that are shielded by the touch electrodes 800 (e.g., the second touch electrodes 820), which may reduce the problems of light emitting interference and poor light mixing effect caused by light reflecting by the first auxiliary exposure portions WD1.

In some embodiments of the present disclosure, as shown in FIGS. 5A to 5I to 6D, the fourth auxiliary sub-overlap area S14 may be made larger than the second auxiliary sub-overlap area S12. Therefore, compared with the second color sub-pixels, in the fourth color sub-pixels, the auxiliary conductive portions in the fourth color sub-pixels have more parts that are shielded by the touch electrodes 800 (e.g., the second touch electrodes 820), which may reduce the problems of light emitting interference and poor light mixing effect caused by light reflecting by the fourth auxiliary exposure portions WD4.

In some embodiments of the present disclosure, as shown in FIGS. 5A to 5I to 6D, the fourth auxiliary sub-overlap area S14 may be made larger than the third auxiliary sub-overlap area S13. Therefore, compared with the third color sub-pixels, in the fourth color sub-pixels, the auxiliary conductive portions in the fourth color sub-pixels have more parts that are shielded by the touch electrodes 800 (e.g., the second touch electrodes 820), which may reduce the problems of light emitting interference and poor light mixing effect caused by light reflecting by the fourth auxiliary exposure portions WD4.

In some embodiments of the present disclosure, as shown in FIGS. 5A to 5I to 6D, the second auxiliary sub-overlap area S12 may be made larger than the third auxiliary sub-overlap area S13 such that the first auxiliary sub-overlap area S11 is larger than the second auxiliary sub-overlap area S12 which is larger than the third auxiliary sub-overlap area S13. This allows the areas of the first auxiliary exposure portions WD1, the second auxiliary exposure portions WD2 and the third auxiliary exposure portions WD3 which are shielded by the touch electrodes (e.g., the second touch electrodes 820) to increase sequentially, thereby further reducing the problems of light emitting interference and poor light mixing effect caused by light reflecting by the first auxiliary exposure portions WD1, the second auxiliary exposure portions WD2, and the third auxiliary exposure portions WD3. Of course, it is also possible that the second auxiliary sub-overlap area S12 is substantially equal to the third auxiliary sub-overlap area S13, for example: the second auxiliary sub-overlap area S12 is equal to the third auxiliary sub-overlap area S13, both equal to 0; or the fourth auxiliary sub-overlap area S14 is at least equal to one of the first auxiliary sub-overlap area S11, the second auxiliary sub-overlap area S12, and the third auxiliary sub-overlap area S13; or the fourth auxiliary sub-overlap area S14 is larger than at least one of the first auxiliary sub-overlap area S11, the second auxiliary sub-overlap area S12, and the third auxiliary sub-overlap area S13.

In some embodiments of the present disclosure, as shown in FIGS. 5A to 5I to 6D, the fourth auxiliary sub-overlap area S14 may be made larger than the first auxiliary sub-overlap area S11. This may make the fourth auxiliary exposure portions WD4 shielded by the touch electrodes (e.g., the second touch electrodes 820) larger than the first auxiliary exposure portions WD1 shielded by the touch electrodes, which may further reduce the problems of light emitting interference and poor light mixing effect caused by light reflecting by the fourth auxiliary exposure portions WD4. Of course, it is also possible that the fourth auxiliary sub-overlap area S14 is substantially equal to the first auxiliary sub-overlap area S11.

In some embodiments of the present disclosure, as shown in FIGS. 5A to 5I to 7F, 10A, and 10B, the orthogonal projection of the first capacitors in the first color sub-pixels (e.g., taking the second plates Cst2 of the first capacitors as an example) on the base substrate 1000 has a first storage overlap area SC1 with the orthogonal projection of the touch electrodes (e.g., the second touch electrodes 820) on the base substrate 1000. In some embodiments, the first storage overlap area SC1 includes an overlap area between an orthogonal projection of the storage conductive portions Cst2 in the first color sub-pixels and the orthogonal projection of the touch electrodes (e.g., the second touch electrodes 820) on the base substrate 1000.

In some embodiments, as shown in FIGS. 5A to 5I to 7F, 10A, and 10B, the grid structure formed by the touch electrodes in at least one sub-pixel includes at least 5 internal angles, of which there are at least 2 obtuse angles and 2 acute angles. For example: 5 to 10 internal angles, of which there are at least 2 obtuse angles and 2 acute angles.

Optionally, the grid structure formed by the touch electrodes in at least one sub-pixel has at least 4 internal angles which are unequal. For example: in the first color sub-pixels, the second touch electrodes 820 form A1 to A5 internal angles, where A1 equals 90°, A2 and A5 are acute angles of 30° to 80°, and A3 and A4 are continuous obtuse angles of 95° to 150°.

Of course, this is not limited to the above situation. For example, optionally, A2 and A5 are equal acute angles and A3 and A4 are equal obtuse angles. Alternatively, the internal angles of the formed grid are all equal, for example: forming a regular pentagon, or a hexagon.

In some embodiments, as shown in FIGS. 5A to 5I to 7F, 10A, and 10B, the grid structure formed by the touch electrodes in at least one sub-pixel includes at least 5 sides, of which at least 2 sides are not equal in length. For example: in the first color sub-pixels, the second touch electrodes 820 form 5 sides with A1 to A5 internal angles. For example: a1 to a5 are unequal in length.

In some embodiments, as shown in FIGS. 5A to 5I to 7F, 10A, and 10B, the structure formed by the touch electrodes in at least one sub-pixel includes at least 4 sides, of which at least 2 sides are not equal in width. Optionally, a width of at least one of the sides of the touch electrodes in at least one corresponding sub-pixel is gradually reduced. For example: the width of the a4 side becomes smaller from the beginning of the A4 angle to the tail end of the A5 angle direction. Optionally, at least one of the sides of the touch electrodes in one corresponding sub-pixel includes three portions of unequal widths. For example: as shown in FIG. 9B, one side of the touch electrodes includes at least 3 portions of unequal widths, DC1 being greater than DC2 and DC1 being greater than DC4. DC4 is smaller in width, so that the overlap with power supply signal lines may be reduced and the effect on the touch signals may be reduced.

Of course, this is not limited to the above situation. For example, optionally, the touch electrodes may form a polygonal structure of equal side length or equal width. For example: a regular pentagon, and a regular hexagon.

In some embodiments of the present disclosure, as shown in FIGS. 5A to 5I to 7F, 10A, and 10B, the orthogonal projection of the first capacitors in the second color sub-pixels on the base substrate 1000 has a second storage overlap area SC2 with the orthogonal projection of the touch electrodes (e.g., the second touch electrodes 820) on the base substrate 1000. In some embodiments, the second storage overlap area SC2 includes an overlap area between the orthogonal projection of the storage conductive portions Cst2 in the second color sub-pixels on the base substrate 1000 and the orthogonal projection of the touch electrodes (e.g., the second touch electrodes 820) on the base substrate 1000.

In some embodiments of the present disclosure, as shown in FIGS. 5A to 5I to 7F, 10A, and 10B, the orthogonal projection of the first capacitors in the third color sub-pixels on the base substrate 1000 has a third storage overlap area SC3 with the orthogonal projection of the touch electrodes (e.g., the second touch electrodes 820) on the base substrate 1000. In some embodiments, the third storage overlap area SC3 includes an overlap area between the orthogonal projection of the storage conductive portions Cst2 in the third color sub-pixels on the base substrate 1000 and the orthogonal projection of the touch electrodes (e.g., the second touch electrodes 820) on the base substrate 1000.

In some embodiments of the present disclosure, as shown in FIGS. 5A to 5I to 7F, 10A, and 10B, the orthogonal projection of the first capacitors in the fourth color sub-pixels on the base substrate 1000 has a fourth storage overlap area SC4 with the orthogonal projection of the touch electrodes (e.g., the second touch electrodes 820) on the base substrate 1000. In some embodiments, the fourth storage overlap area SC4 includes an overlap area between the orthogonal projection of the storage conductive portions Cst2 in the fourth color sub-pixels on the base substrate 1000 and the orthogonal projection of the touch electrodes (e.g., the second touch electrodes 820) on the base substrate 1000.

In some embodiments of the present disclosure, as shown in FIGS. 5A to 5I to 7F, 10A and 10B, at least one of the first storage overlap area SC1, the second storage overlap area SC2, and the fourth storage overlap area SC4 may be made larger than the third storage overlap area SC3. For example, the first storage overlap area SC1, the second storage overlap area SC2, and the fourth storage overlap area SC4 may each be made larger than the third storage overlap area SC3; alternatively, at least one of the first storage overlap area SC1 or the fourth storage overlap area SC4 is larger than the second storage overlap area SC2 which is equal to the third storage overlap area SC3.

In some embodiments of the present disclosure, as shown in FIGS. 5A to 5I to 7F, 10A and 10B, the first storage overlap area SC1 may be made larger than the second storage overlap area SC2. This may allow the first capacitors in the first color sub-pixels to be shielded as much as possible by the touch electrodes (e.g., the second touch electrodes 820).

In some embodiments of the present disclosure, as shown in FIGS. 5A to 5I to 9B, the touch electrodes (e.g., the second touch electrodes 820) include first electrode portions DC1 and second electrode portions DC2. An orthogonal projection of the first electrode portions DC1 on the base substrate 1000 and the orthogonal projection of the auxiliary conductive portions on the base substrate 1000 have an overlapping region, and an orthogonal projection of the second electrode portions DC2 on the base substrate 1000 and the orthogonal projection of the auxiliary conductive portions on the base substrate 1000 do not overlap. A width of the first electrode portions DC1 may be larger than a width of the second electrode portions DC2. This may allow the touch electrodes to better shield the auxiliary conductive portions.

Optionally, as shown in FIGS. 5A to 5I to 9B, the touch electrodes (e.g., the second touch electrodes 820) include at least 3 portions having different widths, and the touch electrodes include the first electrode portions DC1, the second electrode portions DC2 and third electrode portions DC3 (not shown). For example: the orthogonal projection of the first electrode portions DC1 on the base substrate 1000 and the orthogonal projection of the auxiliary conductive portions on the base substrate 1000 have an overlapping region, the orthogonal projection of the second electrode portions DC2 on the base substrate 1000 does not overlap the orthogonal projection of the auxiliary conductive portions on the base substrate 1000, and an orthogonal projection of the third electrode portions DC3 on the base substrate 1000 has an overlapping region with the orthogonal projection of the storage conductive portions on the base substrate 1000. Optionally, the width of the first electrode portions DC1 is smaller than the width of the second electrode portions DC2, and the width of the second electrode portions DC2 is smaller than a width of the third electrode portions DC3.

Optionally, as shown in FIGS. 5A to 5I to 9B, the touch electrodes have bulges at least in one corresponding sub-pixel region, such as DC1. The touch electrodes have bulges in at least two corresponding sub-pixel regions, and the bulges differ in bulging direction or in width.

In some embodiments of the present disclosure, as shown in FIGS. 5A to 5I, 6F and 6G, the orthogonal projection of the touch electrodes (e.g., the second touch electrodes 820) located between adjacent opening regions on the base substrate 1000 overlaps an orthogonal projection of at least two different color light emitting layers on the base substrate 1000. Optionally, the orthogonal projection of the touch electrodes (e.g., the second touch electrodes 820) located between the adjacent opening regions on the base substrate 1000 is covered by the orthogonal projection of the at least two different color light emitting layers on the base substrate 1000.

In some embodiments, the orthogonal projection of the touch electrodes (e.g., the second touch electrodes 820) located between the adjacent opening regions on the base substrate 1000 may be covered by the orthogonal projection of the two different color light emitting layers on the base substrate 1000. The orthogonal projection of the touch electrodes (e.g., the second touch electrodes 820) located between the adjacent opening regions on the base substrate 1000 may also be covered by an orthogonal projection of three different color light emitting layers on the base substrate 1000.

In some embodiments, in the same sub-pixel, there is an overlapping region (e.g., SC1) between the touch electrode (e.g., 820) and the storage conductive portion WCst2, the touch electrode (e.g., 820) is overlapped by the orthogonal projection of at least three differently colored light emitting layers on the base substrate 1000, and the area of the orthogonal projection of the storage conductive portion WCst2 on the base substrate 1000 is Sn, where SC1/Sn is approximately 1/5 to 4/5.

Optionally, in the same sub-pixel, the ratio of the area of the touch electrode covered by the orthogonal projection of the at least three differently colored light emitting layers on the base substrate 1000 to the area of the orthogonal projection of the corresponding storage conductive portion WCst2 on the base substrate 1000 is approximately 3/10 to 2/5. For example, the ratio of the area of the touch electrode covered by the orthogonal projection of the at least three differently colored light emitting layers on the base substrate 1000 to the area of the orthogonal projection of the corresponding storage conductive portion WCst2 on the base substrate 1000 is approximately 1/5. Alternatively, the ratio of the area of the touch electrode covered by the orthogonal projection of the at least three differently colored light emitting layers on the base substrate 1000 to the area of the orthogonal projection of the corresponding storage conductive portion WCst2 on the base substrate 1000 is approximately 3/10. Alternatively, the ratio of the area of the touch electrode covered by the orthogonal projection of the at least three differently colored light emitting layers on the base substrate 1000 to the area of the orthogonal projection of the corresponding storage conductive portion WCst2 on the base substrate 1000 is approximately 2/5. Alternatively, the ratio of the area of the touch electrode covered by the orthogonal projection of the at least three differently colored light emitting layers on the base substrate 1000 to the area of the orthogonal projection of the corresponding storage conductive portion WCst2 on the base substrate 1000 is approximately 1/2. Of course, in practical applications, design may be made according to the requirements of the practical application environment, and is not limited herein.

In some embodiments of the present disclosure, as shown in FIGS. 5A to 5I, 6F, 6G, and 11, the orthogonal projection of the touch electrodes (e.g., the second touch electrodes 820) around the opening regions KK1 in the first color sub-pixels on the base substrate 1000 may be made to lie within an orthogonal projection of the first color light emitting layer 610 on the base substrate 1000. In this regard, on one hand, the area of the first color light emitting layer 610 may be increased to ensure the light emitting effect.

Optionally, the auxiliary conductive portions are further shielded by having at least part of a boundary ES1 of the first color light emitting layer 610 cover the auxiliary conductive portions.

In some embodiments of the present disclosure, as shown in FIGS. 5A to 5I, 6F, 6G, and 11, the orthogonal projection of the touch electrodes (e.g., the second touch electrodes 820) around the opening regions KK2 in the second color sub-pixels on the base substrate 1000 may be made to lie within an orthogonal projection of the second color light emitting layer 620 on the base substrate 1000. This may increase the area of the second color light emitting layer 620 to guarantee the light emitting effect.

Optionally, the auxiliary conductive portions are further shielded by having at least part of a boundary ES2 of the second color light emitting layer 620 cover the auxiliary conductive portions.

In some embodiments of the present disclosure, as shown in FIGS. 5A to 5I, 6F, 6G, and 11, the orthogonal projection of the touch electrodes (e.g., the second touch electrodes 820) around the opening regions KK3 in the third color sub-pixels on the base substrate 1000 may be made to lie within an orthogonal projection of the third color light emitting layer 630 on the base substrate 1000. This may increase the area of the third color light emitting layer 630 to guarantee the light emitting effect.

Optionally, the auxiliary conductive portions are further shielded by having at least part of a boundary ES3 of the third color light emitting layer 630 cover the auxiliary conductive portions.

In some embodiments of the present disclosure, as shown in FIGS. 5A to 5I, 6F, 6G, and 11, the orthogonal projection of the touch electrodes (e.g., the second touch electrodes 820) around the opening regions KK4 in the fourth color sub-pixels on the base substrate 1000 may be made to lie within an orthogonal projection of the fourth color light emitting layer 640 on the base substrate 1000. This may increase the area of the fourth color light emitting layer 640 to guarantee the light emitting effect.

Optionally, the auxiliary conductive portions are further shielded by having at least part of a boundary ES4 of the fourth color light emitting layer 640 cover the auxiliary conductive portions.

It is to be understood that in a region where at least two color light emitting layers overlap, the position where the light emitting layers are laminated is not limited to the cases listed in the embodiment and may be adjusted according to actual circumstances or process conditions, for example: different color light emitting layers are fabricated in a single step or are fabricated in different steps. For example: the position where the light emitting layers are laminated is not limited to that in FIG. 5E, and the order is 610, 620, and 630 sequentially upwards from the pixel defining layer 950, but may be 630, 620, and 610 or 610, 630, and 620, or 630, 610, and 620, or the like sequentially upwards from the pixel defining layer 950.

In some embodiments of the present disclosure, as shown in FIGS. 5A to 5I, 6F, 6G and 11, for the third color light emitting layer 630 and the second color light emitting layer 620 which are adjacent, the boundary ES3 of the orthogonal projection of the third color light emitting layer 630 on the base substrate 1000 has a first minimum distance W0S1 with a boundary CK3 of the orthogonal projection of the touch electrodes (e.g., the second touch electrodes 820) surrounding the third color sub-pixels on the base substrate 1000, and the boundary ES2 of the orthogonal projection of the second color light emitting layer 620 on the base substrate 1000 has a second minimum distance W0S2 with a boundary CK1 of the orthogonal projection of the touch electrodes (e.g., the second touch electrodes 820) surrounding the second color sub-pixels on the base substrate 1000. The first minimum distance W0S1 is greater than the second minimum distance W0S2. Therefore, on one hand, it may further increase the area of the third color light emitting layer 630 to guarantee the light emitting effect. On the other hand, the auxiliary conductive portions are further shielded by covering the auxiliary conductive portions with at least part of the boundary ES3 of the third color light emitting layer 630. Also, since the light emitting area of the second color sub-pixels is smaller, there is less influence on the light emitting effect of the second color sub-pixels when the third color light emitting layer 630 extends into the second color light emitting layer 620.

In some embodiments of the present disclosure, as shown in FIGS. 5A to 5I, 6F, 6G and 11, the area enclosed by the orthogonal projection of the touch electrodes (e.g., the second touch electrodes 820) surrounding the opening regions KK1 in the first color sub-pixels on the base substrate 1000 is a first grid area WG1. The area enclosed by the orthogonal projection of the touch electrodes (e.g., the second touch electrodes 820) surrounding the opening regions KK2 in the second color sub-pixels on the base substrate 1000 is a second grid area WG2. The area enclosed by the orthogonal projection of the touch electrodes (e.g., the second touch electrodes 820) surrounding the opening regions KK3 in the third color sub-pixels on the base substrate 1000 is a third grid area WG3. The third grid area WG3 is larger than the second grid area WG2 which is larger than the first grid area WG1. This may make the third grid area WG3, the second grid area WG2, and the first grid area WG1 proportional to the opening regions KK3 in the third color sub-pixels, the opening regions KK2 in the second color sub-pixels, and the opening regions KK1 in the first color sub-pixels, respectively, so that the light transmittance may be improved.

It will be appreciated that the first touch electrodes 810 and/or the second touch electrodes in the embodiment of the present disclosure are not required to be all closed grids, and that touch electrodes in local regions or corresponding to individual sub-pixels may be notched or disconnected. For example: in conjunction with FIGS. 1 to 2, 5A to 5I, 6F, and 6G to 11, the touch electrodes at the edge of the display region AA near the non-display region, or at the non-display region or corresponding to individual sub-pixels are notched or disconnected.

In some embodiments of the present disclosure, as shown in FIGS. 5A to 5I, 6F, 6G, and 11, the area enclosed by the orthogonal projection of the touch electrodes (e.g., the second touch electrodes 820) around the opening regions KK4 in the fourth color sub-pixels on the base substrate 1000 is a fourth grid area WG4. The first grid area WG1 corresponding to the first color sub-pixels may be made larger than the fourth grid area WG4 corresponding to the fourth color sub-pixels. Alternatively, the first grid area WG1 corresponding to the first color sub-pixels may be substantially equal to the fourth grid area WG4 corresponding to the fourth color sub-pixels, which is not limited herein.

In some embodiments of the present disclosure, the first grid area WG1 may be 850 to 920 $\mu m^2$. Optionally, the first grid area WG1 may be 860 $\mu m^2$ to 910 $\mu m^2$. For example, the first grid area WG1 may be 850 $\mu m^2$, or 860 $\mu m^2$, or 900 $\mu m^2$, or 910 $\mu m^2$ or 920 $\mu m^2$. Of course, in practical applications, design may be determined according to the requirements of the practical application environment, and is not limited herein.

Alternatively, in some embodiments of the present disclosure, the first grid area WG1 may also be 30.5*28.5 $\mu m^2$ to 35.5*30.5 $\mu m^2$. Optionally, the first grid area WG1 may be 30.5*28.5 $\mu m^2$. For example, the first grid area WG1 may be 31.5*29.5 $\mu m^2$ or 32.5*29.1 $\mu m^2$. Of course, in practical applications, design may be determined according to the requirements of the practical application environment, and is not limited herein.

In some embodiments of the present disclosure, the second grid area WG2 may be 950 to 1050 $\mu m^2$. Optionally, the second grid area WG2 may be 960 to 1040 $\mu m^2$. For example, the second grid area WG2 may be 950 $\mu m^2$, or 960 $\mu m^2$, or 980 $\mu m^2$, or 1000 $\mu m^2$, or 1040 $\mu m^2$ or 1050 $\mu m^2$. Of course, in practical applications, design may be determined according to the requirements of the practical application environment, and is not limited herein.

Alternatively, in some embodiments of the present disclosure, the second grid area WG2 may be 30.1*30.1 $\mu m^2$ to 32.1*32.1 $\mu m^2$. Optionally, the second grid area WG2 may be 30.5*30.5 $\mu m^2$ to 32.0*32.0 $\mu m^2$. For example, the second grid area WG2 may be 30.1*30.1 $\mu m^2$, or 30.5*30.5 $\mu m^2$, or 31.6*31.6 $\mu m^2$, or 32.0*32.0 $\mu m^2$ or 32.1*32.1 $\mu m^2$. Of course, in practical applications, design may be determined according to the requirements of the practical application environment, and is not limited herein.

In some embodiments of the present disclosure, the third grid area WG3 may be 1100 $\mu m^2$ to 1300 $\mu m^2$. Optionally, the third grid area WG3 may be 1150 $\mu m^2$ to 1250 $\mu m^2$. For example, the third grid area WG3 may be 1100 $\mu m^2$, or 1150 $\mu m^2$, or 1200 $\mu m^2$, or 1225 $\mu m^2$ or 1300 $\mu m^2$. Of course, in practical applications, design may be determined according to the requirements of the practical application environment, and is not limited herein.

Alternatively, in some embodiments of the present disclosure, the third grid area WG3 may be 32*32 $\mu m^2$ to 37*37 $\mu m^2$. Optionally, the third grid area WG3 may be 33*33 $\mu m^2$ to 36*36 µm². For example, the third grid area WG3 may be 32*32 µm², or 33*33 µm², or 34*34 µm², or 35*35 µm², or 36*36 µm² or 37*37 µm². Of course, in practical applications, design may be determined according to the requirements of the practical application environment, and is not limited herein.

In some embodiments of the present disclosure, the fourth grid area WG4 may be 850 to 920 µm². Optionally, the fourth grid area WG4 may be 860 µm² to 910 µm². For example, the fourth grid area WG4 may be 850 µm², or 860 µm², or 900 µm², or 910 µm² or 920 µm². Of course, in practical applications, design may be determined according to the requirements of the practical application environment, and is not limited herein.

Alternatively, in some embodiments of the present disclosure, the fourth grid area WG4 may also be 30.5*28.5 µm² to 35.5*30.5 µm². Optionally, the fourth grid area WG4 may be 30.5*28.5 µm². For example, the fourth grid area WG4 may be 31.5*29.5 µm² or 32.5*29.1 µm². Of course, in practical applications, design may be determined according to the requirements of the practical application environment, and is not limited herein.

In some embodiments of the present disclosure, as shown in FIGS. 5A to 5I and 11, in the same repeating unit, the opening regions KK3 in the third color sub-pixels and the opening regions KK1 in the first color sub-pixels may be arranged in a first direction F1. The opening regions KK2 in the second color sub-pixels and the opening regions KK4 in the fourth color sub-pixels may also be arranged in the first direction F1. A region enclosed by an inner boundary NS3 of the touch electrodes (e.g., the second touch electrodes 820) surrounding the opening regions KK3 in the third color sub-pixels has a first width WK1 in a direction perpendicular to the first direction F1. A region enclosed by an inner boundary NS1 of the touch electrodes (e.g., the second touch electrodes 820) surrounding the opening regions KK1 in the first color sub-pixels has a second width WK2 in the direction perpendicular to the first direction F1. A region enclosed by an inner boundary NS2 of the touch electrodes (e.g., the second touch electrodes 820) surrounding the opening regions KK2 in the second color sub-pixels has a third width WK3 in the direction perpendicular to the first direction F1. A region enclosed by an inner boundary NS4 of the touch electrodes (e.g., the second touch electrodes 820) surrounding the opening regions KK4 in the fourth color sub-pixels has a fourth width WK4 in the direction perpendicular to the first direction F1.

Optionally, the first direction F1 and a row direction F3 may form a certain angle, for example, the angle may be greater than 0 degree and less than 90 degrees. Optionally, the first direction F1 and the row direction F3 may form an angle of 25-75 degrees. Optionally, the first direction F1 and the row direction F3 may form an angle of 30-60 degrees. For example, the first direction F1 and the row direction F3 may form an angle of 25 degrees. Alternatively, the first direction F1 and the row direction F3 may form an angle of 30 degrees. Alternatively, the first direction F1 and the row direction F3 may form an angle of 45 degrees. Alternatively, the first direction F1 and the row direction F3 may form an angle of 60 degrees. Alternatively, the first direction F1 and the row direction F3 may form an angle of 75 degrees. Of course, in practical applications, design may be determined according to the requirements of the practical application environment, and is not limited herein.

In some embodiments of the present disclosure, the first width WK1 may be 34.0 µm to 35.0 µm. Optionally, the first width WK1 may be 34.1 µm to 34.9 µm. For example, the first width WK1 may be 34.0 µm, or 34.1 µm, or 34.4 µm, or 34.8 µm, or 34.9 µm or 35.0 µm. Of course, in practical applications, design may be determined according to the requirements of the practical application environment, and is not limited herein.

In some embodiments of the present disclosure, the second width WK2 may be 30.5 µm to 31.5 µm. Optionally, the second width WK2 may be 30.7 µm to 31.4 µm. For example, the second width WK2 may be 30.5 µm, or 30.7 µm, or 31.2 µm, or 31.4 µm or 31.5 µm. Of course, in practical applications, design may be determined according to the requirements of the practical application environment, and is not limited herein.

In some embodiments of the present disclosure, the third width WK3 may be 30.8 µm to 32.5 µm. Optionally, the third width WK3 may be 31.0 µm to 32.0 µm. For example, the third width WK3 may be 30.8 µm, or 31.0 µm, or 31.6 µm, or 31.8 µm, or 32.0 µm or 32.5 µm. Of course, in practical applications, design may be determined according to the requirements of the practical application environment, and is not limited herein.

In some embodiments of the present disclosure, the fourth width WK4 may be 28.8 µm to 31.5 µm. Optionally, the fourth width WK4 may be 29.2 µm to 30.5 µm. For example, the fourth width WK4 may be 28.8 µm, or 29.2 µm, or 29.9 µm, or 30.5 µm or 31.5 µm. Of course, in practical applications, design may be determined according to the requirements of the practical application environment, and is not limited herein.

Figure 11:
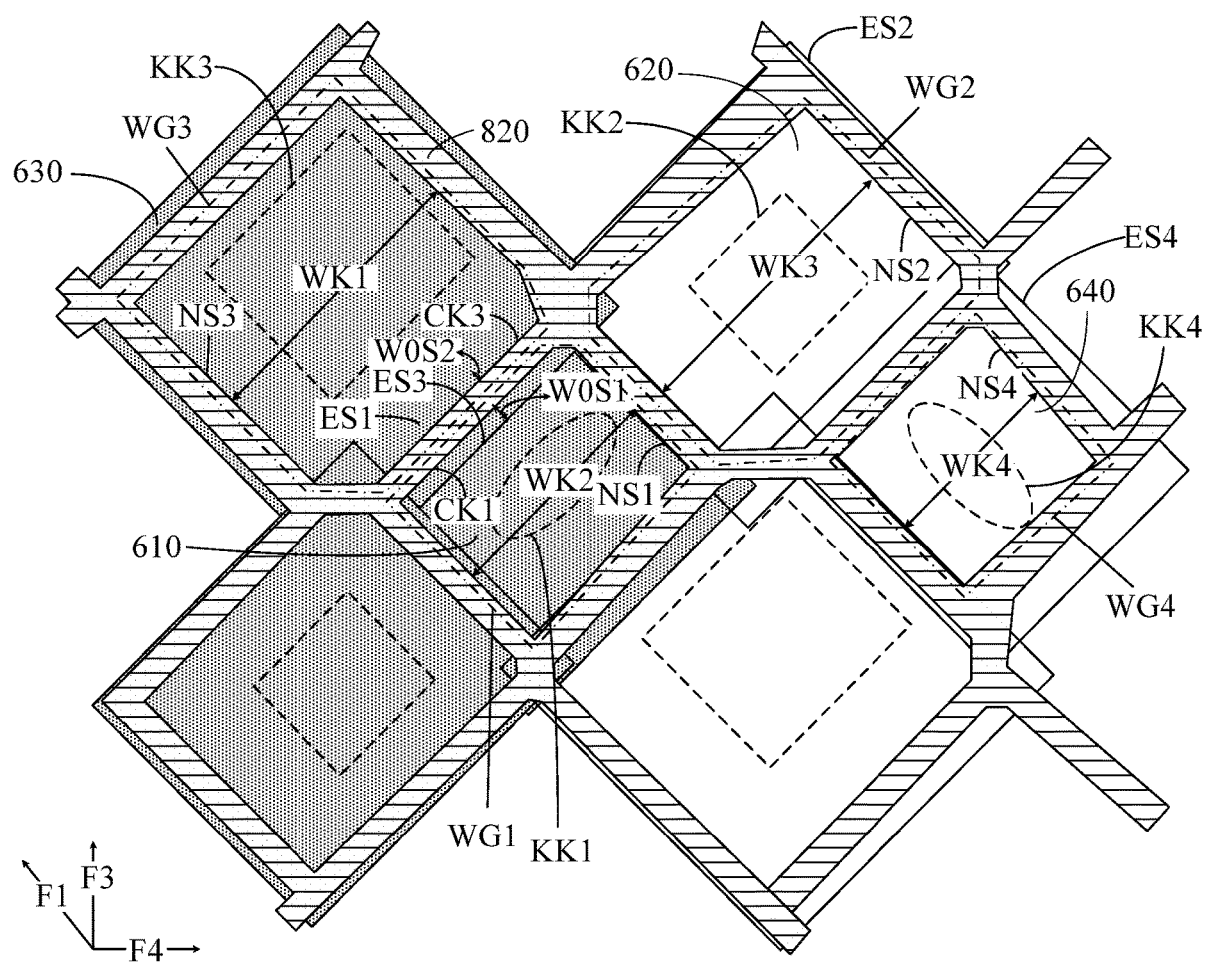
FIG. 11 is a schematic layout structure diagram of further display panels in embodiments of the present disclosure.
Figure 12:
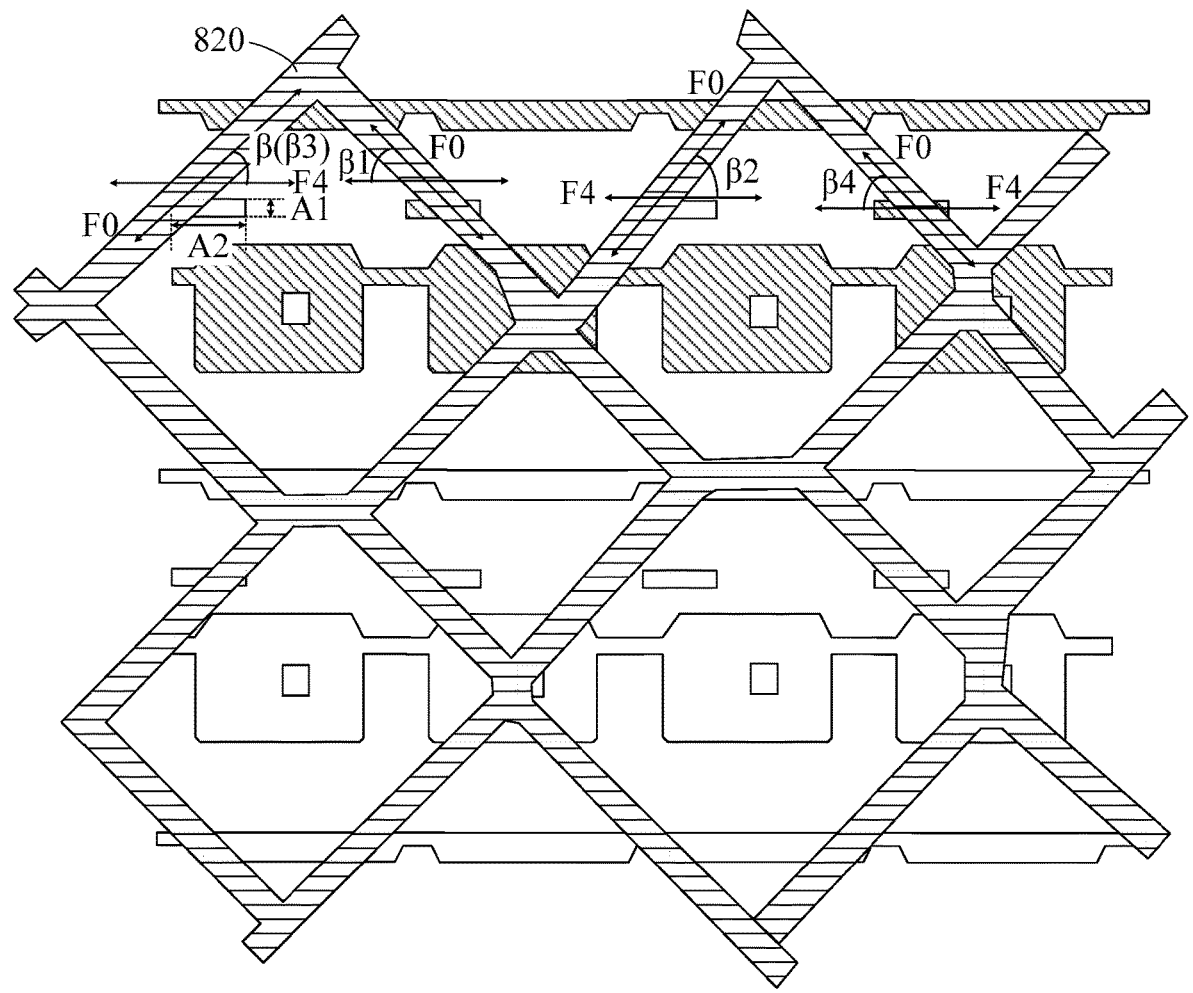
FIG. 12 is a schematic layout structure diagram of further display panels in embodiments of the present disclosure.

In some embodiments, as shown in FIG. 11, the first width WK1 may be made larger than the second width WK2. This may guarantee the opening regions KK3 in the third color sub-pixels and the opening regions KK1 in the first color sub-pixels, thereby improving the light transmittance. In some embodiments, a difference between the first width WK1 and the second width WK2 may be 3.0 µm to 4.0 µm. Optionally, the difference between the first width WK1 and the second width WK2 may be 3.1 µm to 3.9 µm. For example, the difference between the first width WK1 and the second width WK2 may be 3.0 µm, or 3.3 µm, or 3.6 µm, or 3.8 µm, or 3.9 µm or 4.0 µm. Of course, in practical applications, design may be determined according to the requirements of the practical application environment, and is not limited herein.

In some embodiments, as shown in FIG. 11, the third width WK3 may be made larger than the fourth width WK4. This may guarantee the opening regions KK2 in the second color sub-pixels and the opening regions KK4 in the fourth color sub-pixels, thereby improving the light transmittance. In some embodiments, a difference between the third width WK3 and the fourth width WK4 may be 1.0 µm to 2.0 µm. Optionally, the difference between the third width WK3 and the fourth width WK4 may be 1.2 µm to 1.8 µm. For example, the difference between the third width WK3 and the fourth width WK4 may be 1.0 µm, or 1.2 µm, or 1.5 µm, or 1.7 µm, or 1.8 µm or 2.0 µm. Of course, in practical applications, design may be determined according to the requirements of the practical application environment, and is not limited herein.

In some embodiments of the present disclosure, as shown in FIGS. 5A to 5I and 12, an extension direction F0 of grid lines of the touch electrodes (e.g., the second touch electrodes 820) having an overlap area with the orthogonal projection of the auxiliary conductive portions has an included angle $\beta$ with a third direction, and $15° \leq \beta \leq 60°$. Optionally, the included angle $\beta$ is $20° \leq \beta \leq 50°$. The third direction is substantially perpendicular to an extension direction of the data line patterns, and the third direction may be the row direction F4, for example. In some embodiments, $\tan\beta=A1/A2$ where A1 represents a width of the auxiliary conductive portions in a direction perpendicular to the third direction and A2 represents a width of the auxiliary conductive portions in the third direction. For example, $\beta$ may be equal to 15°, or 25°, or 35°, or 45°, or 50°, or 60°. Of course, in practical applications, specific values of $\beta$ may be determined according to the requirements of the practical applications, which is not limited herein.

In some embodiments of the present disclosure, as shown in FIGS. 5A to 5I and 12, an extension direction of grid lines of the touch electrodes (e.g., the second touch electrodes 820) having an overlap area with the orthogonal projection of the auxiliary conductive portions in the first color sub-pixels has a first included angle$\beta1$ with the third direction. An extension direction of grid lines of the touch electrodes (e.g., the second touch electrodes 820) having an overlap area with the orthogonal projection of the auxiliary conductive portions in the second color sub-pixels has a second included angle$\beta2$ with the third direction. An extension direction of grid lines of the touch electrodes (e.g., the second touch electrodes 820) having an overlap area with the orthogonal projection of the auxiliary conductive portions in the third color sub-pixels has a third included angle$\beta3$ with the third direction. The first included angle may be made smaller than the second included angle which is smaller than the third included angle, so that the touch electrodes (e.g., the second touch electrodes 820) may be made to cover the auxiliary conductive portions as much as possible. Of course, depending on the actual situation, it is also possible that at least two angles of $\beta1$, $\beta2$ and $\beta3$ are the same.

In some embodiments of the present disclosure, as shown in FIGS. 5A to 5I, 9A, and 10A, with the opening regions of four adjacent sub-pixels as an opening group, an orthogonal projection of a grid intersection of the touch electrodes (e.g., the second touch electrodes 820) on the base substrate 1000 is located in a region enclosed by an orthogonal projection of the opening group on the base substrate 1000. Further, the orthogonal projection of the grid intersection of the touch electrodes (e.g., the second touch electrodes 820) on the base substrate 1000 is located approximately at a center of the region enclosed by the orthogonal projection of the opening group on the base substrate 1000. This may make grid intersections to be evenly dispersed in the display region, thereby further improving display uniformity.

Figure 13A:
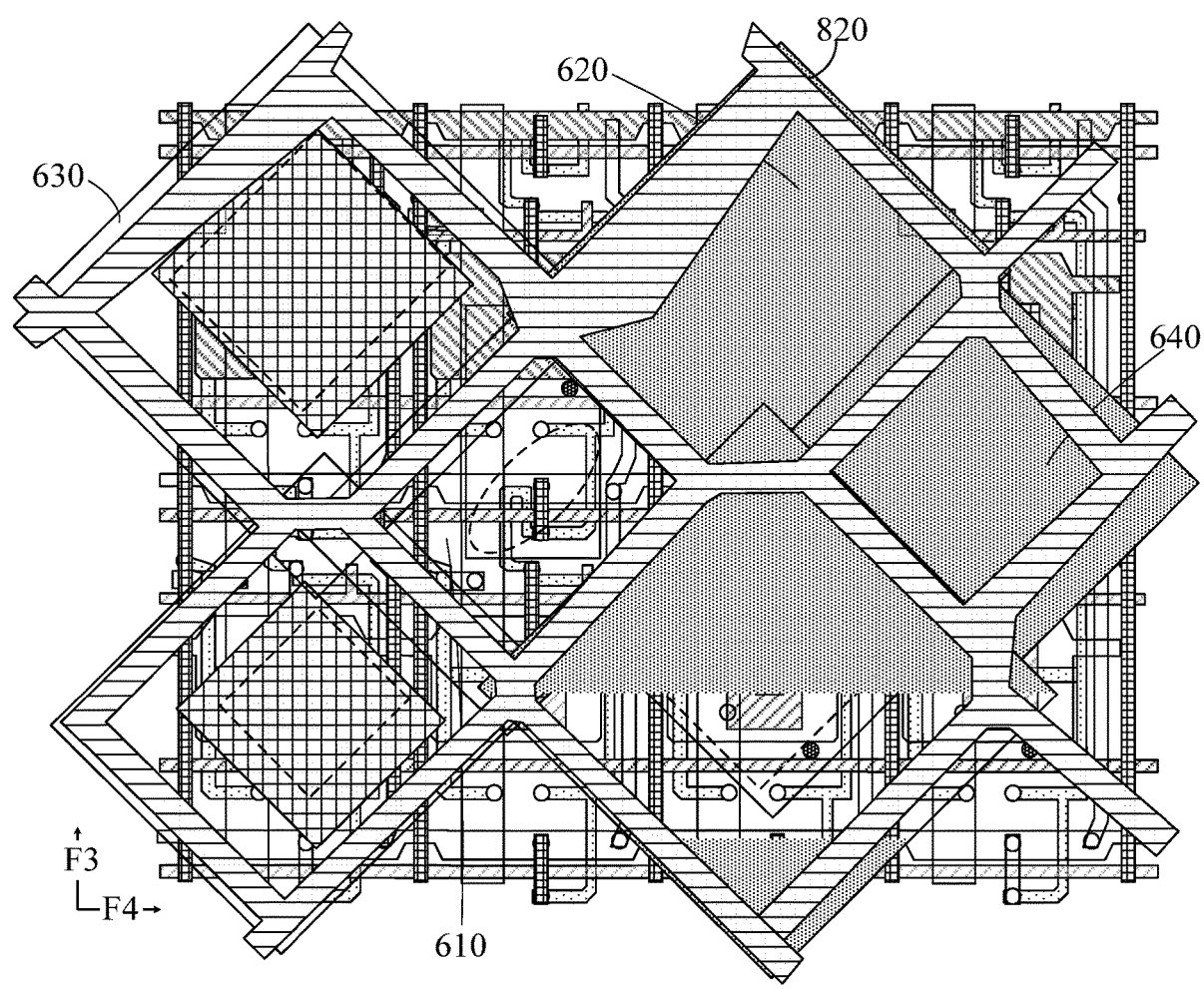
FIG. 13A is a schematic layout structure diagram of further display panels in embodiments of the present disclosure.
Figure 13B:
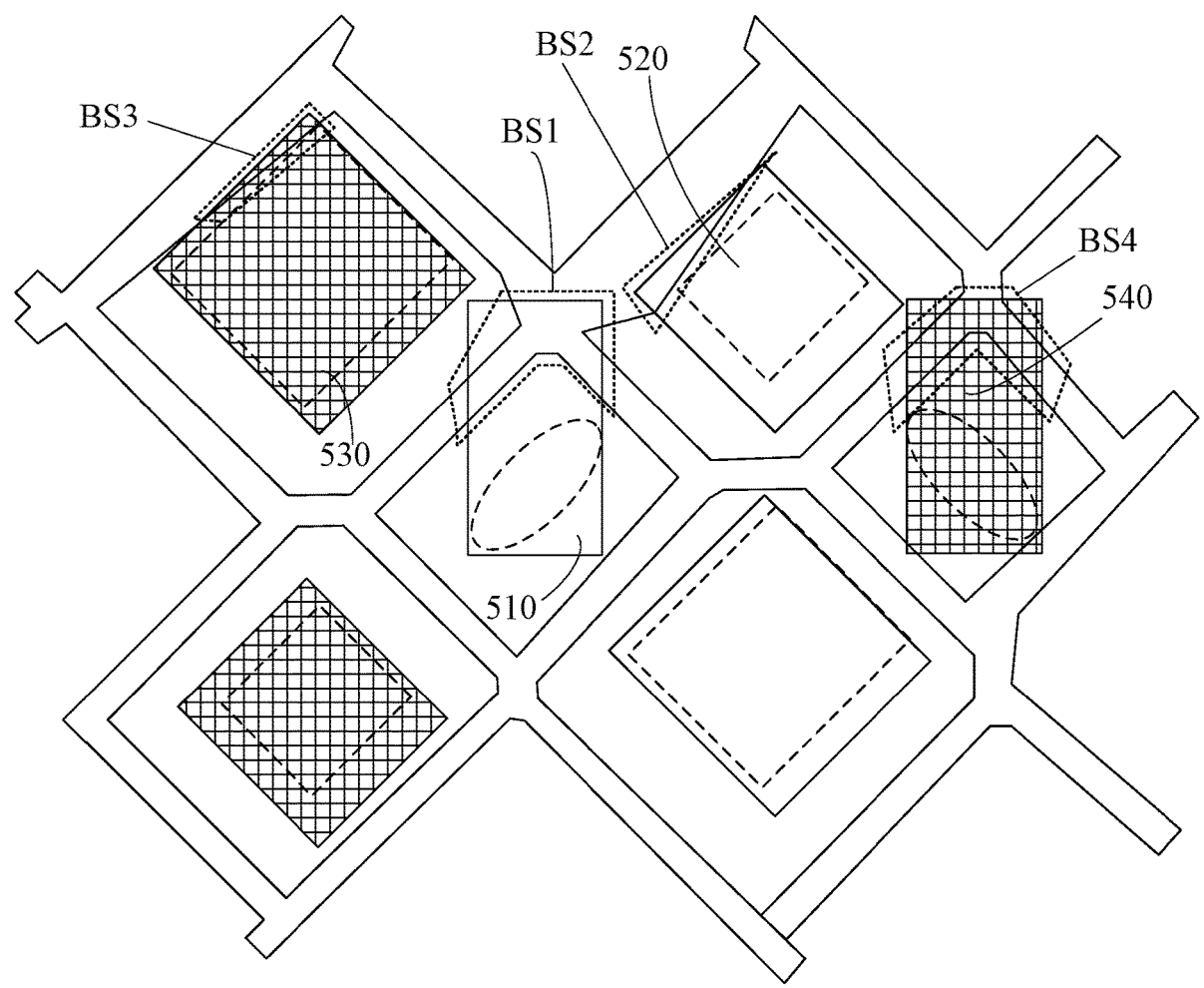
FIG. 13B is a schematic layout structure diagram of further display panels in embodiments of the present disclosure.

In some embodiments of the present disclosure, as shown in FIGS. 13A and 13B, an overlapping region between an orthogonal projection of the first electrodes 510 (e.g.: anodes) in the first color sub-pixels on the base substrate 1000 and the orthogonal projection of the touch electrodes (e.g., the second touch electrodes 820) on the base substrate 1000 has a first anode overlap area BS1. An overlapping region between an orthogonal projection of the first electrodes 520 in the second color sub-pixels on the base substrate 1000 and the orthogonal projection of the touch electrodes (e.g., the second touch electrodes 820) on the base substrate 1000 has a second anode overlap area BS2. An overlapping region between an orthogonal projection of the first electrodes 530 in the third color sub-pixels on the base substrate 1000 and the orthogonal projection of the touch electrodes (e.g., the second touch electrodes 820) on the base substrate 1000 has a third anode overlapping area BS3. An overlapping region between an orthogonal projection of the first electrodes 540 in the fourth color sub-pixels on the base substrate 1000 and the orthogonal projection of the touch electrodes (e.g., the second touch electrodes 820) on the base substrate 1000 has a fourth anode overlap area BS4. At least one of the first anode overlap area BS1, the second anode overlap area BS2, and the fourth anode overlap area BS4 is larger than the third anode overlap area BS3.

In some embodiments, the first anode overlap area BS1 may be made larger than the third anode overlap area BS3. It is also possible to make the second anode overlap area BS2 larger than the third anode overlap area BS3. It is also possible to make the fourth anode overlap area BS4 larger than the third anode overlap area BS3.

In some embodiments of the present disclosure, as shown in FIGS. 13A and 13B, the first anode overlap area BS1 may be made larger than the second anode overlap area BS2. Alternatively, the first anode overlap area BS1 may also be made to be substantially equal to the second anode overlap area BS2.

In some embodiments of the present disclosure, as shown in FIGS. 13A and 13B, the first anode overlap area BS1 is larger than the fourth anode overlap area BS4. Alternatively, the first anode overlap area BS1 may also be made to be substantially equal to the fourth anode overlap area BS4.

In some embodiments of the present disclosure, as shown in FIGS. 13A and 13B, the fourth anode overlap area BS4 is larger than the second anode overlap area BS2. Alternatively, the fourth anode overlap area BS4 may also be made to be substantially equal to the second anode overlap area BS2.

Optionally, the first anode overlap area BS1 is 2.5 $\mu m^2$ to 35 $\mu m^2$. Optionally, the first anode overlap area BS1 is 3 $\mu m^2$ to 25 $\mu m^2$ or 6 $\mu m^2$ to 20 $\mu m^2$.

Optionally, the second anode overlap area BS2 is 0 $\mu m^2$ to 30 $\mu m^2$. Optionally, the second anode overlap area BS2 is 1.5 $\mu m^2$ to 25 $\mu m^2$ or 6 $\mu m^2$ to 20 $\mu m^2$.

Optionally, the third anode overlap area BS3 is 0 $\mu m^2$ to 25 $\mu m^2$. Optionally, the third anode overlap area BS3 is 1.5 $\mu m^2$ to 25 $\mu m^2$ or 5 $\mu m^2$ to 20 $\mu m^2$.

Optionally, the fourth anode overlap area BS4 is 0 $\mu m^2$ to 30 $\mu m^2$. Optionally, the fourth anode overlap area BS4 is 1.5 $\mu m^2$ to 25 $\mu m^2$ or the fourth anode overlap area BS4 is 6 $\mu m^2$ to 20 $\mu m^2$.

Figure 14A:
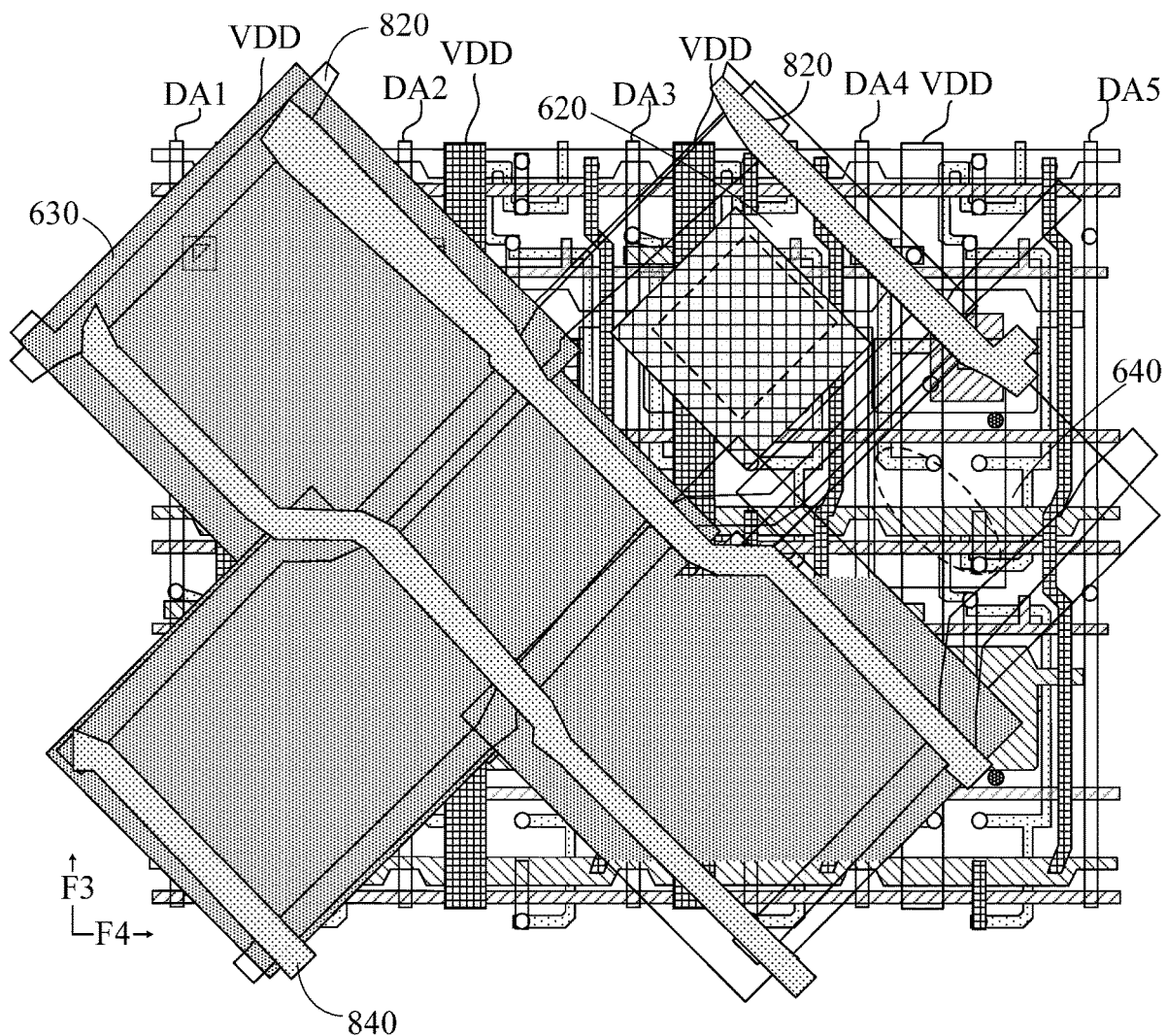
FIG. 14A is a schematic layout structure diagram of further display panels in embodiments of the present disclosure.
Figure 14B:
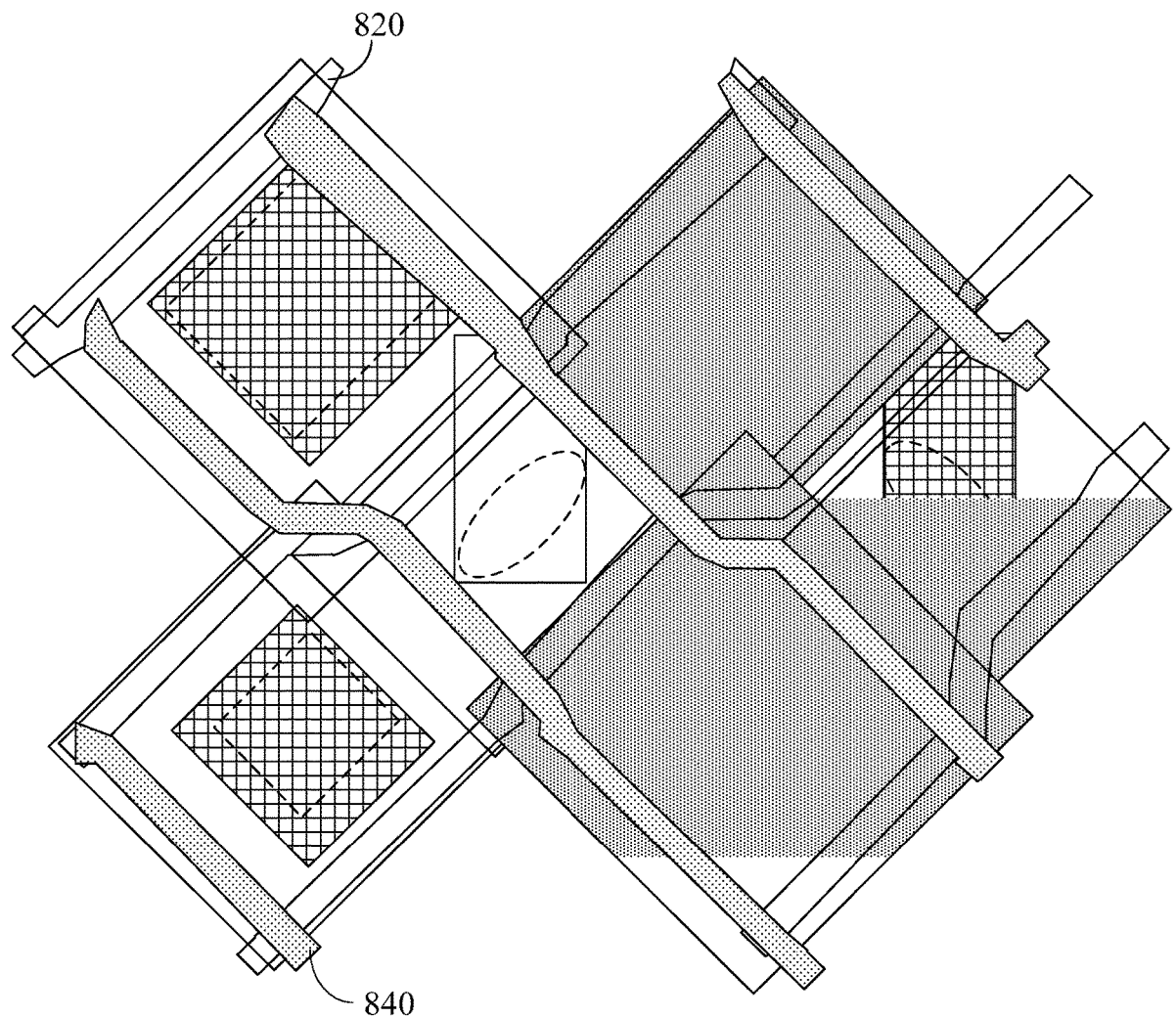
FIG. 14B is a schematic layout structure diagram of further display panels in embodiments of the present disclosure.

In some embodiments of the present disclosure, as shown in FIGS. 14A and 14B, in conjunction with FIGS. 8A to 8D, an auxiliary insulating layer may also be disposed on a side of the second touch electrodes 820 facing away from the base substrate 1000. Auxiliary electrodes 840 may also be disposed on a side of the auxiliary insulating layer facing away from the base substrate 1000. In some embodiments, the auxiliary electrodes 840 are in a floating state, without transmitting signals. Of course, the auxiliary electrodes 840 may be fabricated in the same layer and/or formed from the same material as the first touch electrodes 810.

It will be appreciated that, as shown in FIGS. 14A and 14B and in conjunction with FIGS. 8A to 8D, an insulating layer 830 is disposed on a side of the first touch electrodes 810 facing away from the base substrate 1000. Auxiliary electrodes 840 may further be disposed on a side of 830 facing away from the base substrate 1000, the auxiliary electrodes 840 are in a floating state, without transmitting signals, and the auxiliary electrodes 840 may be fabricated in the same layer and/or formed from the same material as the second touch electrodes 820 (or 811).

Figure 15:
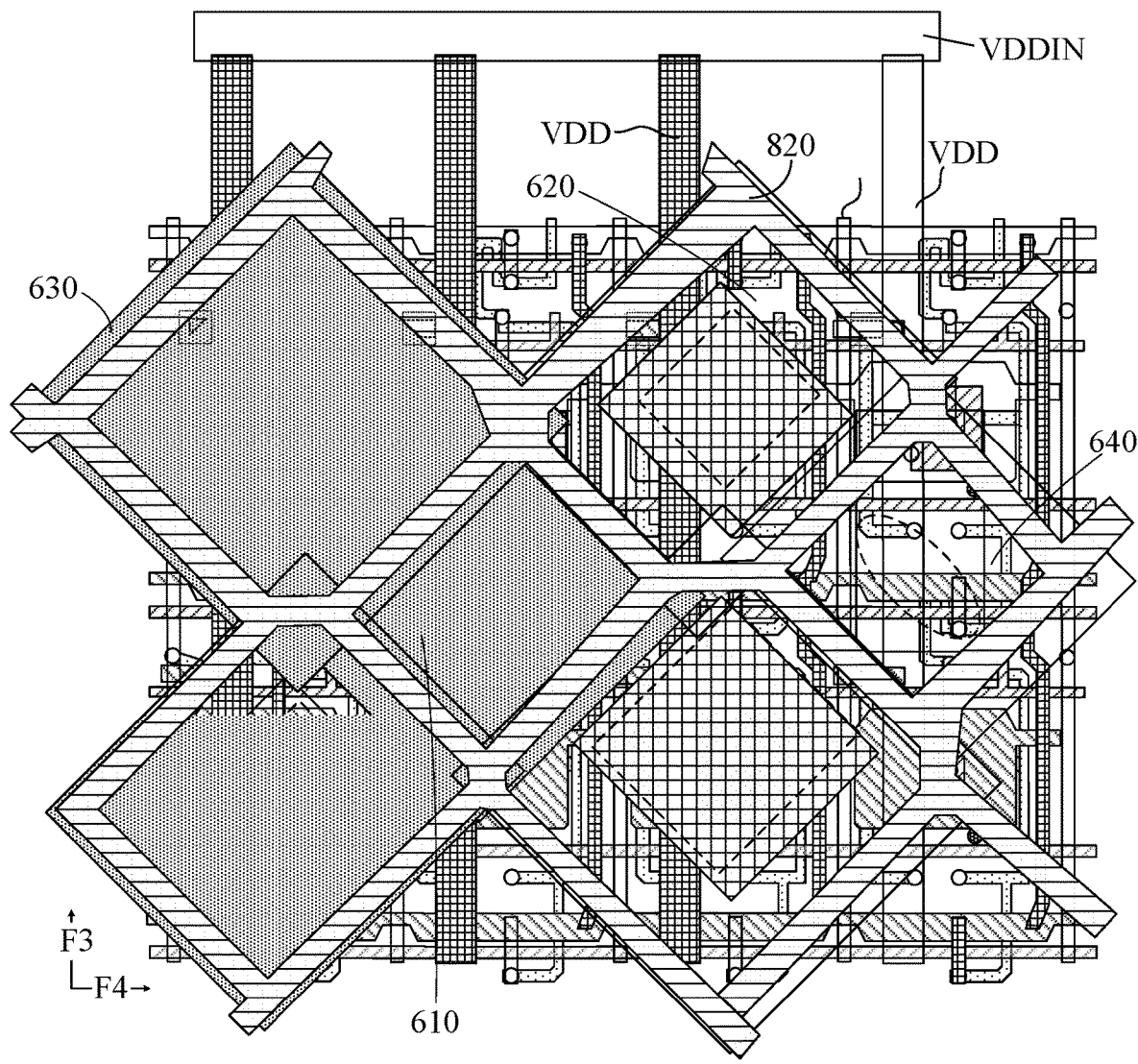
FIG. 15 is a schematic layout structure diagram of further display panels in embodiments of the present disclosure.

In some embodiments of the present disclosure, as shown in FIG. 15, the display panel further includes a power input line VDDIN located in the non-display region. The power supply signal line patterns VDD in the display region are electrically connected with the power input line VDDIN. In some embodiments, the power supply signal line patterns VDD of two adjacent columns of sub-pixels are electrically connected by the power input line VDDIN. Alternatively, the power supply signal line patterns VDD corresponding to two adjacent columns of sub-pixels of the same color are electrically connected by the power input line VDDIN. In some embodiments, the power input line VDDIN may be arranged in the same layer as the power supply signal line patterns VDD. Alternatively, the power input line VDDIN may also be arranged in different layers with the power supply signal line patterns VDD, which also requires that the power supply signal line patterns VDD and the power input line VDDIN are electrically connected through vias. Furthermore, the data line patterns DA and the power input line VDDIN may not be disposed in the same conductive layer.

It will be appreciated that adaptable combinations of the above disclosed embodiments are possible as desired, and that the numerical ranges may be adjusted accordingly.

An embodiment of the present disclosure further provides a display device including the above display panel provided by the embodiment of the present disclosure. For example: an Organic Light Emitting Diode (OLED). The principle of solving the problem of the display device is similar to that of the aforementioned display panel, and thus the display device may be implemented by referring to implementation of the aforementioned display panel, and repetitions are omitted herein.

In some embodiments of the present disclosure, the display device may be: a mobile phone, a tablet, a television, a display, a laptop, a digital photo frame, a navigator, a watch, a bracelet, and any product or component having a display function. Other essential components for the display device are components that one of ordinary skill in the art would understand and are not repeated here and should not be taken as a limitation on the present disclosure.

While the preferred embodiments of the present disclosure have been described, further variations and modifications of these embodiments may be effected therein by those skilled in the art once the basic inventive concepts have come to mind. It is therefore intended that the appended claims be construed to include the preferred embodiments along with all variations and modifications that fall within the scope of the disclosure.

It will be apparent to those skilled in the art that various modifications and variations can be made to the embodiments of the disclosure without departing from the spirit and scope of the embodiments of the disclosure. Thus, it is intended that the present disclosure includes such modifications and variations of the embodiments of the present disclosure provided they come within the scope of the claims of the disclosure and their equivalents.

What is claimed is:

1. A display panel, comprising:
a base substrate;
a transistor array layer, located on the base substrate;
a pixel defining layer, located on a side of the transistor array layer facing away from the base substrate; and
touch electrodes, located on a side of the pixel defining layer facing away from the base substrate; wherein
the base substrate has a display region comprising a plurality of sub-pixels; the sub-pixels comprise pixel circuits and light emitting elements; the pixel circuits comprise gate line patterns, data line patterns, and power supply signal line patterns;
the transistor array layer comprises a plurality of capacitance-conductive portions, and the sub-pixels comprise corresponding capacitance-conductive portions; wherein, in each of the sub-pixels, there is an overlapping region between a capacitance-conductive portion and a data line pattern corresponding to the each of the sub-pixels and/or a power supply signal line pattern corresponding to the each of the sub-pixels; the capacitance-conductive portion is at least coupled to the power supply signal line pattern corresponding to the each of the sub-pixels or the data line pattern corresponding to the each of the sub-pixels;
the pixel defining layer comprises a plurality of opening regions, and the sub-pixels comprise corresponding opening regions;
an orthogonal projection of at least part of the touch electrodes on the base substrate is a grid;
the plurality of sub-pixels further comprise a first color sub-pixel, a second color sub-pixel, and a third color sub-pixel; an area of an opening region of the first color sub-pixel is smaller than an area of an opening region of the third color sub-pixel, and an area of an opening region of the second color sub-pixel is smaller than the area of the opening region of the third color sub-pixel;
an orthogonal projection of a capacitance-conductive portion in the first color sub-pixel on the base substrate overlaps with an orthogonal projection of the touch electrodes on the base substrate at a first auxiliary overlap area;
an orthogonal projection of a capacitance-conductive portion in the second color sub-pixel on the base substrate overlaps with the orthogonal projection of the touch electrodes on the base substrate at a second auxiliary overlap area;
an orthogonal projection of a capacitance-conductive portion in the third color sub-pixel on the base substrate overlaps with the orthogonal projection of the touch electrodes on the base substrate at a third auxiliary overlap area; and
at least one of the first auxiliary overlap area and the second auxiliary overlap area is larger than the third auxiliary overlap area.

2. The display panel according to claim 1, wherein the first auxiliary overlap area is larger than the second auxiliary overlap area; or,
the first auxiliary overlap area is substantially equal to the second auxiliary overlap area; or,
the third auxiliary overlap area is substantially equal to the second auxiliary overlap area.

3. The display panel according to claim 1, wherein the transistor array layer comprises:
a first conductive layer, located between the base substrate and the pixel defining layer; wherein the first conductive layer comprises a plurality of data line patterns and a plurality of power supply signal line patterns;
a first insulating layer, located between the base substrate and the first conductive layer; and
a second conductive layer, located between the base substrate and the first insulating layer, the second conductive layer comprises: a plurality of auxiliary conductive portions, the capacitance-conductive portions of the sub-pixels comprising the auxiliary conductive portions; wherein in each of the sub-pixels, an orthogonal projection of a first end of an auxiliary conductive portion on the base substrate has an overlapping region with an orthogonal projection of a power supply signal line pattern on the base substrate, and an orthogonal projection of a second end of the auxiliary conductive portion on the base substrate has an overlapping region with an orthogonal projection of a data line pattern on the base substrate; the auxiliary conductive portion is coupled to the power supply signal line pattern;

the first auxiliary overlap area comprises an overlap area between an orthogonal projection of the auxiliary conductive portion in the first color sub-pixel on the base substrate and the orthogonal projection of the touch electrodes on the base substrate;

the second auxiliary overlap area comprises an overlap area between an orthogonal projection of the auxiliary conductive portion in the second color sub-pixel on the base substrate and the orthogonal projection of the touch electrodes on the base substrate; and the third auxiliary overlap area comprises an overlap area between an orthogonal projection of the auxiliary conductive portion in the third color sub-pixel on the base substrate and the orthogonal projection of the touch electrodes on the base substrate;

wherein the auxiliary conductive portion in the first color sub-pixel comprises a first auxiliary exposure portion, and an orthogonal projection of the first auxiliary exposure portion on the base substrate does not overlap with the orthogonal projections of the data line patterns and the power supply signal line patterns, respectively, on the base substrate; the first auxiliary overlap area comprises a first auxiliary sub-overlap area, and an overlapping region between the orthogonal projection of the first auxiliary exposure portion on the base substrate and the orthogonal projection of the touch electrodes on the base substrate comprises the first auxiliary sub-overlap area;

the auxiliary conductive portion in the second color sub-pixel comprises a second auxiliary exposure portion, and an orthogonal projection of the second auxiliary exposure portion on the base substrate does not overlap with the orthogonal projections of the data line patterns and the power supply signal line patterns, respectively, on the base substrate; the second auxiliary overlap area comprises a second auxiliary sub-overlap area, and an overlapping region between the orthogonal projection of the second auxiliary exposure portion on the base substrate and the orthogonal projection of the touch electrodes on the base substrate comprises the second auxiliary sub-overlap area;

the auxiliary conductive portion in the third color sub-pixel comprises a third auxiliary exposure portion, and an orthogonal projection of the third auxiliary exposure portion on the base substrate does not overlap with the orthogonal projections of the data line patterns and the power supply signal line patterns, respectively, on the base substrate; the third auxiliary overlap area comprises a third auxiliary sub-overlap area, and an overlapping region between the orthogonal projection of the third auxiliary exposure portion on the base substrate and the orthogonal projection of the touch electrodes on the base substrate comprises the third auxiliary sub-overlap area, and the first auxiliary sub-overlap area is larger than at least one of the second auxiliary sub-overlap area and the third auxiliary sub-overlap area.

4. The display panel according to claim 3, wherein the second auxiliary sub-overlap area is larger than the third auxiliary sub-overlap area; or, the third auxiliary sub-overlap area is substantially equal to the second auxiliary sub-overlap area.

5. The display panel according to claim 3, wherein in the first color sub-pixel, an orthogonal projection of the first auxiliary exposure portion on the base substrate is located between the orthogonal projections of the data line patterns and the power supply signal line patterns on the base substrate; and/or, in the second color sub-pixel, an orthogonal projection of the second auxiliary exposure portion on the base substrate is located between the orthogonal projections of the data line patterns and the power supply signal line patterns on the base substrate; and/or, in the third color sub-pixel, an orthogonal projection of the third auxiliary exposure portion on the base substrate is located between the orthogonal projections of the data line patterns and the power supply signal line patterns on the base substrate;

wherein the orthogonal projection of the auxiliary conductive portion on the base substrate has a total area;

a ratio of the first auxiliary sub-overlap area to the total area ranges from: 1/3 to 2/3; and/or, a ratio of the second auxiliary sub-overlap area to the total area ranges from: 0 to 1/4; and/or, a ratio of the third auxiliary sub-overlap area to the total area ranges from: 0 to 1/16;

wherein in the first color sub-pixel, the orthogonal projection of the touch electrodes on the base substrate covers the orthogonal projection of the first auxiliary exposure portion on the base substrate; and/or, in the second color sub-pixel, the orthogonal projection of the touch electrodes on the base substrate covers the orthogonal projection of the second auxiliary exposure portion on the base substrate; and/or, in the third color sub-pixel, the orthogonal projection of the touch electrodes on the base substrate covers the orthogonal projection of the third auxiliary exposure portion on the base substrate.

6. The display panel according to claim 3, wherein the auxiliary conductive portion in the first color sub-pixel further comprises a first auxiliary shielding portion, and an orthogonal projection of the first auxiliary shielding portion on the base substrate overlaps with the orthogonal projection of at least one of the data line patterns and the power supply signal line patterns on the base substrate; wherein a width of the first auxiliary exposure portion in a column direction is smaller than a width of the first auxiliary shielding portion in the column direction; and/or, the auxiliary conductive portion in the second color sub-pixel further comprises a second auxiliary shielding portion, and an orthogonal projection of the second auxiliary shielding portion on the base substrate overlaps with the orthogonal projection of at least one of the data line patterns and the power supply signal line patterns on the base substrate; wherein a width of the second auxiliary exposure portion in the column direction is smaller than a width of the second auxiliary shielding portion in the column direction; and/or, the auxiliary conductive portion in the third color sub-pixel further comprises a third auxiliary shielding portion, and an orthogonal projection of the third auxiliary shielding portion on the base substrate overlaps with the orthogonal projection of at least one of the data line patterns and the power supply signal line patterns on the base substrate; wherein a width of the third auxiliary exposure portion in the column direction is smaller than a width of the third auxiliary shielding portion in the column direction.

7. The display panel according to claim 3, wherein the pixel circuits further comprise first capacitors;

an orthogonal projection of a first capacitor in the first color sub-pixel on the base substrate overlaps with the orthogonal projection of the touch electrodes on the base substrate at a first storage overlap area;

an orthogonal projection of a first capacitor in the second color sub-pixel on the base substrate overlaps with the orthogonal projection of the touch electrodes on the base substrate at a second storage overlap area;

an orthogonal projection of a first capacitor in the third color sub-pixel on the base substrate overlaps with the orthogonal projection of the touch electrodes on the base substrate at a third storage overlap area; and at least one of the first storage overlap area and the second storage overlap area is larger than the third storage overlap area.

8. The display panel according to claim 7, wherein the second conductive layer further comprises a plurality of storage conductive portions disposed spaced apart from the auxiliary conductive portions; the sub-pixels comprise the storage conductive portions; the storage conductive portions act as second plates of the first capacitors;

the first storage overlap area comprises an overlap area between an orthogonal projection of a storage conductive portion in the first color sub-pixel on the base substrate and the orthogonal projection of the touch electrodes on the base substrate;

the second storage overlap area comprises an overlap area between an orthogonal projection of a storage conductive portion in the second color sub-pixel on the base substrate and the orthogonal projection of the touch electrodes on the base substrate; and the third storage overlap area comprises an overlap area between an orthogonal projection of a storage conductive portion in the third color sub-pixel on the base substrate and the orthogonal projection of the touch electrodes on the base substrate.

9. The display panel according to claim 1, wherein the orthogonal projection of the touch electrodes on the base substrate is in a grid shape, and the orthogonal projection of the touch electrodes on the base substrate does not overlap with an orthogonal projection of the opening regions on the base substrate;

wherein the touch electrodes comprise a first electrode portion and a second electrode portion; an orthogonal projection of the first electrode portion on the base substrate overlaps with an orthogonal projection of an auxiliary conductive portion on the base substrate at an overlapping region, and an orthogonal projection of the second electrode portion on the base substrate and the orthogonal projection of the auxiliary conductive portion on the base substrate do not overlap; and a width of the first electrode portion is larger than a width of the second electrode portion.

10. The display panel according to claim 9, wherein an area enclosed by the orthogonal projection of the touch electrodes around the opening region of the first color sub-pixel on the substrate is a first grid area;

an area enclosed by the orthogonal projection of the touch electrodes around the opening region of the second color sub-pixel on the base substrate is a second grid area;

an area enclosed by the orthogonal projection of the touch electrodes around the opening region of the third color sub-pixel on the base substrate is a third grid area; and the third grid area is larger than the second grid area which is larger than the first grid area;

wherein the display panel further comprises a plurality of repeating units; and the repeating units comprise the first color sub-pixel, the second color sub-pixel, and the third color sub-pixel;

wherein the repeating units further comprise a fourth color sub-pixel; an area enclosed by an orthogonal projection of touch electrodes around the opening region of the fourth color sub-pixel on the base substrate is a fourth grid area; and the first grid area corresponding to the first color sub-pixel is greater than or substantially equal to the fourth grid are corresponding to the fourth color sub-pixel.

11. The display panel according to claim 9, wherein an extension direction of a grid line of the touch electrode having an overlap area with the orthogonal projection of the auxiliary conductive portions has an included angle$\beta$with a third direction, and $15°\leq\beta\leq60°$; wherein the third direction is substantially perpendicular to an extension direction of the data line patterns.

12. The display panel according to claim 11, wherein $\tan\beta=A1/A2$; wherein A1 represents a width of the auxiliary conductive portions in a direction perpendicular to the third direction and A2 represents a width of the auxiliary conductive portions in the third direction.

13. The display panel according to claim 11, wherein an extension direction of a grid line of the touch electrode having an overlap area with the orthogonal projection of the auxiliary conductive portion in the first color sub-pixel has a first included angle with the third direction;

an extension direction of a grid line of the touch electrode having an overlap area with the orthogonal projection of the auxiliary conductive portion in the second color sub-pixel has a second included angle with the third direction;

an extension direction of a grid line of the touch electrode having an overlap area with the orthogonal projection of the auxiliary conductive portion in the third color sub-pixel has a third included angle with the third direction; and the first included angle is smaller than the second included angle which is smaller than the third included angle.

14. The display panel according to claim 11, wherein with the opening regions of four adjacent sub-pixels as an opening group, an orthogonal projection of a grid intersection of the touch electrodes on the base substrate is located in a region enclosed by an orthogonal projection of the opening group on the base substrate.

15. The display panel according to claim 1, wherein an orthogonal projection of touch electrodes located between adjacent opening regions on the base substrate overlaps with orthogonal projections of at least two different color light emitting layers on the base substrate.

16. The display panel according to claim 1, wherein each of the sub-pixels further comprises a first electrode;

an overlapping region between an orthogonal projection of the first electrode in the first color sub-pixel on the base substrate and the orthogonal projection of the touch electrodes on the base substrate has a first anode overlap area;

an overlapping region between an orthogonal projection of the first electrode in the second color sub-pixel on the base substrate and the orthogonal projection of the touch electrodes on the base substrate has a second anode overlap area;

an overlapping region between an orthogonal projection of the first electrode in the third color sub-pixel on the base substrate and the orthogonal projection of the touch electrodes on the base substrate has a third anode overlap area; and at least one of the first anode overlap area and the second anode overlap area is larger than the third anode overlap area;

wherein the first anode overlap area is larger than the second anode overlap area, or, the first anode overlap area is substantially equal to the second anode overlap area.

* * * * *